US010566355B2

(12) United States Patent
Takahashi

(10) Patent No.: US 10,566,355 B2
(45) Date of Patent: Feb. 18, 2020

(54) SEMICONDUCTOR DEVICE AND DISPLAY DEVICE INCLUDING THE SAME

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/293,959

(22) Filed: Mar. 6, 2019

(65) Prior Publication Data

US 2019/0206899 A1    Jul. 4, 2019

Related U.S. Application Data

(63) Continuation of application No. 15/375,466, filed on Dec. 12, 2016, now Pat. No. 10,229,939.

(30) Foreign Application Priority Data

Dec. 18, 2015  (JP) ................................ 2015-247133

(51) Int. Cl.
*H01L 27/12* (2006.01)
*G09G 3/20* (2006.01)

(52) U.S. Cl.
CPC ......... *H01L 27/124* (2013.01); *G09G 3/2092* (2013.01); *H01L 27/1225* (2013.01); (Continued)

(58) Field of Classification Search
CPC combination set(s) only.
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

JP    05-251705 A    9/1993
JP    09-064662 A    3/1997
(Continued)

OTHER PUBLICATIONS

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
(Continued)

*Primary Examiner* — Deeprose Subedi
(74) *Attorney, Agent, or Firm* — Fish & Richardson P.C.

(57) ABSTRACT

A semiconductor device with reduced power consumption and a display device including the semiconductor are provided. The semiconductor device generates a bias voltage that is to be supplied to a buffer amplifier. When the display device displays a still image, a data signal for updating the image need not be supplied from the buffer amplifier to a pixel array in the next frame; therefore, the circuit is configured so that the buffer amplifier is brought into a standby state (temporarily stopped). Specifically, input of a reference current from a BGR circuit to the semiconductor is stopped and a bias voltage is applied from the semiconductor device to the buffer amplifier to temporarily stop the operation of the buffer amplifier.

13 Claims, 36 Drawing Sheets

(52) U.S. Cl.
CPC . *H01L 27/1251* (2013.01); *G09G 2300/0426* (2013.01); *G09G 2300/0809* (2013.01); *G09G 2300/0814* (2013.01); *G09G 2300/0819* (2013.01); *G09G 2300/0838* (2013.01); *G09G 2300/0842* (2013.01); *G09G 2300/0852* (2013.01); *G09G 2310/0286* (2013.01); *G09G 2310/0291* (2013.01); *G09G 2330/021* (2013.01); *G09G 2330/028* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,524,752 B2 | 4/2009 | Tsutsue |
| 7,674,650 B2 | 3/2010 | Akimoto et al. |
| 7,732,819 B2 | 6/2010 | Akimoto et al. |
| 7,989,334 B2 | 8/2011 | Tsutsue |
| 8,421,068 B2 | 4/2013 | Yamazaki et al. |
| 8,421,069 B2 | 4/2013 | Yamazaki et al. |
| 8,823,893 B2 | 9/2014 | Yamazaki |
| 9,244,323 B2 | 1/2016 | Yamazaki |
| 9,374,048 B2 | 6/2016 | Koyama et al. |
| 9,378,844 B2 | 6/2016 | Takahashi |
| 9,444,337 B2 | 9/2016 | Takahashi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0025191 A1 | 2/2012 | Yamazaki |
| 2013/0265094 A1* | 10/2013 | Sinha ............... H03K 3/356113 327/333 |
| 2013/0271220 A1* | 10/2013 | Takahashi ............ H03F 1/0261 330/293 |
| 2013/0292669 A1 | 11/2013 | Tanabe et al. |
| 2015/0028837 A1 | 1/2015 | Takahashi |
| 2015/0270402 A1 | 9/2015 | Endo et al. |
| 2015/0280013 A1 | 10/2015 | Yamazaki et al. |
| 2015/0372009 A1 | 12/2015 | Yamazaki |
| 2016/0070386 A1 | 3/2016 | Yamamoto et al. |
| 2016/0071890 A1 | 3/2016 | Yamazaki |
| 2016/0218219 A1 | 7/2016 | Asami et al. |
| 2016/0285422 A1 | 9/2016 | Koyama et al. |
| 2016/0294329 A1 | 10/2016 | Takahashi |

FOREIGN PATENT DOCUMENTS

| | | |
|---|---|---|
| JP | 2001-251146 A | 9/2001 |
| JP | 2006-338434 A | 12/2006 |
| JP | 2011-237760 A | 11/2011 |
| JP | 2015-043686 A | 3/2015 |
| KR | 2015-0013030 A | 2/2015 |
| TW | 201526504 | 7/2015 |

OTHER PUBLICATIONS

International Search Report (Application No. PCT/IB2016/057369) dated Feb. 14, 2017.

Written Opinion (Application No. PCT/IB2016/057369) dated Feb. 14, 2017.

* cited by examiner

SEMICONDUCTOR DEVICE AND DISPLAY DEVICE INCLUDING THE SAME

CROSS-REFERENCE TO RELATED APPLICATIONS

This application is a continuation of U.S. application Ser. No. 15/375,466, filed Dec. 12, 2016, now allowed, which claims the benefit of a foreign priority application filed in Japan as Serial No. 2015-247133 on Dec. 18, 2015, both of which are incorporated by reference.

TECHNICAL FIELD

One embodiment of the present invention relates to a semiconductor device and a display device including the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

In recent years, the definition of a display device has been increased. As the definition of a display device becomes higher, the numbers of circuits and wirings for sending image signals or supplying power to the display device tend to increase. Since the numbers of circuits and wirings are increased, the power consumption of the display device is also likely to increase.

A technology for reducing the number of operations of writing signals (hereinafter also referred to as refresh operations in some cases) during successive display of the same image (still image) is known as a method for reducing the power consumption of a display device (Patent Document 1). The frequency of refresh operations is referred to as a refresh rate.

REFERENCE

Patent Document

[Patent Document 1] Japanese Published Patent Application No. 2011-237760

DISCLOSURE OF INVENTION

A display device can display an image by driving a driver circuit (which may be referred to as a driver integrated circuit (driver IC)) provided in the display device. The driver circuit includes a serial-parallel conversion circuit, a shift register circuit, a level shifter circuit, a pass transistor logic circuit, a buffer amplifier circuit, and the like. An image signal supplied to the driver circuit is processed by these circuits and supplied to a pixel array.

In particular, a buffer amplifier circuit has a function of amplifying a signal which has been processed by the circuits to a predetermined magnitude and supplying the amplified signal to pixels. During driving of the display device, the buffer amplifier circuit is supplied with a plurality of bias voltages. Even while the display device displays the same image (still image) successively, supply of the plurality of bias voltages continues. In other words, continuous supply of the bias voltages increases the power consumption of the display device.

An object of one embodiment of the present invention is to provide a novel semiconductor device. Another object of one embodiment of the present invention is to provide a display device or a display module including the novel semiconductor device. Another object of one embodiment of the present invention is to provide an electronic device using the display device or the display module including the novel semiconductor device. Another object of one embodiment of the present invention is to provide a system including the display device or the display module including the novel semiconductor device.

Another object of one embodiment of the present invention is to provide a semiconductor device with reduced power consumption, a display device including the semiconductor device, or a display module including the semiconductor device. Another object of one embodiment of the present invention is to provide a display device with favorable visibility or a display module with favorable visibility. Another object of one embodiment of the present invention is to provide a display device with favorably display quality or a display module with favorable display quality.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including first to fifth circuits and first to kth wirings (k is an integer of 2 or more). The first circuit includes an input terminal. The second circuit includes first to (2k)th output terminals. The first circuit is electrically connected to the second circuit via the hth wiring (h is an integer of 1 to k). When the semiconductor device is in a driving state, the first circuit is configured to apply first to kth potentials to the first to kth wirings, respectively, in accordance with a potential input to the input terminal. When the semiconductor device is in a driving state, the second circuit is configured to output (k+1)th to (3k)th potentials from the first to (2k)th output terminals, respectively, in accordance with the first to kth potentials input from the first to kth wirings. The third circuit is electrically connected to the first to kth wirings. The fourth circuit is electrically connected to the first to kth output terminals. The fifth circuit is electrically connected to the (k+1)th to (2k)th output terminals. The third circuit is configured to apply a low-level potential to the first to kth wirings when the semiconductor device in a standby state. The fourth circuit is configured to output a high-level potential to the first to kth output terminals when the semiconductor device is in a standby state. The fifth circuit is configured to output a low-level potential to the (k+1)th to (2k)th output terminals when the semiconductor device is in a standby state.

(2) Another embodiment of the present invention is the semiconductor device described in (1), in which the first circuit includes first to kth transistors; a first terminal of the first transistor is electrically connected to the input terminal; a first terminal of the hth transistor is electrically connected to a gate of the hth transistor; the first terminal of the hth transistor is electrically connected to the hth wiring; and a second terminal of the gth transistor is electrically connected to a first terminal of the (g+1)th transistor (g is an integer of 1 to (k−1)).

(3) Another embodiment of the present invention is the semiconductor device described in (2), in which the first to kth transistors are n-channel transistors.

(4) Another embodiment of the present invention is the semiconductor device described in any one of (1) to (3), in which the third circuit includes (k+1)th to (2k)th transistors; a first terminal of the (k+h) transistor is electrically connected to the hth wiring; and gates of the (k+1)th to (2k)th transistors are electrically connected to each other.

(5) Another embodiment of the present invention is the semiconductor device described in (4), in which the (k+1)th to (2k)th transistors are n-channel transistors.

(6) Another embodiment of the present invention is the semiconductor device described in (5), in which at least one of the (k+1)th to (2k)th transistors includes a back gate; and a threshold voltage of the transistor with the back gate is shifted by application of a potential to the back gate.

(7) Another embodiment of the present invention is the semiconductor device described in any one of (1) to (6), in which the fourth circuit includes (2k+1)th to (3k)th transistors; a first terminal of the (2k+h)th transistor is electrically connected to the hth output terminal; and gates of the (2k+1)th to (3k)th transistors are electrically connected to each other.

(8) Another embodiment of the present invention is the semiconductor device described in (7), in which the (2k+1) th to (3k)th transistors are p-channel transistors.

(9) Another embodiment of the present invention is the semiconductor device described in any one of (1) to (8), in which the fifth circuit includes (3k+1)th to (4k)th transistors; a first terminal of the (3k+h)th transistor is electrically connected to the (k+h)th output terminal; and gates of the (3k+1)th to (4k)th transistors are electrically connected to each other.

(10) Another embodiment of the present invention is the semiconductor device described in (9), in which the (3k+1) th to (4k)th transistors are n-channel transistors.

(11) Another embodiment of the present invention is the semiconductor device described in (10), in which at least one of the (3k+1)th to (4k)th transistors includes a back gate; and a threshold voltage of the transistor with the back gate is shifted by application of a potential to the back gate.

(12) Another embodiment of the present invention is the semiconductor device described in any one of (1) to (11), in which a total number of (4k+1)th transistors included in the second circuit is $(4k^2)$; the (4k+1)th transistors are arranged in (2k) rows and (2k) columns of the second circuit; (2k) transistors of the (4k+1)th transistors are connected in series in a jth column of the second circuit (j is an integer of 1 to (2k)); a connection portion between the (4k+1)th transistor in the jth column and the kth row of the second circuit and the (4k+1)th transistor in the j-th column and the (k+1)th row of the second circuit is a jth node; gates of the (4k+1)th transistors in the (k+h)th row and the first to kth columns of the second circuit are electrically connected to the hth wiring; gates of the (4k+1)th transistors in the hth row and the (k+1)th to (2k)th columns of the second circuit are electrically connected to the hth output terminal; gates of the (4k+1)th transistors in the hth column and the first to (k+1−h)th rows of the second circuit are electrically connected to a hth node; gates of the (4k+1)th transistors in the hth row and the (k+1−h)th to kth columns of the second circuit are electrically connected to the hth output terminal; gates of the (4k+1)th transistors in the (k+h)th column and the (2k+1−h)th to (2k)th rows of the second circuit are electrically connected to a (k+h)th node; and gates of the (4k+1)th transistors in the (k+h)th row and the (k+1)th to (2k+1−h)th columns of the second circuit are electrically connected to the (k+h)th output terminal.

(13) Another embodiment of the present invention is the semiconductor device described in (12), in which the (4k+ 1)th transistors in the jth column and the first to kth rows of the second circuit are p-channel transistors; and the (4k+1)th transistors in the jth column and the (k+1)th to (2k)th rows of the second circuit are n-channel transistors.

(14) Another embodiment of the present invention is a display device including a driving circuit including the semiconductor device described in any one of (1) to (13), and a display portion.

(15) Another embodiment of the present invention is the display device described in (14), which further includes a touch sensor, a touch sensor driver circuit, and a touch sensor detection circuit.

(16) Another embodiment of the present invention is an electronic device including the display device described in (14) or (15), and a housing.

According to one embodiment of the present invention, a novel semiconductor device can be provided. According to another embodiment of the present invention, a display device or a display module including the novel semiconductor device can be provided. According to another embodiment of the present invention, an electronic device using the display device or the display module including the novel semiconductor device can be provided. According to another embodiment of the present invention, a system including the display device or the display module including the novel semiconductor device can be provided.

According to another embodiment of the present invention, a semiconductor device with reduced power consumption, a display device including the semiconductor device, or a display module including the semiconductor device can be provided. According to another embodiment of the present invention, a display device with favorable visibility or a display module with favorable visibility can be provided. According to another embodiment of the present invention, a display device with favorably display quality or a display module with favorable display quality can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BEST MODE FOR CARRYING OUT THE INVENTION

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification, an oxide semiconductor is referred to as an OS in some cases. Thus, a transistor including an oxide semiconductor in a channel formation region is referred to as an OS transistor in some cases.

Embodiment 1

In this embodiment, a source driver circuit and a bias generator included in the source driver circuit are described.
<Source Driver Circuit>

Figure 1:
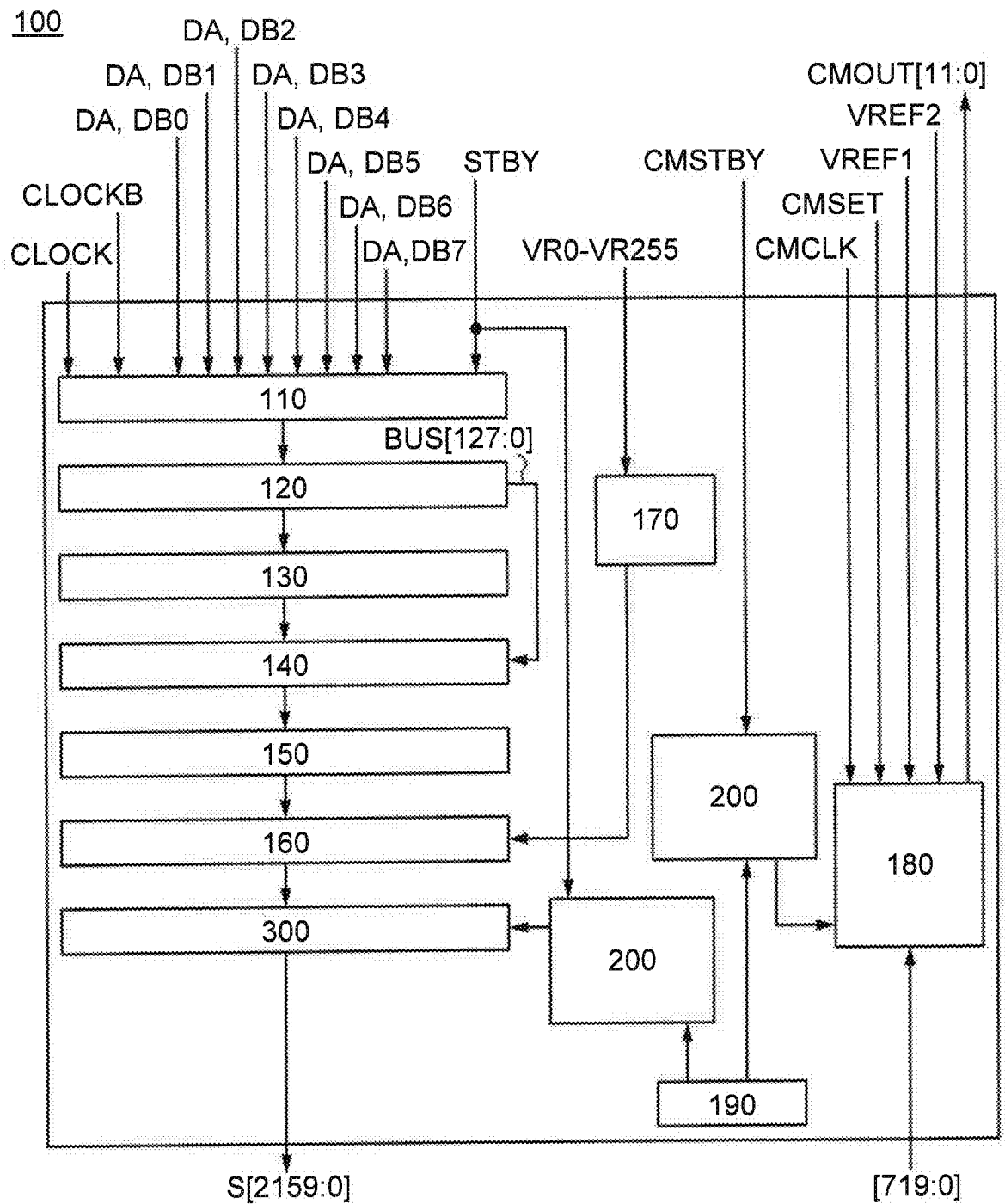
FIG. 1 is a block diagram showing an example of a semiconductor device.

FIG. 1 illustrates an example of a source driver circuit of one embodiment of the present invention. A source driver circuit 100 includes a low voltage differential signaling (LVDS) receiver 110, a serial-parallel converter circuit 120, a shift register circuit 130, latch circuits 140, a level shifter circuit 150, a pass transistor logic circuit 160, a resistor string circuit 170, an external correction circuit 180, a band gap reference (BGR) circuit 190, bias generators 200, and a buffer amplifier 300. Note that the number of the bias generators 200 included in the source driver circuit 100 in FIG. 1 is two.

The LVDS receiver 110 is electrically connected to an external host processor. The LVDS receiver 110 has a function of receiving video signals from the host processor and has a function of converting a differential signal to a single-end signal, and sends the signal to the serial-parallel converter circuit 120. These operations are performed when the LVDS receiver 110 is in a driving state. In FIG. 1, an analog voltage signal DA,DB0, an analog voltage signal DA,DB1, an analog voltage signal DA,DB2, an analog voltage signal DA,DB3, an analog voltage signal DA,DB4, an analog voltage signal DA,DB5, an analog voltage signal DA,DB6, and an analog voltage signal DA,DB7 are input as video signals to the LVDS receiver 110. Note that the LVDS receiver 110 sequentially operates in response to inputs of a clock signal CLOCK and a clock signal CLOCKB and can change from a driving state to a standby state (can be temporarily stopped) in response to a standby signal STBY. Note that the clock signal CLOCKB is an inverted signal of the clock signal CLOCK.

The serial-parallel converter circuit 120 is electrically connected to the LVDS receiver 110. The serial-parallel converter circuit 120 has a function of receiving a single-end signal from the LVDS receiver 110. The serial-parallel converter circuit 120 converts the single-end signal into a parallel signal and transmits the signal as a signal BUS[127:0] to an internal bus.

The shift register circuit 130 is electrically connected to the serial-parallel converter circuit 120, and the latch circuits 140 are electrically connected to the shift register circuit 130. The shift register circuit 130 has a function of designating the timing when data in the internal bus is stored in the latch circuits 140 in all the signal lines (also referred to as data lines) in synchronization with the serial-parallel converter circuit 120.

The level shifter circuit 150 is electrically connected to the latch circuits 140. The level shifter circuit 150 has a function of shifting the levels of the pieces of data in all the signal lines when the pieces of data in all the signal lines are stored in the latch circuits 140.

The pass transistor logic circuit 160 is electrically connected to the level shifter circuit 150 and the resistor string circuit 170. Note that the pass transistor logic circuit 160 and the resistor string circuit 170 form a digital to analog converter (DAC). An 8-bit signal (denoted by VR0-VR255 in FIG. 1) is input to the resistor string circuit 170, and the resistor string circuit 170 outputs a potential corresponding to the signal to the pass transistor logic circuit 160. The pass transistor logic circuit 160 has a function of digital-analog conversion of the pieces of data with the shifted levels when the potential is supplied.

The buffer amplifier 300 is electrically connected to the pass transistor logic circuit 160. The buffer amplifier 300 has a function of amplifying the data subjected to digital-analog conversion and sending the amplified data as a data signal (denoted by S[2159:0] in FIG. 1) to a pixel array.

The BGR circuit 190 has a function of generating a voltage serving as a reference for driving the source driver circuit 100. The BGR circuit 190 is electrically connected to each of the bias generators 200.

One of the bias generators 200 is electrically connected to the BGR circuit 190 and the buffer amplifier 300. The one of the bias generators 200 has a function of generating a bias voltage for driving the buffer amplifier 300 on the basis of the voltage serving as a reference that is generated in the BGR circuit 190. The operation is performed when the bias generator 200 is a driving state. Note that the standby signal STBY is input to the one of the bias generators 200 at the same timing as the input to the LVDS receiver 110 to cause the one of the bias generators 200 to change from a driving state to a standby state (temporarily stop the one of the bias generators 200).

The other of the bias generators 200 is electrically connected to the external correction circuit 180. The other of the bias generators 200 has a function of generating a bias voltage for driving the external correction circuit 180 on the basis of the voltage serving as a reference that is generated in the BGR circuit 190. Note that when the external correction circuit 180 need not be operated, a standby signal CMSTBY is sent to the other of the bias generators 200 to cause the other of the bias generators 200 to change from a driving state to a standby state (temporarily stopped).

The external correction circuit 180 is electrically connected to transistors included in pixels. When pixel transistors in the pixel array have variations in voltage-current characteristics, the variations influence an image displayed on the display device, causing reduction in the display quality of the display device. The external correction circuit 180 has a function of measuring the amount of a current flowing in the pixel transistors and appropriately adjust the amount of the current flowing in the pixel transistors depending on the amount of the current. A set signal CMSET is input to the external correction circuit 180 to initialize the external correction circuit 180. A clock signal CMCLK is input to the external correction circuit 180 to operate the external correction circuit 180. A signal (denoted by S[719:0] in FIG. 1) supplied from a transistor included in a pixel circuit is input to the external correction circuit 180, and the external correction circuit 180 makes determination relating to image correction using a reference potential VREF1 and a reference potential VREF2 as comparative references. A result of the determination relating to correction is sent as an output signal CMOUT[11:0] to an image processor provided in the outside of the source driver circuit 100. The image processor corrects image data on the basis of the contents of CMOUT[11:0].

Note that one embodiment of the present invention is not limited to the source driver circuit 100 shown in FIG. 1 and does not necessary include the external correction circuit 180. For example, instead of the external correction circuit 180, a correction circuit may be provided in each pixel included in the pixel array.

<Bias Generator 200A>

Next, a circuit configuration of the bias generator 200 which can be used in the source driver circuit 100 in FIG. 1 is described.

Figure 2:
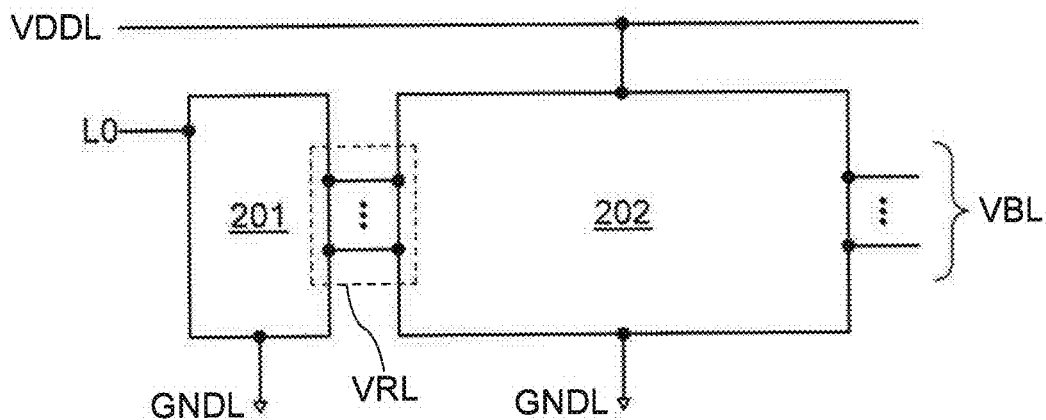
FIG. 2 is a block diagram showing an example of a circuit included in a semiconductor device.

FIG. 2 shows a bias generator of one embodiment of the present invention. A bias generator 200A includes a circuit 201 and a circuit 202.

The circuit 201 is electrically connected to the circuit 202 via one or a plurality of wirings VRL. Furthermore, the circuit 201 is electrically connected to a wiring L0. In addition, the circuit 201 is electrically connected to a wiring GNDL for supplying a low-level potential.

The circuit 202 is electrically connected to a plurality of wirings VBL. Furthermore, the circuit 202 is electrically connected to a wiring VDDL for supplying a high-level potential. In addition, the circuit 202 is electrically connected to the wiring GNDL for supplying a low-level potential.

When the circuit 201 is supplied with a current from the wiring L0, the circuit 201 has a function of generating a potential(s) corresponding to the current and outputting the potential(s). The number of the potentials corresponds to the number of the wirings VRL, and the potential(s) is applied to the wiring(s) VRL. Note that when the number of the wirings VRL is two or more, the potentials which are applied to the wirings VRL have different values from each other.

The circuit 202 has a function of generating and outputting a plurality of bias voltages using the potential applied to the wiring(s) VRL, a high-level potential supplied via the wiring VDDL, and a low-level potential supplied via the wiring GNDL. The number of the bias voltages corresponds to the number of the wirings VBL and the bias voltages are applied to the wirings VBL. Note that the bias voltages applied to the wirings VBL have different values from each other.

The wiring(s) VBL is electrically connected to the buffer amplifier 300 or the external correction circuit 180, and the bias voltage(s) generated in the circuit 202 is applied to the buffer amplifier 300 or the external correction circuit 180.

The bias voltage(s) is higher than or equal to the low-level potential supplied via the wiring GNDL and lower than or equal to the high-level potential supplied via the wiring VDDL.

Note that the current supplied via the wiring L0 is a constant current output from the BGR circuit 190.

Specific Example 1

Figure 3:
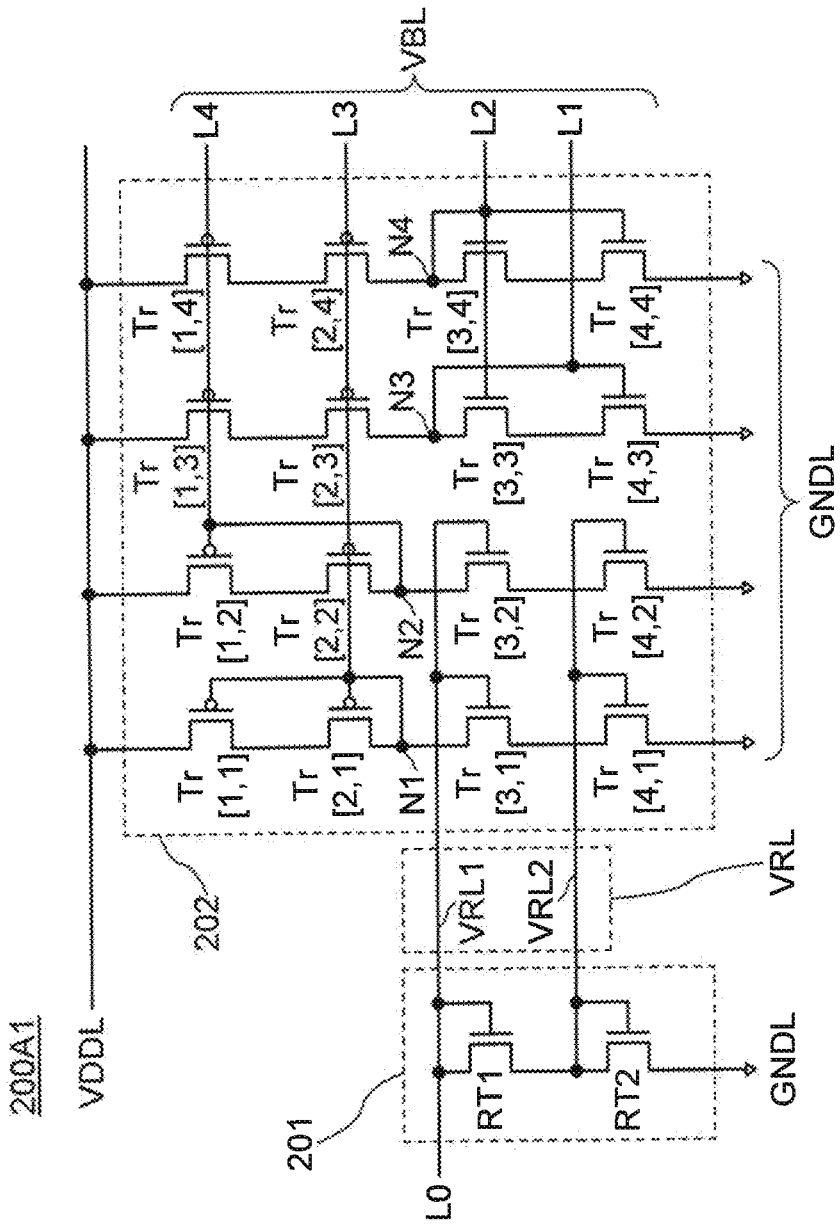
FIG. 3 is a circuit diagram showing a specific example of FIG. 2.

Here, a specific example of a circuit for achieving the bias generator 200A is described as a bias generator 200A1 shown in FIG. 3.

The circuit 201 includes a transistor RT1 and a transistor RT2. The circuit 202 includes transistors Tr[1,1], Tr[2,1], Tr[3,1], Tr[4,1], Tr[1,2], Tr[2,2], Tr[3,2], Tr[4,2], Tr[1,3], Tr[2,3], Tr[3,3], Tr[4,3], Tr[1,4], Tr[2,4], Tr[3,4], and Tr[4,4]. Note that the transistors Tr[1,1], Tr[1,2], Tr[1,3], Tr[1,4], Tr[2,1], Tr[2,2], Tr[2,3], and Tr[2,4] are p-channel transistors; and the transistors Tr[3,1], Tr[3,2], Tr[3,3], Tr[3,4], Tr[4,1], Tr[4,2], Tr[4,3], and Tr[4,4] are n-channel transistors. The number of the wirings VRL is plural, and the wirings VRL are represented as wirings VRL1 and VRL2. The number of the wirings VBL is plural, and the wirings VBL are represented as wirings L1 to L4.

An internal connection configuration of the circuit 201 is described. A first terminal of the transistor RT1 is electrically connected to the wiring L0, a gate of the transistor RT1 is electrically connected to the wiring L0, and the first terminal of the transistor RT1 is electrically connected to the wiring VRL1. A first terminal of the transistor RT2 is electrically connected to a second terminal of the transistor RT1, a gate of the transistor RT2 is electrically connected to the first terminal of the transistor RT2, a second terminal of the transistor RT2 is electrically connected to the wiring GNDL, and the first terminal of the transistor RT2 is electrically connected to the wiring VRL2.

In other words, each of the transistor RT1 and the transistor RT2 is diode-connected. When the potential of the wiring L0 is higher than the low-level potential, a current flows from the wiring L0 to the wiring GNDL via the transistor RT1 and the transistor RT2.

An internal connection configuration of the circuit 202 is described. A first terminal of the transistor Tr[1,j] is an integer of one to four) is electrically connected to the wiring VDDL. A second terminal of the transistor Tr[1,j] is electrically connected to a first terminal of the transistor Tr[2,j], a second terminal of the transistor Tr[2,j] is electrically connected to a first terminal of the transistor Tr[3,j], and a second terminal of the transistor Tr[3,j] is electrically connected to a first terminal of the transistor Tr[4,j]. A connection portion between the second terminal of the transistor Tr[2,1] and the first terminal of the transistor Tr[3,1] is represented as a node N1, a connection portion between the second terminal of the transistor Tr[2,2] and the first terminal of the transistor Tr[3,2] is represented as a node N2, a connection portion between the second terminal of the transistor Tr[2,3] and the first terminal of the transistor Tr[3,3] is represented as a node N3, and a connection portion between the second terminal of the transistor Tr[2,4] and the first terminal of the transistor Tr[3,4] is represented as a node N4.

A second terminal of the transistor Tr[4,j] is electrically connected to the wiring GNDL. A gate of the transistor Tr[3,1] and a gate of the transistor Tr[3,2] are electrically connected to the wiring VRL1, and a gate of the transistor Tr[4,1] and a gate of the transistor Tr[4,2] are electrically connected to the wiring VRL2.

The node N1 is electrically connected to a gate of the transistor Tr[1,1], gates of the transistors Tr[2,1] to Tr[2,4], and the wiring L3. The node N2 is electrically connected to gates of the transistors Tr[1,2] to Tr[1,4] and the wiring L4. The node N3 is electrically connected to a gate of the transistor Tr[4,3] and the wiring L1. The node N4 is electrically connected to a gate of the transistor Tr[3,3], a gate of the transistor Tr[3,4], and the wiring L2.

Operation Example

Next, the operation of the bias generator 200A1 is described.

When the bias generator 200A1 operates, a potential Va is applied from the BGR circuit 190 via the wiring L0. Thus, in the circuit 201, a current $I_{REF}$ flows from the wiring L0 to the wiring GNDL via the transistor RT1 and the transistor RT2. At that time, a potential applied to the second terminal of the transistor RT2 is denoted by Vb. That is, the potential Vb is higher than the low-level potential and lower than the potential Va.

The potential Va is applied to the gate of the transistor Tr[3,1] and the gate of the transistor Tr[3,2] via the wiring VRL1. The potential Vb is applied to the gate of the transistor Tr[4,1] and the gate of the transistor Tr[4,2] via the wiring VRL2. Accordingly, the transistors Tr[3,1], Tr[3,2], Tr[4,1], and Tr[4,2] are turned on. Therefore, a current flows from the node N1 to the wiring GNDL via the transistor Tr[3,1] and the transistor Tr[4,1], and thus a potential higher than the low-level potential is generated at the node N1. Similarly, a current flows from the node N2 to the wiring GNDL via the transistor Tr[3,2] and the transistor Tr[4,2], and thus a potential higher than the low-level potential is generated at the node N2.

Here, the potential of the node N1 is applied to the gate of the transistor Tr[1,1] and the gates of the transistors Tr[2,1] to Tr[2,4]. Accordingly, the transistor Tr[1,1] and the transistor Tr[2,1] are turned on, so that a current flows from the wiring VDDL to the node N1 via the transistor Tr[1,1] and the transistor Tr[2,1]. Furthermore, the transistor Tr[3,1] and the transistor Tr[4,1] are also on. Therefore, the potential of the node N1 is converged to a fixed potential $V_{BIAS3}$ after a certain time, and $V_{BIAS3}$ is output from the wiring L3.

The potential of the node N2 is equal to each potential of the gates of the transistors Tr[1,2] to Tr[1,4], and each potential of the first terminals of the transistors Tr[1,2] to Tr[1,4] is the high-level potential; therefore, when the transistors Tr[1,2] to Tr[1,4] have the same size, currents flowing through the transistors are equal to one another. In addition, the potentials of the second terminals of the transistors Tr[1,2] to Tr[1,4] are equal to one another.

The potential of the node N1 is equal to each potential of the gates of the transistors Tr[2,2] to Tr[2,4]. Since the potentials of the first terminals of the transistors Tr[2,2] to Tr[2,4] are equal to one another, when the transistors Tr[2,2] to Tr[2,4] have the same size, currents flowing through the transistors Tr[2,2] to Tr[2,4] are equal to one another, and the potentials of the second terminals of the transistors Tr[2,2] and Tr[2,4] are equal to one another temporarily. Furthermore, the transistor Tr[3,2] and the transistor Tr[4,2] are also on. Therefore, the potential of the node N2 is converged to a fixed potential $V_{BIAS4}$ after a certain time, and $V_{BIAS4}$ is output from the wiring L4.

As described above, since the transistor Tr[1,4] and the transistor Tr[2,4] are turned on owing to the potentials of the nodes N1 and N2, a current flows from the wiring VDDL to the node N4 via the transistor Tr[1,4] and the transistor Tr[2,4]. Accordingly, a potential lower than the high-level potential is generated at the node N4. Since the potential of the node N4 is applied to the gates of the transistors Tr[3,4] and Tr[4,4], the transistors Tr[3,4] and Tr[4,4] are turned on, so that a current flows from the node N4 to the wiring GNDL via the transistor Tr[3,4] and the transistor Tr[4,4]. As a result, the potential of the node N4 is converged to a fixed potential $V_{BIAS2}$, and then $V_{BIAS2}$ is output from the wiring L2.

As described above, since the transistor Tr[1,3] and the transistor Tr[2,3] are turned on owing to the potentials of the nodes N1 and N2, a current flows from the wiring VDDL to the node N3 via the transistor Tr[1,3] and the transistor Tr[2,3]. Accordingly, a potential lower than the high-level potential is generated at the node N3. Since the potential of the gate of the transistor Tr[3,4] is equal to that of the node N3, the transistor Tr[3,4] is turned on. In addition, since the potential of the gate of the transistor Tr[3,3] is equal to the potential of the node N4, the transistor Tr[3,3] is turned on, like the transistor Tr[3,4]. Thus, a current flows from the node N3 to the wiring GNDL via the transistor Tr[3,3] and the transistor Tr[4,3]. As a result, the potential of the node N3 is converged to a fixed potential $V_{BIAS1}$, and then $V_{BIAS1}$ is output from the wiring L1.

In accordance with the above-described principle, the bias generator 200A1 generates $V_{BIAS1}$, $V_{BIAS2}$, $V_{BIAS3}$, and $V_{BIAS4}$ and outputs them to the wirings L1 to L4, respectively.

Specific Example 2

Figure 4:
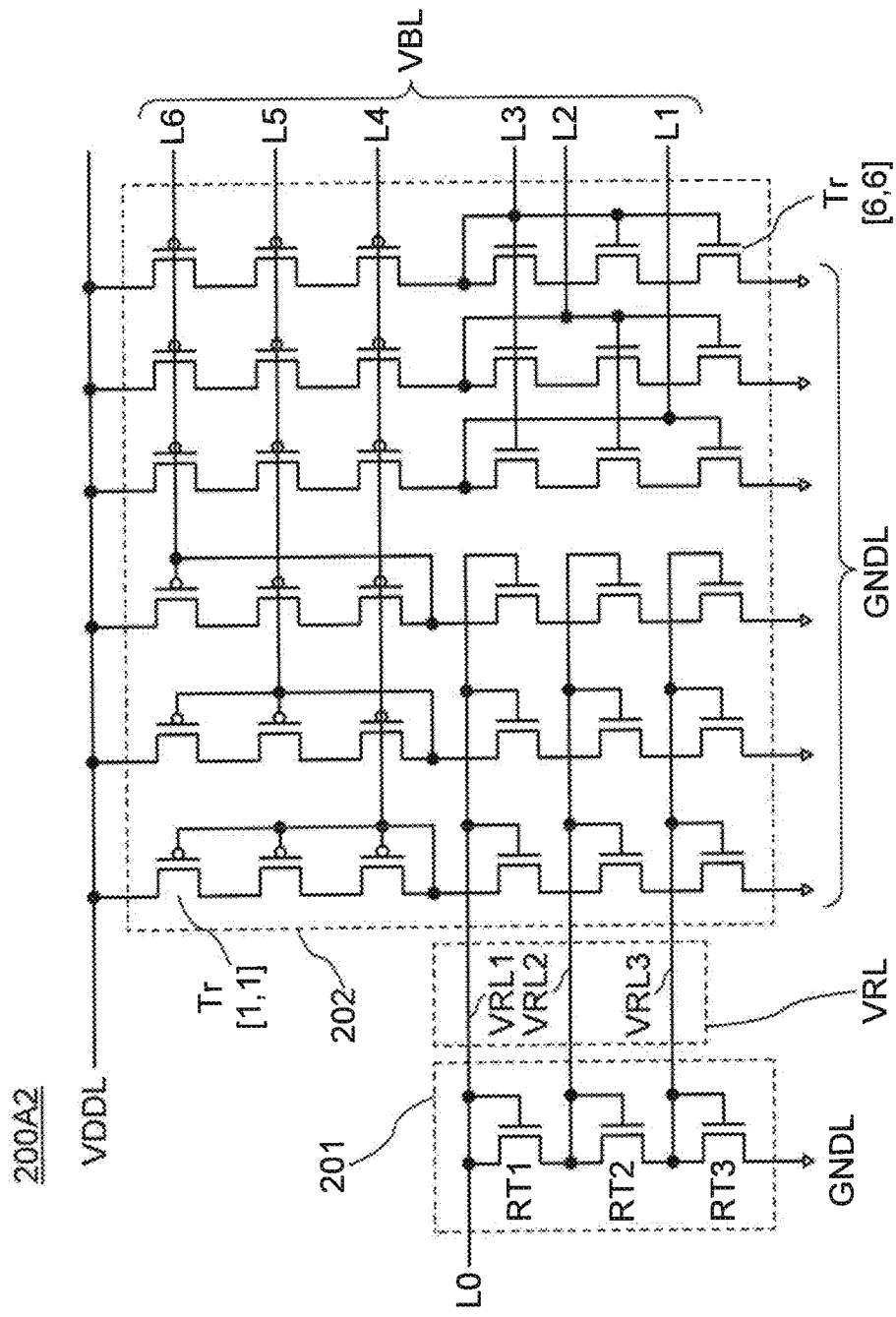
FIG. 4 is a circuit diagram showing a specific example of FIG. 2.

The configuration of the bias generator is not limited to the configuration of the bias generator 200A1 shown in FIG. 3 and another circuit configuration may be employed. For example, a bias generator different from the bias generator 200A1 is shown in FIG. 4. The configuration of a bias generator 200A2 is obtained by adding one transistor to the circuit 201 of the bias generator 200A1 and increasing the number of the transistors of the circuit 202 of the bias generator 200A1.

In the bias generator 200A2 of FIG. 4, the circuit 201 includes a transistor RT1, a transistor RT2, and a transistor RT3. The circuit 202 includes the transistors Tr[1,1] to Tr[6,6]. Of the transistors shown in FIG. 4, the transistor RT1, RT2, RT3 and the transistors Tr[1,1] and Tr[6,6] are denoted by reference numerals, and the reference numerals of the other transistors are not shown. The number of the wirings VRL is plural, and the wirings VRL are represented as wirings VRL1, VRL2, and VRL3. The number of the wirings VBL is plural, and the wirings VBL are represented as wirings L1, L2, L3, L4, L5, and L6.

Such a configuration enables the bias generator 200A2 to generate bias voltages and output them to the wirings L1 to wiring L6, like the bias generator 200A1.

In the case where the number of the output terminals for bias voltages is to be increased or reduced, the number of the transistors included in the circuits 201 and 202 may be changed like in the bias generators 200A1 and 200A2 and the circuits may be configured in the above manner. For example, the number of the transistors included in the circuit 201 of the bias generator 200A is changed to k (k is an integer of one or more) to obtain a bias generator 200A3 shown in FIG. 5. In that case, the number of the transistors included in the circuit 202 is $4k^2$, and the number of output terminals for bias voltages (the number of the wirings VBL) can be 2×k. Note that in FIG. 5, the transistors included in the circuit 201 are transistors RT[1] to RT[k], the transistors included in the circuit 202 are transistors Tr[1,1] to Tr[2k, 2k], and the plurality of wirings VBL are wirings L[1] to L[2k].

Figure 5:
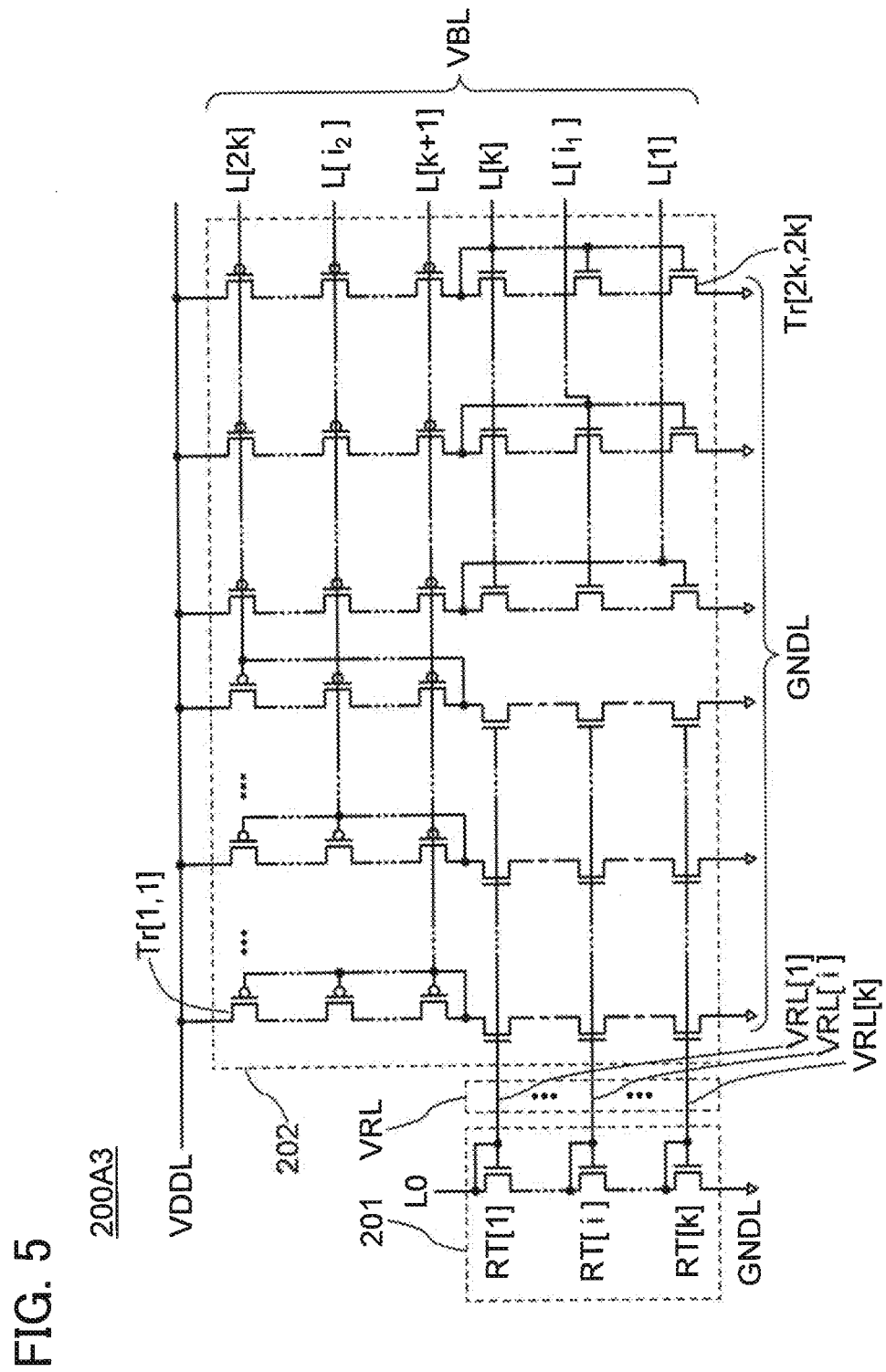
FIG. 5 is a circuit diagram showing a specific example of FIG. 2.

Note that in the bias generator 200A3 of FIG. 5, only the circuits 201 and 202, the plurality of wirings VRL (the wiring VRL[1], the wiring VRL[i] (i is an integer of 1 to k), and the wiring VRL[k]), the plurality of wirings VBL (the wirings L[1], L[$i_1$] ($i_1$ is an integer of 1 to k), L[k], L[k+1], L[$i_2$] ($i_2$ is an integer of k+1 to 2k), and L[2k]), the wirings L0, GNDL, and VDDL, the transistors RT[1], RT[i], RT[k], Tr[1,1], and Tr[2k,2k] are illustrated, and the other wirings, symbols, and reference numerals are not shown.

<Bias Generator 200B>

When a display device displays a still image, the operations of the buffer amplifier 300 included in the source driver circuit 100 may be stopped temporarily in some cases. For example, in the case where OS transistors are used as transistors in the pixels of the display device, written data signals can be retained for a long time because the OS transistors exhibit favorable switching characteristics and have an extremely small off-state current (details thereof will be described in Embodiment 2). In particular, when the same image is continuously displayed for two or more frames, e.g., when a still image is displayed, the use of the above principle makes it unnecessary to continuously send data signals with the same contents to a pixel circuit and allows the image to be displayed by using the data signal retained in the pixel circuit. In other words, it is unnecessary to send data signals to the pixel circuit, thereby reducing the power consumption of the display device.

The bias generator 200 in a driving state supplies bias voltages to the buffer amplifier 300. While the display device is in a driving state, i.e., the display device displays an image such as a moving image, the buffer amplifier 300 and the bias generator 200 are in a driving state continuously because data signals are sent to the pixel circuit at a high driving frequency (e.g., a frequency of 60 Hz or more). Therefore, the power consumptions of the buffer amplifier 300 and the bias generator 200 tend to be high. In contrast, while the display device displays a still image, the image need not be rewritten; accordingly, the display device can be operated at a low driving frequency (e.g., a frequency of less than 60 Hz). When the display device is operated at a low driving frequency, the number of rewriting operations is smaller than that in the case of operation at a high frequency, and a period during which the image data is not rewritten is generated accordingly. The buffer amplifier 300 and the bias generator 200 can be in a standby state (temporarily stopped) during the period when rewriting of the image data is not performed, whereby the power consumption of the display device can be reduced. In this manner, an operation for bringing the driver circuits such as the buffer amplifier 300 and the bias generator 200 into a standby state (temporarily stopping the driver circuits) when not needed may be referred to as idling stop (IDS) driving.

Here, a configuration of the bias generator 200 which can be brought into a standby state is described with reference to FIG. 6. A bias generator 200B has the configuration in which circuits 203 to 205 are provided in the bias generator 200A.

The bias generator 200B has a configuration in which the circuit 203 is provided between the circuit 201 and the circuit 202 of the bias generator 200A. That is, the circuit 201 is electrically connected to the circuit 202 via the circuit 203. In addition, in the bias generator 200B, the circuit 204 is provided between the circuit 202 and some of the plurality of wirings VBL of the bias generator 200A, and the circuit 205 is provided between the circuit 202 and the other wirings VBL of the bias generator 200A. In other words, the circuit 202 is electrically connected to some of the plurality of wirings VBL via the circuit 204 and electrically connected to the other wirings VBL via the circuit 205.

The specific connection configuration is described. The circuit 201 is electrically connected to the circuit 203 via one or a plurality of wirings VRLa. The circuit 201 is electrically connected to the wiring L0. In addition, the circuit 201 is electrically connected to the wiring GNDL for supplying the low-level potential.

The circuit 202 is electrically connected to the circuit 203 via one or a plurality of wirings VRLb. The circuit 203 is electrically connected to the wiring GNDL for supplying the low-level potential and a wiring STBYL.

The number of the wirings VRLa corresponds to the number of the wirings VRLb.

The circuit 202 is electrically connected to one or a plurality of wirings VBL. Furthermore, the circuit 202 is electrically connected to the wiring VDDL for supplying the high-level potential. Moreover, the circuit 202 is electrically connected to the wiring GNDL for supplying the low-level potential. The circuit 204 is electrically connected to the circuit 202, and the circuit 205 is electrically connected to the circuit 202.

The circuit 204 is electrically connected to a wiring STBYL-B and the wiring VDDL for supplying the high-level potential. Note that the wiring STBYL-B may be configured to be supplied with an inverted signal of the signal input to the wiring STBYL.

The circuit 205 is electrically connected to the wiring STBYL and the wiring GNDL for supplying the low-level potential.

For detailed functions of the circuits 201 and 202, the description of the circuits 201 and 202 of the bias generator 200A is referred to.

The circuit 203 has function of outputting either the potentials of the wirings VRLa or the low-level potential to the wirings VRLb and determines potentials to be applied to the wirings VRLb, using the potential supplied from the wiring STBYL.

The circuit 204 has a function of applying the high-level potential to some of the wirings VBL and can determine whether or not it operates the function depending on the potential supplied from the wiring STBYL-B. Specifically, during the driving state of the bias generator 200, predetermined bias voltages are output from the wirings VBL electrically connected to the circuit 204, whereas during the standby state of the bias generator 200, high-level potentials are output from the wirings VBL electrically connected to the circuit 204.

The circuit 205 has a function of applying the low-level potential to the other wirings VBL, and can determine whether or not it operates the function depending on the potential supplied from the wiring STBYL. Specifically, during the driving state of the bias generator 200, predetermined bias voltages are output from the wirings VBL electrically connected to the circuit 205, whereas during the standby state of the bias generator 200, low-level potentials are output from the wirings VBL electrically connected to the circuit 205.

The above configuration enables the bias generator to be in a standby state (stopped temporarily) when rewriting of data signals is unnecessary.

Specific Example 1

Figure 7:
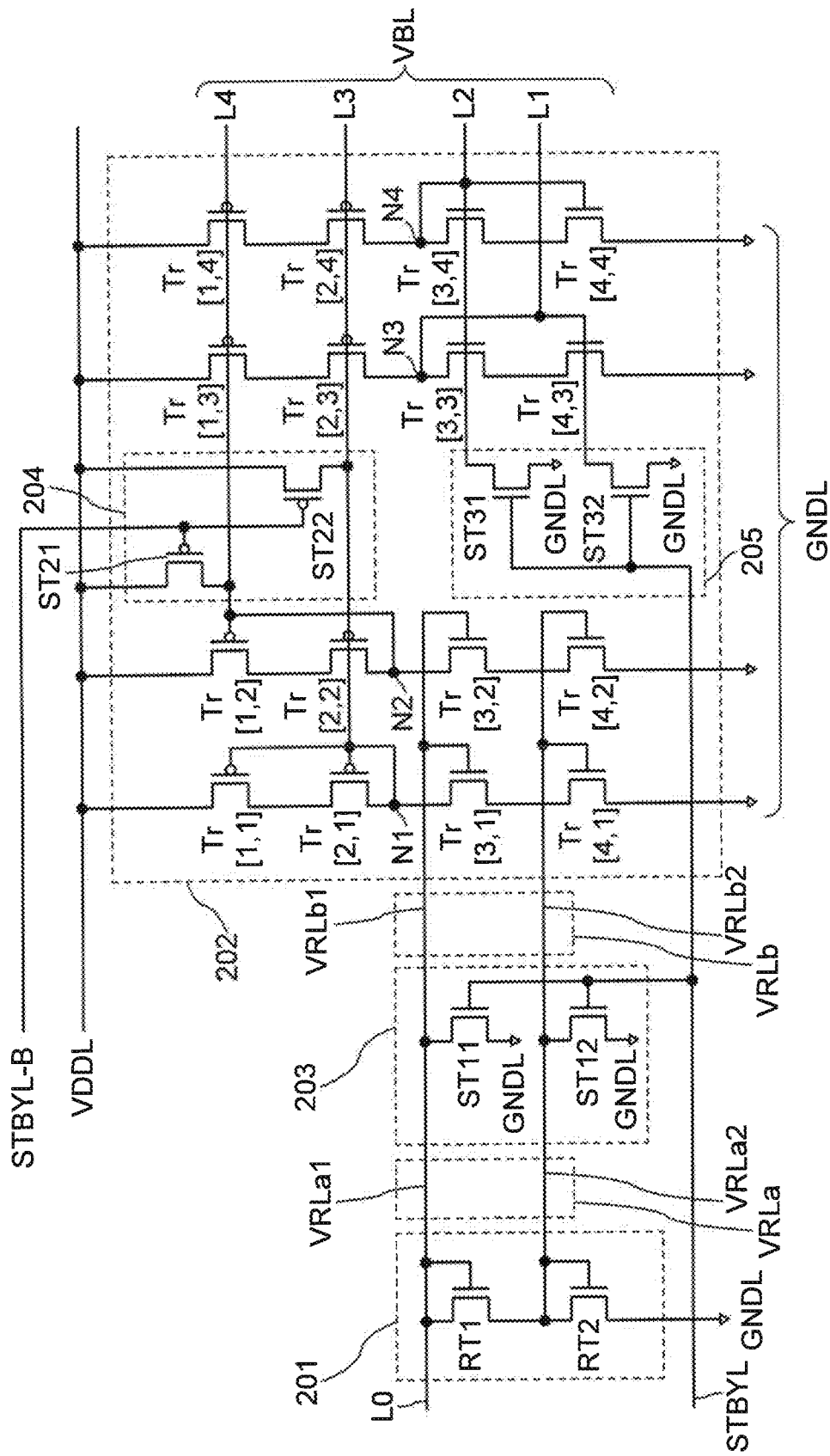
FIG. 7 is a circuit diagram showing a specific example of FIG. 6.

A bias generator 200B1, a specific circuit example for obtaining the bias generator 200B, is shown in FIG. 7.

The bias generator 200B1 is configured in such a manner that the circuit 203, the circuit 204, and the circuit 205 are incorporated in the bias generator 200A1. Therefore, the same contents as the bias generator 200A1 are not described and different points from the bias generator 200A1 are described.

Figure 6:
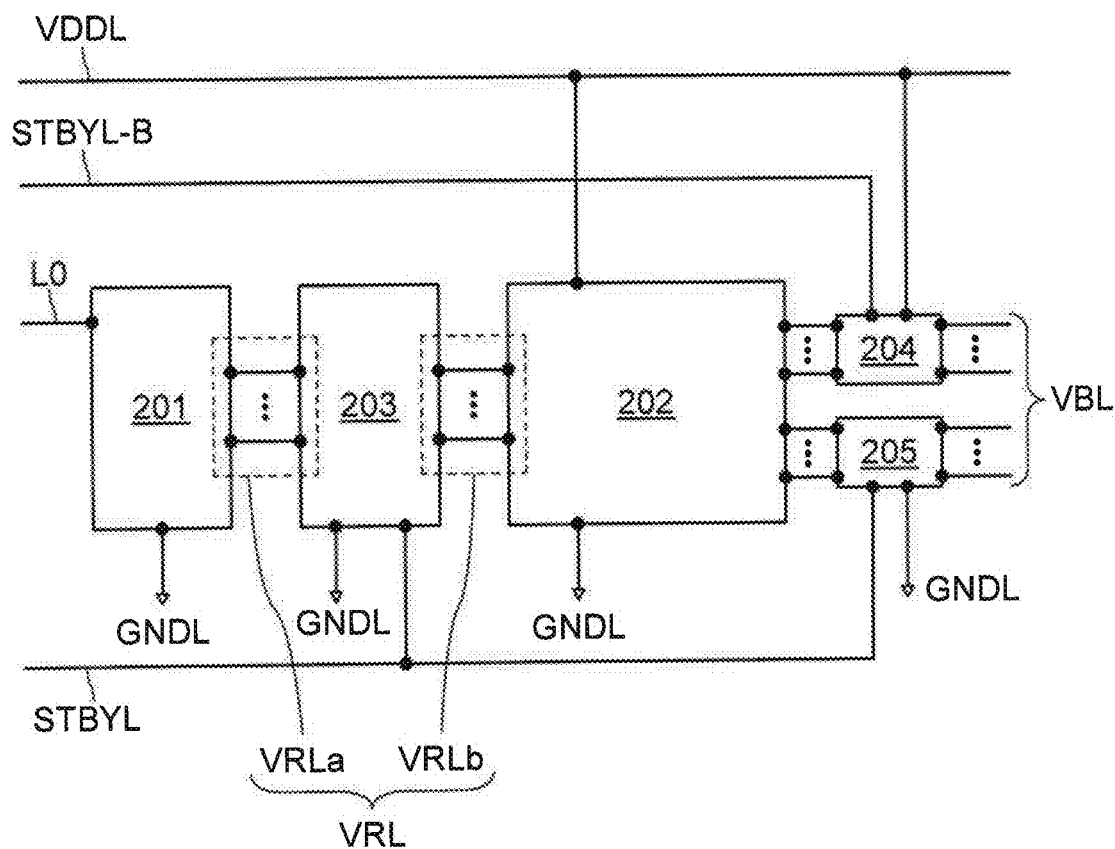
FIG. 6 is a block diagram showing an example of a circuit included in a semiconductor device.

Note that as for a different point from the bias generator 200B of FIG. 6, the circuit 202 includes the circuit 204 and the circuit 205 of the bias generator 200B1 of FIG. 7. Since the circuit 204 and the circuit 205 only need be electrically connected to the plurality of wirings VBL, the circuit 204 and the circuit 205 may be included in the circuit 202. In other words, one embodiment of the present invention is not limited to the configuration of the bias generator 200B shown in FIG. 6, and the configuration of the bias generator 200B shown in FIG. 6 may be changed as appropriate as long as the same effect as the bias generator 200 can be obtained.

The circuit 203 includes a transistor ST11 and a transistor ST12, the circuit 204 includes a transistor ST21 and a transistor ST22, and the circuit 205 includes a transistor ST31 and a transistor ST32.

The number of the wirings VRLa is plural, and the wirings VRLa are referred to as a wiring VRLa1 and a wiring VRLa2. The number of the wirings VRLb is plural, and the wirings VRLb are referred to as a wiring VRLb1 and a wiring VRLb2.

A first terminal of the transistor RT1 of the circuit 201 included in the bias generator 200B1 is electrically connected to the wiring VRLa1, and a first terminal of the transistor RT2 of the circuit 201 included in the bias generator 200B1 is electrically connected to the wiring VRLa2.

An internal connection configuration of the circuit 203 is described. A first terminal of the transistor ST11 is electrically connected to the wiring VRLa1 and the wiring VRLb1, a gate of the transistor ST11 is electrically connected to the wiring STBYL, and a second terminal of the transistor ST11 is electrically connected to the wiring GNDL. A first terminal of the transistor ST12 is electrically connected to the wiring VRLa2 and the wiring VRLb2, a gate of the transistor ST12 is electrically connected to the wiring STBYL, and a second terminal of the transistor ST12 is electrically connected to the wiring GNDL.

The gate of the transistor Tr[3,1] of the circuit 202 included in the bias generator 200B1 is electrically connected to the wiring VRLb1, and the gate of the transistor Tr[3,2] of the circuit 202 included in the bias generator 200B1 is electrically connected to the wiring VRLb1. The gate of the transistor Tr[4,1] of the circuit 202 included in the bias generator 200B1 is electrically connected to the wiring VRLb2, and the gate of the transistor Tr[4,2] of the circuit 202 included in the bias generator 200B1 is electrically connected to the wiring VRLb2.

An internal connection configuration of the circuit 204 is described. A first terminal of the transistor ST21 is electrically connected to the wiring VDDL, a gate of the transistor ST21 is electrically connected to the wiring STBYL-B, and a second terminal of the transistor ST21 is electrically connected to the wiring L4. A first terminal of the transistor ST22 is electrically connected to the wiring VDDL, a gate of the transistor ST22 is electrically connected to the wiring STBYL-B, and a second terminal of the transistor ST22 is electrically connected to the wiring L3.

An internal connection configuration of the circuit 205 is described. A first terminal of the transistor ST31 is electrically connected to the wiring GNDL, a gate of the transistor ST31 is electrically connected to the wiring STBYL, and a second terminal of the transistor ST31 is electrically connected to the wiring L2. A first terminal of the transistor ST32 is electrically connected to the wiring GNDL, a gate of the transistor ST32 is electrically connected to the wiring STBYL, and a second terminal of the transistor ST32 is electrically connected to the wiring L1.

Operation Example

Next, an operation example of the bias generator 200B1 is described. Note that the bias generator 200B1 operates in substantially the same manner as the bias generator 200A1; therefore, the description of the operation example of the bias generator 200A1 is referred to for operations of the bias generator 200B1 which are the same as those of the bias generator 200A1, and functions and operations which are obtained by providing the circuits 203 to 205 are described below.

As described above, when the display device displays a still image, bringing the buffer amplifier 300 and the bias generator 200 into a standby state (temporarily stopping the buffer amplifier 300 and the bias generator 200) can reduce the power consumption of the display device. The bias generator 200B1 can be brought into a standby state (temporarily stopped) by the operations of the circuits 203 to 205.

The bias generator 200B1 can be brought into either a driving state or a standby state (temporarily stopped) by application of appropriate potentials to the wiring STBYL and the wiring STBYL-B.

A high-level potential is input to one of the wiring STBYL and the wiring STBYL-B, and a low-level potential is input to the other of the wiring STBYL and the wiring STBYL-B. Here, the high-level potential is a potential high enough to turn on the transistors ST11, ST12, ST31, and ST32; and the low-level potential is a potential low enough to turn on the transistors ST21 and ST22.

When the bias generator 200B1 is operated, the low-level potential is applied to the wiring STBYL, and the high-level potential is applied to the wiring STBYL-B.

Accordingly, the transistors ST11, ST12, ST21, ST22, ST31, and ST32 can be turned off. That is, by applying the low-level potential and the high-level potential to the wiring STBYL and the wiring STBYL-B, respectively, the bias generator 200B1 can be operated in a manner similar to that of the bias generator 200A1.

When the bias generator 200B1 is brought into a standby state (temporarily stopped), the high-level potential is applied to the wiring STBYL, and the low-level potential is applied to the wiring STBYL-B. Accordingly, the transistors ST11, ST12, ST21, ST22, ST31, and ST32 can be turned on. In other words, each of the wirings L0, VRLa1, VRLa2, VRLb1, VRLb2, L1, and L2 can have the low-level potential; and each of the wirings L3 and L4 can have the high-level potential.

Therefore, the transistor RT1 and the transistor RT2 in the circuit 201 are turned off, and the potential Va and the potential Vb are not generated owing to the current $I_{REF}$ supplied from the BGR circuit 190. All of the transistors Tr[1,1] to Tr[4,4] in the circuit 202 are turned off; accordingly, the bias voltages $V_{BIAS1}$, $V_{BIAS2}$, $V_{BIAS3}$, and $V_{BIAS4}$ are not generated. Then, owing to the configuration of the circuits 204 and 205, the low-level potential is output to the wiring L1 and the wiring L2, and the high-level potential is output to the wiring L3 and the wiring L4.

In this manner, application of the high-level potential and the low-level potential to the wiring STBYL and the wiring STBYL-B, respectively, can bring the bias generator 200B1 into a standby state (temporarily stop the bias generator 200B1). Furthermore, the buffer amplifier 300 may be configured to be brought into a standby state (temporarily stopped) when the low-level potentials output from the wiring L1 and the wiring L2 and the high-level potentials output from the wiring L3 and the wiring L4 are applied to the buffer amplifier 300.

Specific Example 2

Figure 8:
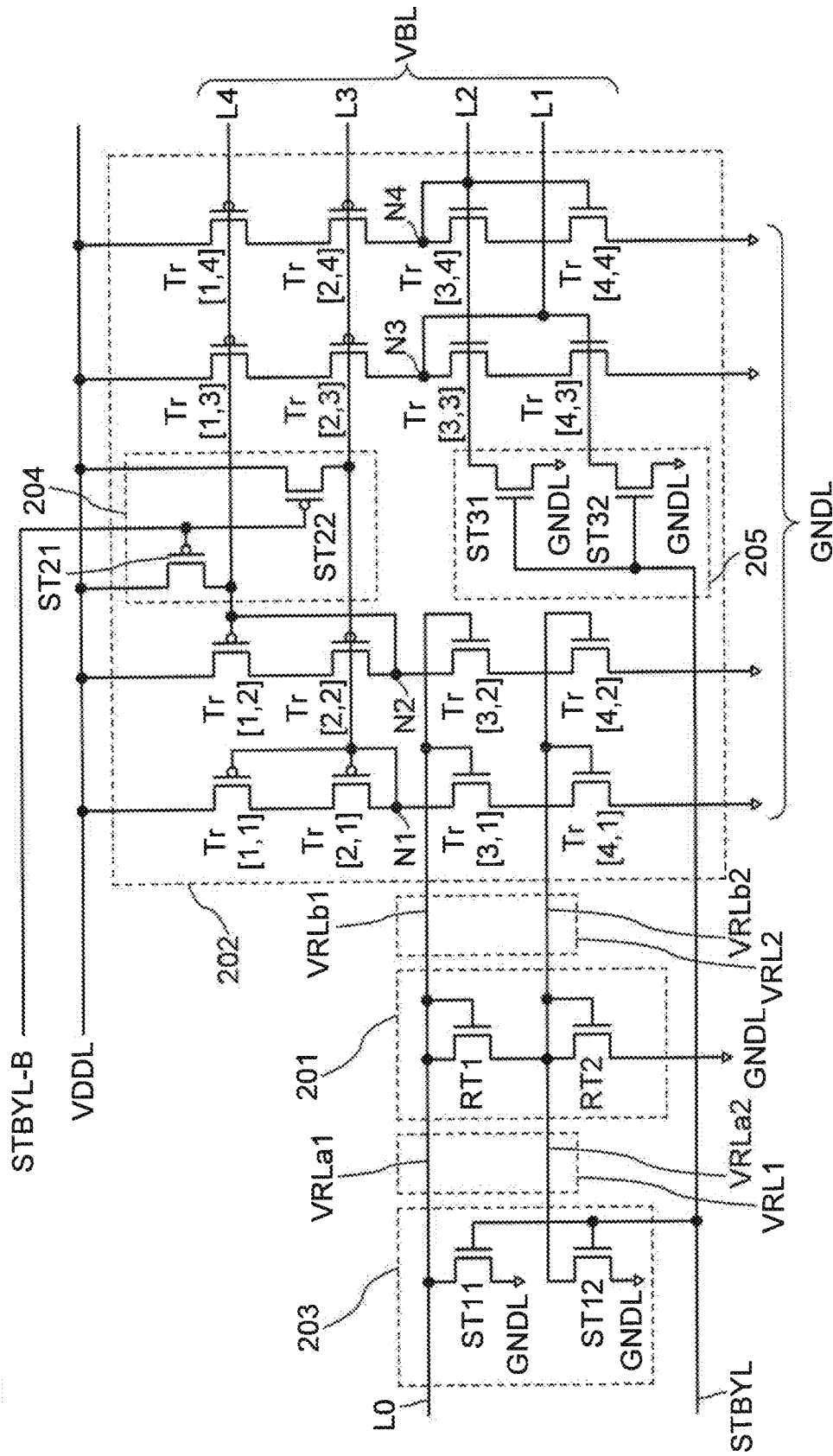
FIG. 8 is a circuit diagram showing a specific example of FIG. 6.

The configuration of the bias generator is not limited to the configuration of the bias generator 200B1 shown in FIG. 7 and another circuit configuration may be employed. For example, a bias generator different from the bias generator 200B1 is shown in FIG. 8. A bias generator 200B2 is a circuit obtained by changing the position of the circuit 203 of the bias generator 200B1. In the bias generator 200B2, the circuit 203 is electrically connected to the circuit 202 via the circuit 201. That is, the electrical connection configuration of the bias generator 200B2 is the same as that of the bias generator 200B1; therefore, the bias generator 200B2 can be operated and brought into a standby state (temporarily stopped) in the same manner as the bias generator 200B1.

Figure 9:
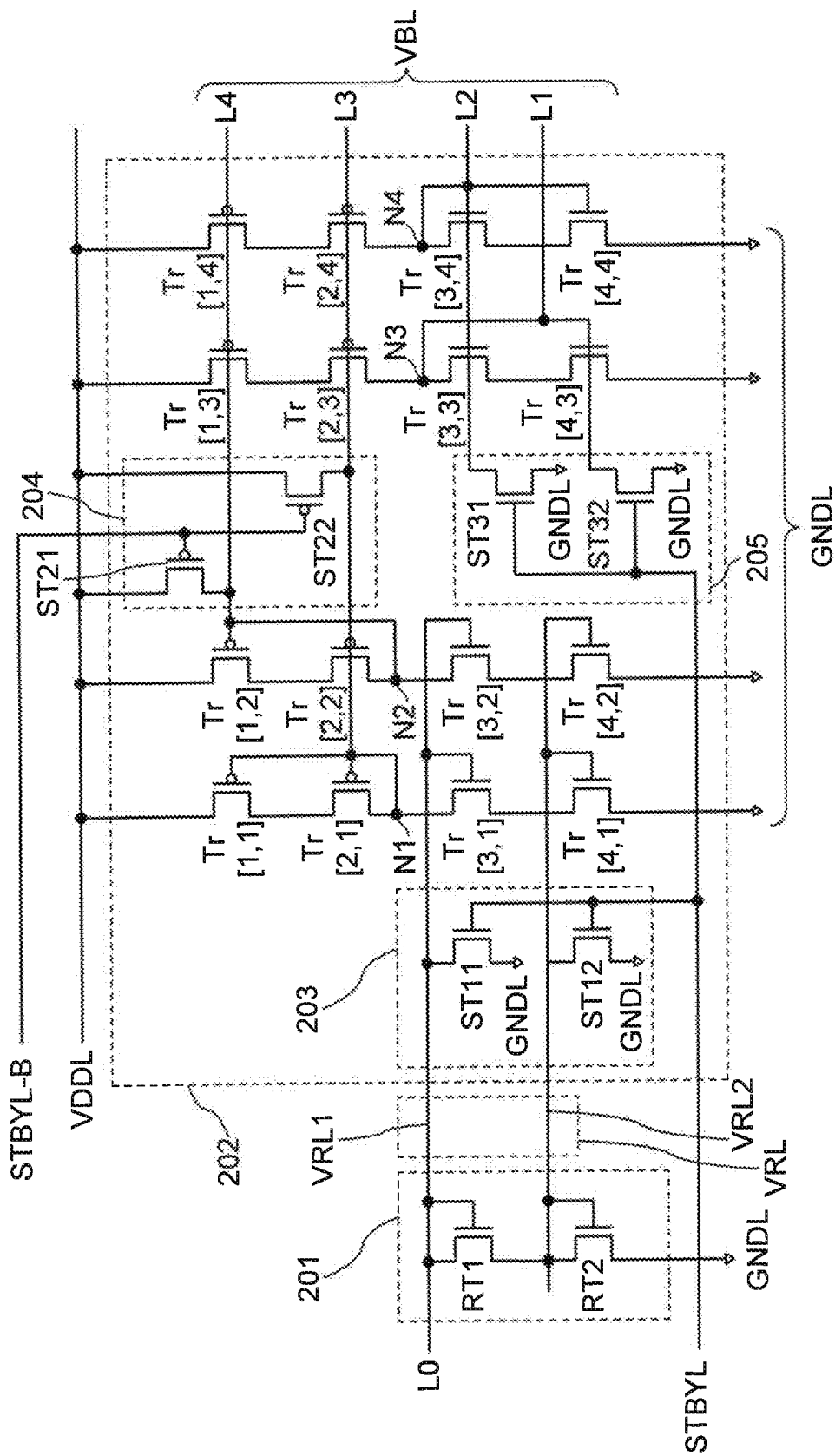
FIG. 9 is a circuit diagram showing a specific example of FIG. 6.

For example, the circuit 203 of the bias generator 200B1 may be provided in the circuit 202. A configuration in that case is shown in FIG. 9. A bias generator 200B3 includes the circuits 203 to 205 which cause the bias generator 200B3 to change from an operation state and a standby state (temporarily stop the bias generator 200B3). The circuits 203 to 205 are provided in the circuit 202. The electrical connection configuration of the bias generator 200B3 is the same as that of the bias generator 200B1; therefore, the bias generator 200B3 can be brought into an operation state or a standby state (temporarily stopped state) in the same manner as the bias generator 200B1.

Figure 10:
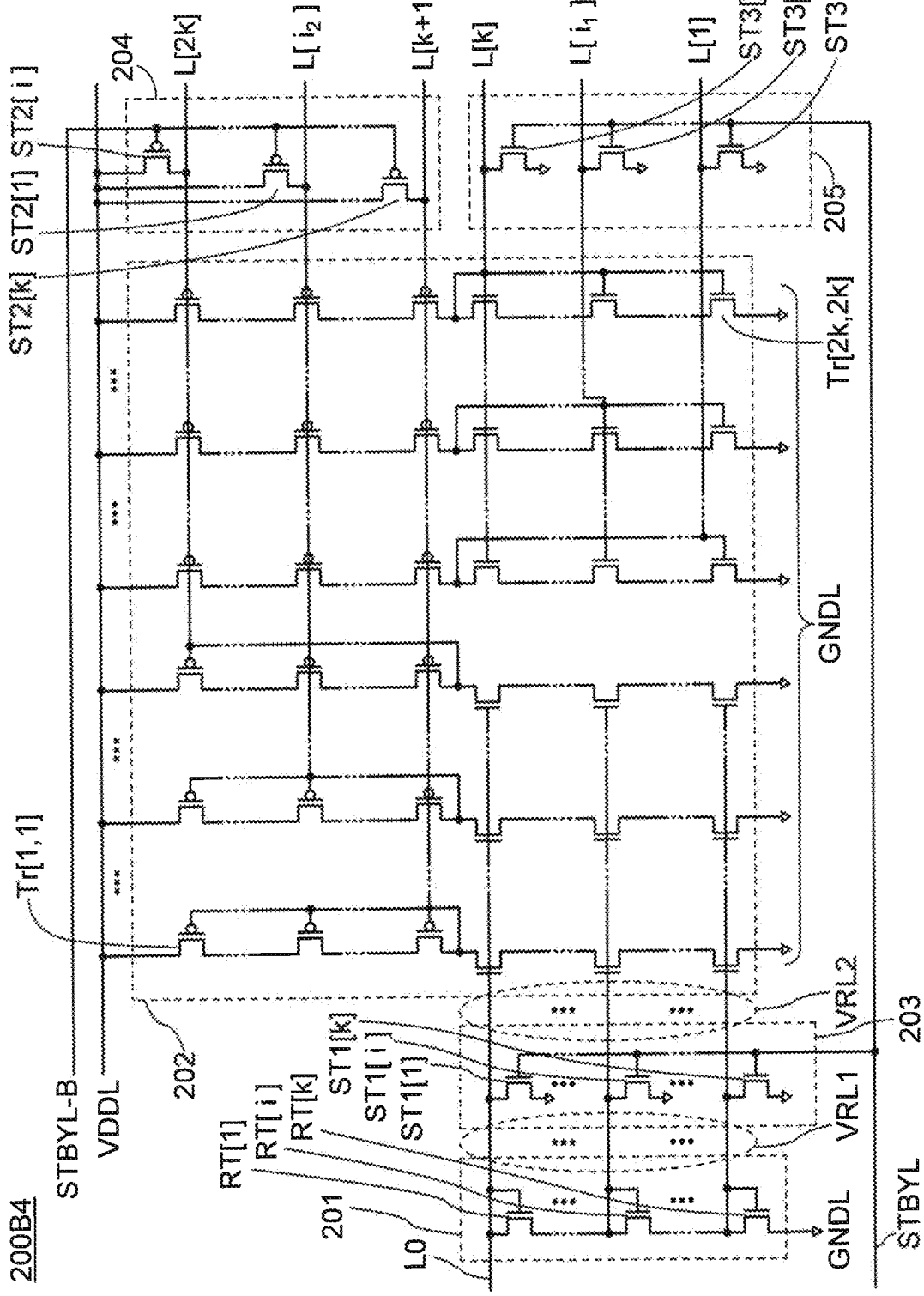
FIG. 10 is a circuit diagram showing a specific example of FIG. 6.

The bias generator 200A3 may be provided with the circuits 203 to 205, for example. A configuration in that case is shown in FIG. 10. A bias generator 200B4 is configured in such a manner that the circuit 203 is inserted to the electrical connection path between the circuit 201 and the circuit 202 of the bias generator 200A3, the circuit 204 is inserted to the electrical connection path between the circuit 202 and the wirings L[k+1] to L[2k] of the bias generator 200A3, and the circuit 205 is inserted to the electrical connection path between the circuit 202 and the wirings L[1] to L[k] of the bias generator 200A3. Such a configuration can obtain the bias generator 200 in which the number of the output terminals for bias voltages (the number of wirings VBL) is 2×k. In FIG. 10, the transistors included the circuit 201 are the transistors RT[1] to RT[k], the transistors included in the circuit 202 are the transistors Tr[1,1] to Tr[2k,2k], the transistors included in the circuit 203 are transistors ST1[1] to ST1[$k$], the transistors included in the circuit 204 are transistors ST2[1] to ST2[$k$], the transistors included in the circuit 205 are transistors ST3[1] to ST3[$k$], and the plurality of wirings VBL are the wirings L[1] to L[2k].

Note that only the circuits 201, 202, 203, 204, and 205; a plurality of wirings VRL1; a plurality of wirings VRL2; a plurality of wirings VBL; the wirings L[1], L[$i_1$], L[k], L[k+1], L[$i_2$], L[2k], L0, GNDL, VDDL, STBYL, and STBYL-B; the transistors RT[1], RT[i],RT[k], Tr[1,1], Tr[2k,2k], ST1[1], ST1[$i$], ST1[$k$], ST2[1], ST2[$i$], ST2[$k$], ST3[1], ST3[$i$], and ST3[$k$] are illustrated in the bias generator 200B4 of FIG. 10, and the other wirings, symbols, and reference numerals are not shown. The reference numeral of the wiring GNDL electrically connected to the second terminals of the transistors ST1[1] to ST1[k] of the circuit 203 and the first terminals of the transistors ST3[1] to ST3[k] of the circuit 205 is not shown in the drawing.

At least one of the transistors included in the circuits 203 and 205 of any of the bias generators 200B1 to 200B4 may be an OS transistor, for example. An OS transistor has advantages of an excellent switching characteristics and an extremely small off-state current. The transistors included in the circuits 203 and 205 are off during the operation of the bias generator 200B. When OS transistors are used as the transistors, leakage current of the transistors in an off state can be extremely small. Thus, the use of OS transistors makes it possible to obtain a bias generator with stable operation.

Figure 11:
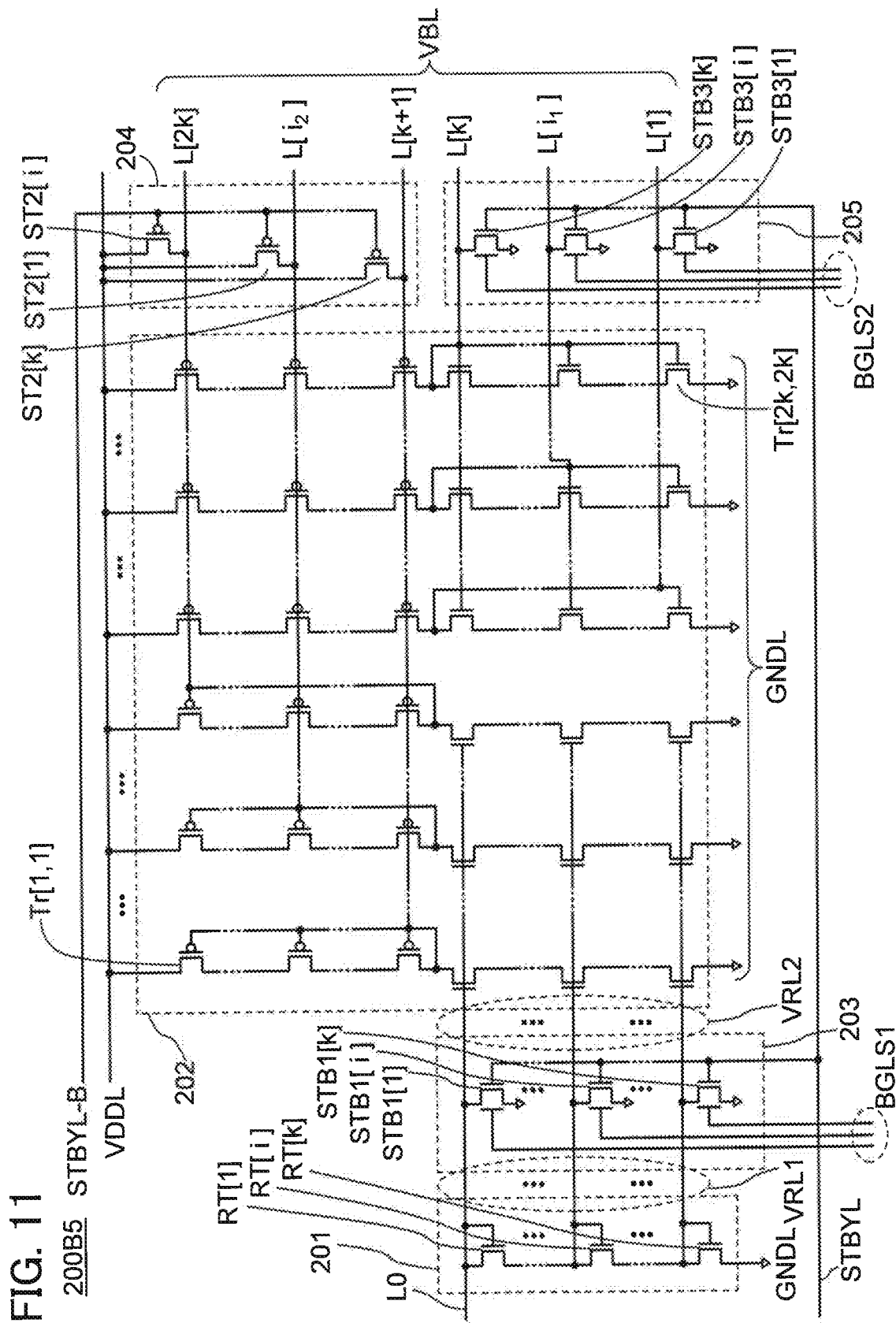
FIG. 11 is a circuit diagram showing a specific example of FIG. 6.

For example, in the case where at least one of the transistors included in the circuits 203 and 205 in any of the bias generators 200B1 to 200B4 is an OS transistor, the OS transistor may have a back gate in addition to a front gate. The configuration of the bias generator 200B in that case is shown in FIG. 11. To obtain a bias generator 200B5, the transistors ST1[1] to ST1[k] included in the circuit 203 of the bias generator 200B4 are replaced with transistors STB1 [1] to STB1[k], and the transistors ST3[1] to ST1[k] included in the circuit 205 of the bias generator 200B4 are replaced with transistors STB3[1] to STB3[k]. Note that only the transistors STB1[1], STB1[i], and STB1[k] of the transistors of the circuit 203 are illustrated in FIG. 11, the other transistors of the circuit 203 are not illustrated. In addition, only the transistors STB3[1], STB3[i], and STB3 [k] of the circuit 205 are illustrated, and the other transistors of the circuit 205 are not illustrated FIG. 11.

Back gates of the transistors STB1[1] to STB1[k] are electrically connected to a plurality of wirings BGLS1. Back gates of the transistors STB3[1] to STB3[k] are electrically connected to a plurality of wirings BGLS2. For the other connection configuration, the description of the bias generator 200B4 is referred to.

An OS transistor with a back gate can control its threshold voltage by application of a given potential to the back gate. Accordingly, application of a positive potential to the back gate puts the OS transistor in a normally-on state, whereby a larger current can flow through the OS transistor; as a result, the bias generator can be operated at higher speed. In addition, application of a negative potential to the back gate makes the OS transistor turned off (such a state may also be referred to as a normally-off state in the following description). This makes it possible to control the on/off state of the OS transistor by application of a given potential not only to the front gate but also the back gate. Note that it is preferable that a transistor to be described in Embodiment 7 be used as the OS transistor with a back gate.

<Buffer Amplifier>

Here, a configuration of the buffer amplifier 300 which is driven with the use of an output voltage of the bias generator 200 is described.

Configuration Example

Figure 12:
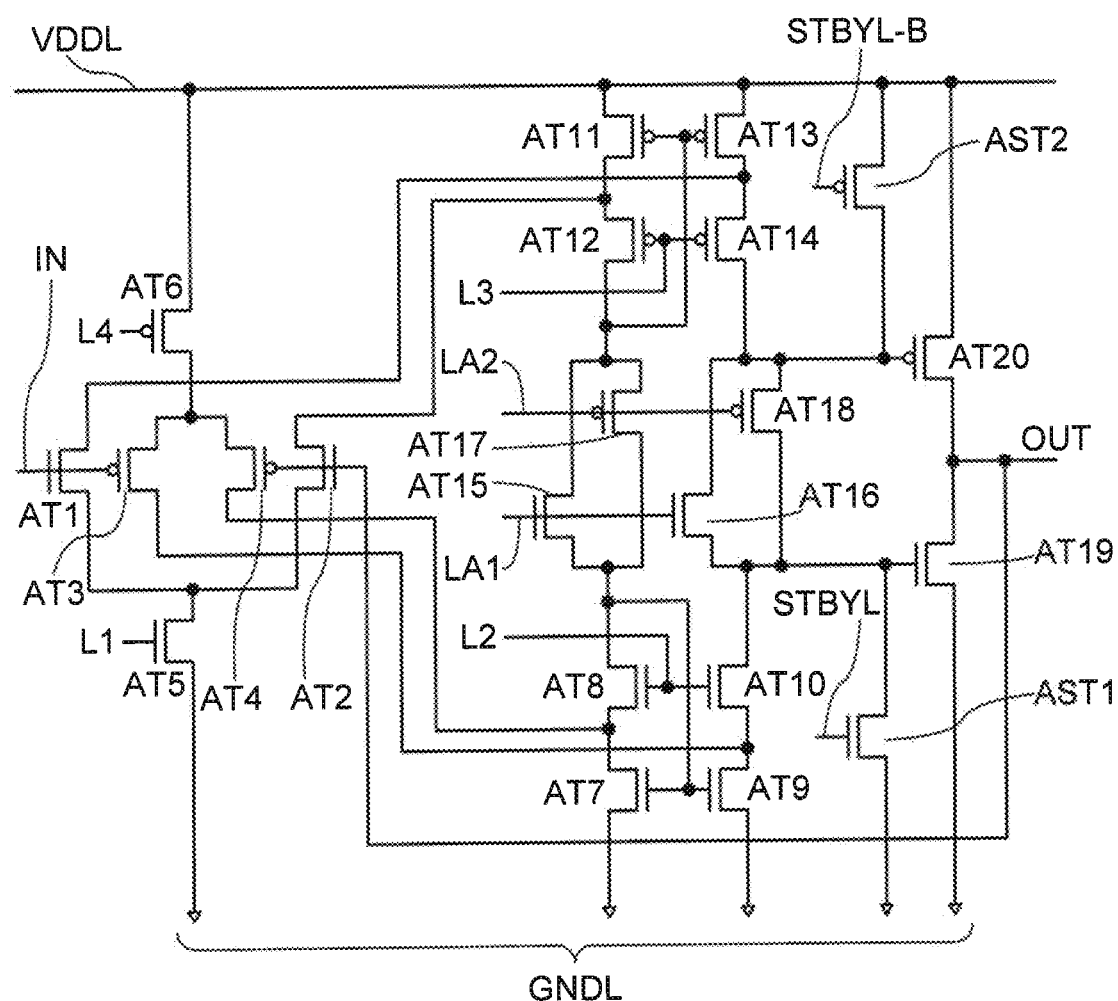
FIG. 12 is a circuit diagram showing an example of a buffer amplifier.

FIG. 12 illustrates an example of the buffer amplifier 300 which can be operated using an output voltage of any of the bias generators 200B1 to 200B3. In the following description, the buffer amplifier 300 is electrically connected to the bias generator 200B1.

The buffer amplifier 300 includes an input terminal IN and an output terminal OUT. The buffer amplifier 300 outputs a potential obtained by adding AV to a potential input to the input terminal IN, to the output terminal OUT. The input terminal IN is electrically connected to the pass transistor logic circuit 160 and supplied with data signals (potentials) which have been subjected to digital-to-analog conversion by the pass transistor logic circuit 160 and the resistor string circuit 170. Note that the potential AV depends on a bias voltage input to the buffer amplifier 300, details of which will be described later.

The wirings L1 to L4 connected to the buffer amplifier 300 are electrically connected to the bias generator 200B1. Thus, the bias voltages $V_{BIAS1}$, $V_{BIAS2}$, $V_{BIAS3}$, and $V_{BIAS4}$ generated in the bias generator 200B1 are input to the buffer amplifier 300 via the wirings L1 to L4, respectively.

A wiring LA1 and a wiring LA2 which are connected to the buffer amplifier 300 are electrically connected to another bias generator, not to the bias generator 200B1. Different bias voltages are input to the wiring LA1 and the wiring LA2 in a manner similar to that of the wirings L1 to L4.

A method of inputting bias voltages is not limited to the method using two bias generators and may be a method using one bias generator. For example, bias voltages may be input to the wirings L1 to L4, the wiring LA1, and the wiring LA2 using the bias generator 200B4 in which the value of k is set to 3.

The buffer amplifier 300 includes transistors AT1 to AT20, a transistor AST1, and a transistor AST2.

The input terminal IN is electrically connected to gates of the transistors AT1 and AT3. A first terminal of the transistor AT1 is electrically connected to a first terminal of the transistor AT2 and a first terminal of the transistor AT5, and a second terminal of the transistor AT1 is electrically connected to a first terminal of the transistor AT13 and a first terminal of the transistor AT14. A first terminal of the transistor AT3 is electrically connected to a first terminal of the transistor AT4 and a first terminal of the transistor AT6, and a second terminal of the transistor AT3 is electrically connected to a first terminal of the transistor AT9 and a first terminal of the transistor AT10. A second terminal of the transistor AT5 is electrically connected to the wiring GNDL, and a gate of the transistor AT5 is electrically connected to the wiring L1. A second terminal of the transistor AT6 is electrically connected to the wiring VDDL, and a gate of the transistor AT6 is electrically connected to the wiring L4. A second terminal of the transistor AT2 is electrically connected to a first terminal of the transistor AT11 and a first terminal of the transistor AT12. A second terminal of the transistor AT4 is electrically connected to a first terminal of the transistor AT7 and a first terminal of the transistor AT8. A gate of the transistor AT2 and a gate of the transistor AT4 are electrically connected to the output terminal OUT.

A second terminal of the transistor AT7 is electrically connected to the wiring GNDL, a second terminal of the transistor AT9 is electrically connected to the wiring GNDL, a second terminal of the transistor AT11 is electrically connected to the wiring VDDL, and a second terminal of the transistor AT13 is electrically connected to the wiring VDDL. A gate of the transistor AT8 and a gate of the transistor AT10 are electrically connected to the wiring L2, and a gate of the transistor AT12 and a gate of the transistor AT14 are electrically connected to the wiring L3. A first terminal of the transistor AT15 is electrically connected to a first gate of the transistor AT17, a second terminal of the transistor AT8, a gate of the transistor AT7, and a gate of the transistor AT9. A second terminal of the transistor AT15 is electrically connected to a second terminal of the transistor AT17, a second terminal of the transistor AT12, a gate of the transistor AT11, and a gate of the transistor AT13. A gate of the transistor AT15 and a gate of the transistor AT16 are electrically connected to the wiring LA1, and a gate of the transistor AT17 and a gate of the transistor AT18 are electrically connected to the wiring LA2.

A second terminal of the transistor AT10 is electrically connected to a first terminal of the transistor AT16, a first terminal of the transistor AT18, a gate of the transistor AT19, and a first terminal of the transistor AST1. A second terminal of the transistor AT14 is electrically connected to a second terminal of the transistor AT16, a second terminal of the transistor AT18, a gate of the transistor AT20, and a first terminal of the transistor AST2. A gate of the transistor AST1 is electrically connected to the wiring STBYL, and a gate of the transistor AST2 is electrically connected to the wiring STBYL-B.

The buffer amplifier 300 illustrated in FIG. 12 can be in a standby state (temporarily stopped) when the display device displays a still image. To bringing the buffer amplifier 300 into a standby state (temporarily stop the buffer amplifier 300), the bias generator 200B1 supplies the low-level potentials to the wirings L1 and L2 and the high-level potentials to the wirings L3 and L4, and supplies the low-level potentials to the wiring LA1 and the high-level potentials to the wiring LA2. In particular, to apply predetermined potentials to the wirings L1 to L4, the wirings STBYL and STBYL-B are set to the high-level potential and the low-level potential, respectively, in the bias generator 200B1. At the same time, the high-level potential is applied to the gate of the transistor AST1 and the low-level potential is applied to the gate of the transistor AST2; accordingly, the high-level potential is applied to the gate of the transistor AT19 and the low-level potential is applied to the gate of the transistor AT20. Thus, the transistor AT19 and the transistor AT20 are turned off, so that no potential is output to the output terminal OUT. In addition, the transistor AST1 and the transistor AST2 are turned on, so that charges in the gates of the transistors AT19 and AT20 can be discharged.

Configuring such a bias generator and a buffer amplifier makes it possible to obtain a display device with reduced power consumption.

One embodiment of the present invention can be implemented in combination with any of the other embodiments in this specification as appropriate.

Embodiment 2

In this embodiment, a display device including a semiconductor device of one embodiment of the present invention is described with reference to FIGS. 13A and 13B, FIGS. 14A and 14B, FIGS. 15A and 15B, and FIGS. 16A and 16B.

Figure 13A:
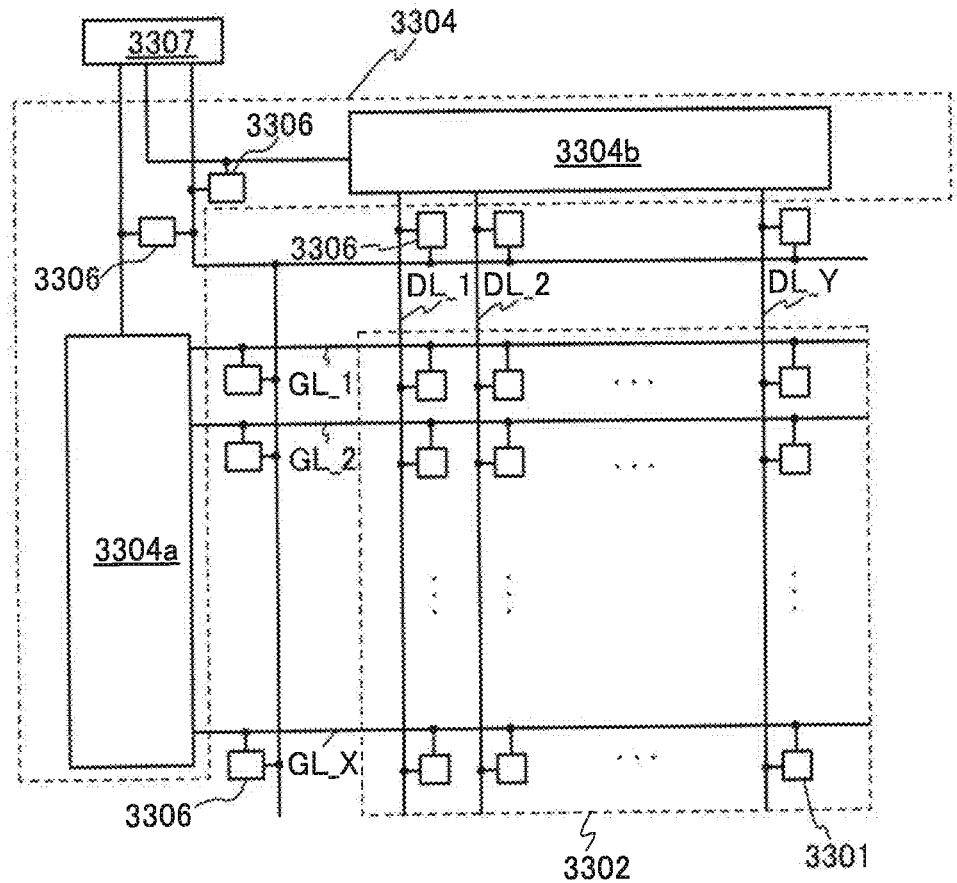
FIGS. 13A and 13B are circuit diagrams showing an example of a display device.
Figure 13B:
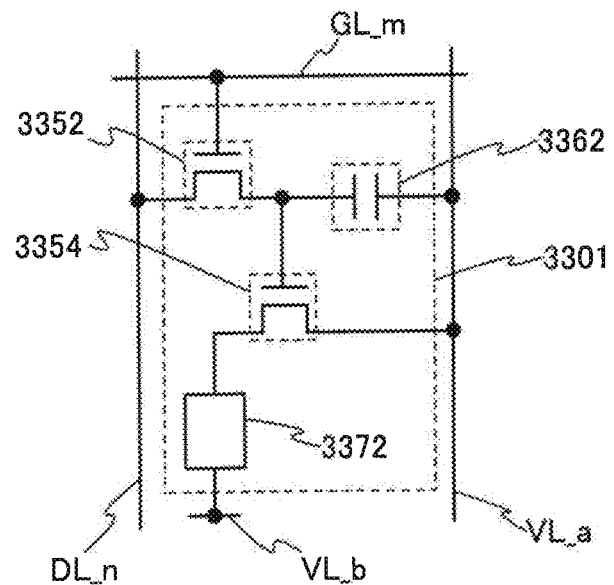

FIG. 13A is a block diagram illustrating an example of the display device of one embodiment of the present invention, and FIG. 13B is a circuit diagram illustrating an example of a pixel circuit of the display device of one embodiment of the present invention. Note that the display device of FIGS. 13A and 13B employs a light-emitting element such as an organic EL element.

<Description of Display Device>

The display device illustrated in FIG. 13A includes a region including pixels of display elements (hereinafter the region is referred to as a pixel portion 3302), a circuit portion being provided outside the pixel portion 3302 and including a circuit for driving the pixels (hereinafter the portion is referred to as a driver circuit portion 3304), circuits each having a function of protecting an element (hereinafter the circuits are referred to as protection circuits 3306), and a terminal portion 3307. Note that the protection circuits 3306 are not necessarily provided.

A part or the whole of the driver circuit portion 3304 is preferably formed over a substrate over which the pixel portion 3302 is formed. Thus, the number of components and the number of terminals can be reduced. When part or the whole of the driver circuit portion 3304 is not formed over the substrate over which the pixel portion 3302 is formed, the part or the whole of the driver circuit portion 3304 can be mounted by chip-on-glass (COG) or tape automated bonding (TAB).

The pixel portion 3302 includes circuits for driving a plurality of display elements arranged in X rows (X is a natural number of two or more) and Y columns (Y is a natural number of two or more) (hereinafter, such circuits are referred to as pixel circuits 3301). The driver circuit portion 3304 includes driver circuits such as a circuit for supplying a signal (scan signal) to select a pixel (hereinafter the circuit is referred to as a gate driver circuit 3304a) and a circuit for supplying a signal (data signal) to drive a display element in a pixel (hereinafter, the circuit is referred to as source driver circuit 3304b). Note that the source driver circuit 100 described in Embodiment 1 can be used as the source driver circuit 3304b. Thus, while the display device in FIG. 13A displays a still image, a buffer amplifier and a bias generator which are included in the source driver circuit 3304b can be in a standby state (temporarily stopped), reducing the power consumption of the display device.

The gate driver circuit 3304a includes a shift register or the like. The gate driver circuit 3304a receives a signal for driving the shift register via the terminal portion 3307 and outputs a signal. For example, the gate driver circuit 3304a receives a start pulse signal, a clock signal, or the like and outputs a pulse signal. The gate driver circuit 3304a has a function of controlling the potentials of wirings supplied with scan signals (hereinafter such wirings are referred to as scan lines GL_1 to GL_X Note that the scan lings GL_1, GL_2, and GL_X are illustrated in FIG. 13A, but the other scan lines are not illustrated. The scan lines GL_1 to GL_X are collectively referred to as scan lines GL in some cases). Note that a plurality of gate driver circuits 3304a may be provided to control the scan lines GL_1 to GL_X separately. Alternatively, the gate driver circuit 3304a has a function of supplying an initialization signal. Without being limited thereto, the gate driver circuit 3304a can supply another signal.

The source driver circuit 3304b includes a shift register or the like. The source driver circuit 3304b receives a signal (image signal) from which a data signal is derived, as well as a signal for driving the shift register, via the terminal portion 3307. The source driver circuit 3304b has a function of generating a data signal to be written to the pixel circuit 3301 on the basis of the image signal. In addition, the source driver circuit 3304b has a function of controlling output of a data signal in response to a pulse signal produced by input of a start pulse signal, a clock signal, or the like. The source driver circuit 3304b has a function of controlling the potentials of wirings supplied with data signals (hereinafter such wirings are referred to as data lines DL_1 to DL_Y. Note that the data lines DL_1, DL_2, and DL_Y are illustrated in FIG. 13A, but the other data lines are not illustrated. The data lines DL_1 to DL_Y are collectively referred to as data lines DL in some cases). Alternatively, the source driver circuit 3304b has, but is not limited to, a function of supplying an initialization signal. Without being limited thereto, the source driver circuit 3304b can supply another signal The source driver circuit 3304b is formed using a plurality of analog switches or the like, for example. The source driver circuit 3304b can output, as data signals, time-divided image signals obtained by sequentially turning on the plurality of analog switches. The source driver circuit 3304b may include a shift register or the like.

A pulse signal and a data signal are input to each of the plurality of pixel circuits 3301 through one of the plurality of scan lines GL supplied with scan signals and one of the plurality of data lines DL supplied with data signals, respectively. Writing and retaining of the data signal to and in each of the plurality of pixel circuits 3301 are controlled by the gate driver circuit 3304a. For example, to the pixel circuit 3301 in the mth row and the nth column (m is a natural number of less than or equal to X, and n is a natural number of less than or equal to Y), a pulse signal is input from the gate driver circuit 3304a through the scan line GL_m, and a data signal is input from the source driver circuit 3304b through the data line DL_n in accordance with the potential of the scan line GL_m.

The protection circuit 3306 illustrated in FIG. 13A is connected to, for example, the scan line GL between the gate driver circuit 3304a and the pixel circuit 3301. Alternatively, the protection circuit 3306 is connected to the data line DL between the source driver circuit 3304b and the pixel circuit 3301. Alternatively, the protection circuit 3306 can be connected to a wiring between the gate driver circuit 3304a and the terminal portion 3307. Alternatively, the protection circuit 3306 can be connected to a wiring between the source driver circuit 3304b and the terminal portion 3307. Note that the terminal portion 3307 refers to a portion having terminals for inputting power, control signals, and image signals to the display device from external circuits.

The protection circuit 3306 is a circuit that electrically connects a wiring connected to the protection circuit to another wiring when a potential out of a certain range is applied to the wiring connected to the protection circuit.

As illustrated in FIG. 13A, the protection circuits 3306 are provided for the pixel portion 3302 and the driver circuit portion 3304, so that the resistance of the display device to overcurrent generated by electrostatic discharge (ESD) or the like can be improved. Note that the configuration of the protection circuit 3306 is not limited to that, and for example, the protection circuit 3306 may be configured to be connected to the gate driver circuit 3304a or the protection circuit 3306 may be configured to be connected to the source driver circuit 3304b. Alternatively, the protection circuit 3306 may be configured to be connected to the terminal portion 3307.

In FIG. 13A, an example in which the driver circuit portion 3304 includes the gate driver circuit 3304a and the source driver circuit 3304b is shown; however, the structure is not limited thereto. For example, only the gate driver circuit 3304a may be formed and a separately prepared substrate where a source driver circuit is formed (e.g., a driver circuit substrate formed with a single crystal semiconductor film or a polycrystalline semiconductor film) may be mounted.

Structural Example of Pixel Circuit

Each of the plurality of pixel circuit 3301 in FIG. 13A can have a configuration shown in FIG. 13B, for example.

The pixel circuit 3301 shown in FIG. 13B includes a transistor 3352, a transistor 3354, a capacitor 3362, and a light-emitting element 3372.

One of a source electrode and a drain electrode of the transistor 3352 is electrically connected to a wiring through which a data signal is supplied (hereinafter referred to as a data line DL_n). A gate electrode of the transistor 3352 is electrically connected to a wiring to which a gate signal is supplied (hereinafter referred to as a scan line GL_m).

The transistor 3352 has a function of controlling whether to write a data signal.

One of a pair of electrodes of the capacitor 3362 is electrically connected to a wiring to which a potential is supplied (hereinafter referred to as a potential supply line VL_a), and the other is electrically connected to the other of the source electrode and the drain electrode of the transistor 3352.

The capacitor 3362 functions as a storage capacitor for storing written data.

One of a source electrode and a drain electrode of the transistor 3354 is electrically connected to the potential supply line VL_a. In addition, a gate electrode of the transistor 3354 is electrically connected to the other of the source electrode and the drain electrode of the transistor 3352.

One of an anode and a cathode of the light-emitting element 3372 is electrically connected to a potential supply line VL_b, and the other is electrically connected to the other of the source electrode and the drain electrode of the transistor 3354.

Note that a high power supply potential VDD is supplied to one of the potential supply line VL_a and the potential supply line VL_b, and a low power supply potential VSS is supplied to the other.

For example, in the display device including the pixel circuit 3301 shown in FIG. 13B, the pixel circuits 3301 are sequentially selected row by row by the gate driver circuit 3304a illustrated in FIG. 13A, whereby the transistors 3352 are turned on and a data signal is written.

When the transistors 3352 are turned off, the pixel circuits 3301 in which the data has been written are brought into a retention state. Furthermore, the amount of current flowing between the source electrode and the drain electrode of the transistor 3354 is controlled in accordance with the potential of the written data signal. The light-emitting element 3372 emits light with a luminance corresponding to the amount of flowing current. This operation is sequentially performed row by row; thus, an image is displayed.

It is preferable that an OS transistor which is to be described in Embodiment 7 be used as each of the transistors 3352 and 3354 shown in FIG. 13B. Since the OS transistor has features of favorable switching characteristics and an extremely small off-state current, leakage current flowing between the source and the drain of the transistor can be small. For example, the use of an OS transistor as the transistor 3352 can reduce leakage current of the transistor 3352, whereby the potential of the gate of the transistor 3354 and the potential of the other of the pair of electrodes of the capacitor 3362 can be retained for a long time. While a moving image with the same data signals for two or more frames, i.e., a still image is displayed, it is unnecessary to rewrite the potential of the gate of the transistor 3354 and the potential of the other of the pair of electrodes of the capacitor 3362. Therefore, supply of data signals to the pixel circuit 3301 can be stopped for a long time, reducing the power consumption of the display device.

The pixel circuit can have a function of compensating variation in threshold voltages or the like of a transistor. FIGS. 14A and 14B and FIGS. 15A and 15B illustrate examples of the pixel circuit.

Figure 14A:
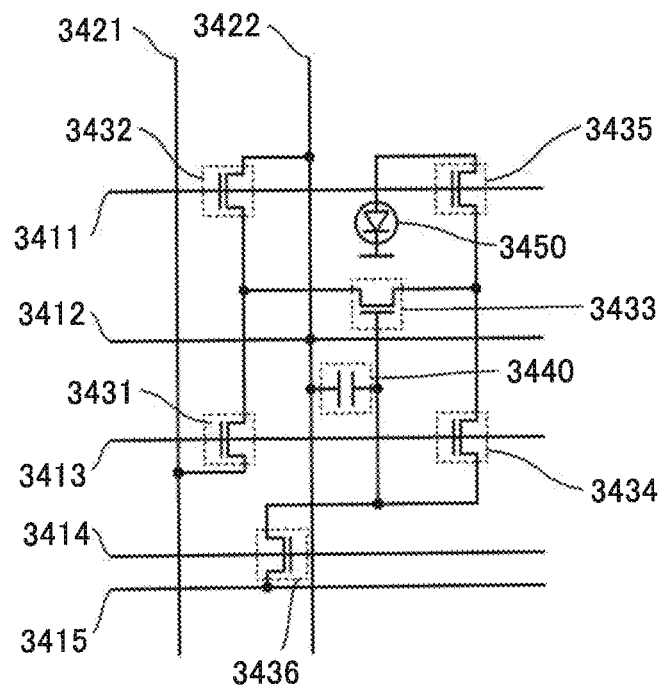
FIGS. 14A and 14B are circuit diagrams each showing an example of a display pixel.

A pixel circuit shown in FIG. 14A includes six transistors (transistors 3431, 3432, 3433, 3434, 3435, and 3436), a capacitor 3440, and a light-emitting element 3450. Wirings 3411, 3412, 3413, 3414, and 3415 and wirings 3421 and 3422 are electrically connected to the pixel circuit shown in FIG. 14A. Note that as the transistors 3431 to 3436, p-channel transistors can be used, for example.

Figure 14B:
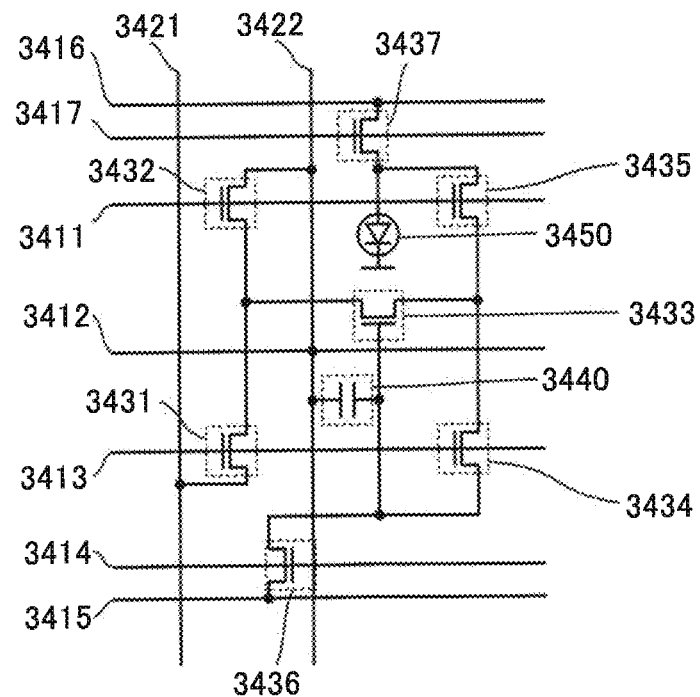

A pixel circuit shown in FIG. 14B has a configuration in which a transistor 3437 is added to the pixel circuit shown in FIG. 14A. Wirings 3416 and 3417 are electrically connected to the pixel circuit shown in FIG. 14B. The wirings 3415 and 3416 may be electrically connected to each other. Note that as the transistor 3437, a p-channel transistor can be used, for example.

Figure 15A:
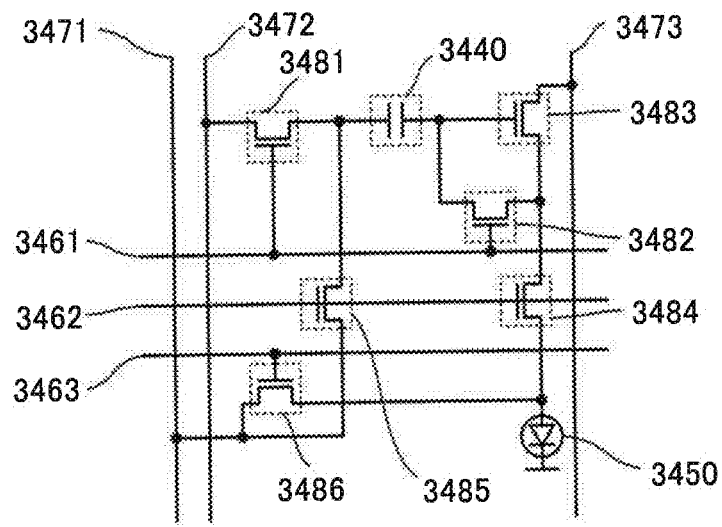
FIGS. 15A and 15B are circuit diagrams each showing an example of a display pixel.

A pixel circuit shown in FIG. 15A includes six transistors (transistors 3481, 3482, 3483, 3484, 3485, and 3486), the capacitor 3440, and the light-emitting element 3450. Wirings 3461, 3462, 3463, 3471, 3472, and 3473 are electrically connected to the pixel circuit shown in FIG. 15A. The wirings 3461 and 3463 may be electrically connected to each other. Note that as the transistor 3481 to 3486, p-channel transistors can be used for example.

Figure 15B:
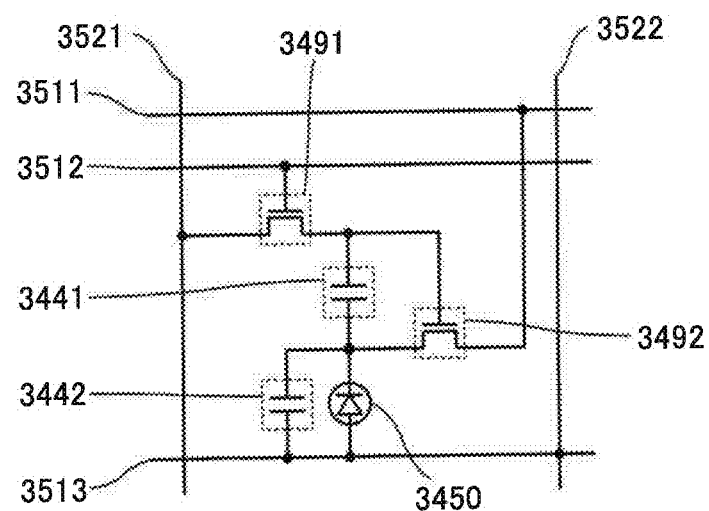

The pixel circuit illustrated in FIG. 15B includes two transistors (transistors 3491 and 3492), two capacitors (capacitors 3441 and 3442), and the light-emitting element 3450. Wirings 3511, 3512, 3513, 3521, and 3522 are electrically connected to the pixel circuit shown in FIG. 15B. With the configuration of the pixel circuit illustrated in FIG. 15B, the pixel circuit can be driven by a voltage inputting current driving method (also referred to as CVCC). Note that as the transistor 3491 and 3492, for example, p-channel transistors can be used.

A light-emitting element relating to one embodiment of the present invention can be used for an active matrix method in which an active element is included in a pixel of a display device or a passive matrix method in which an active element is not included in a pixel of a display device.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Alternatively, since the size of these elements is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

One embodiment of the present invention is not limited to the display devices including light-emitting elements shown in FIGS. 13A and 13B, FIGS. 14A and 14B, and FIGS. 15A and 15B. For example, a display device including a display element such as a liquid crystal element instead of a light-emitting element may be employed. An example of a display device using a liquid crystal display element is shown in FIGS. 16A and 16B.

Figure 16A:
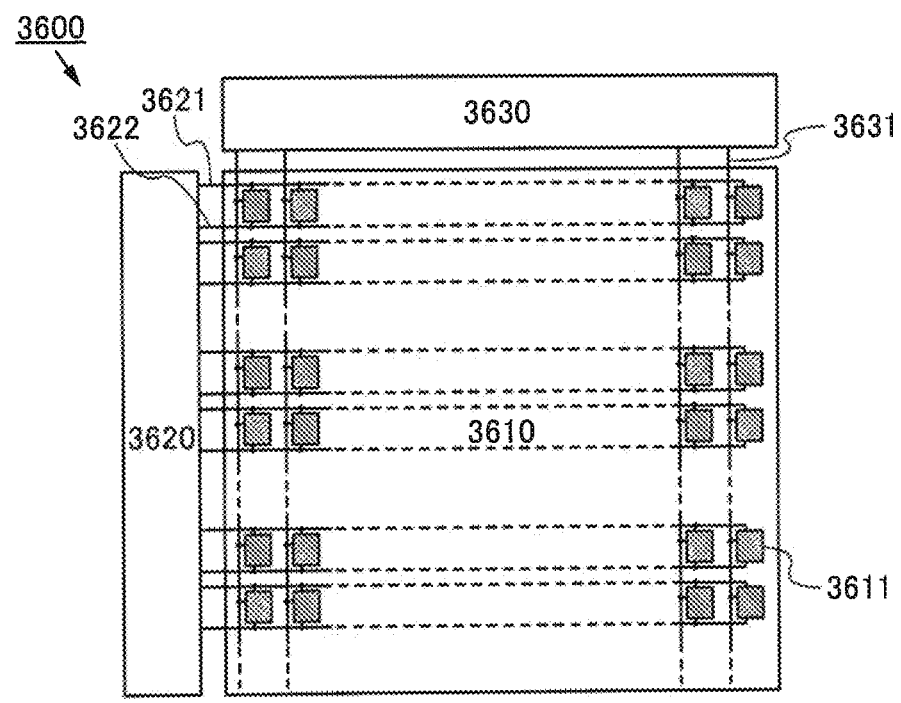
FIGS. 16A and 16B are a block diagram and a circuit diagram showing an example of a display device.

A liquid crystal display device 3600 shown in FIG. 16A includes a pixel portion 3610, a scan line driver circuit 3620, a signal line driver circuit 3630, m scan lines 3621 which are parallel or substantially parallel to each other and the potentials of which are controlled by the scan line driver circuit 3620, and n signal line 3631 which are parallel to or substantially parallel to each other and the potentials of which are controlled by the signal line driver circuit 3630. Variables m and n are each an integer of one or more. Furthermore, the pixel portion 3610 includes a plurality of pixels 3611 arranged in a matrix. Furthermore, capacitor wirings 3622 arranged parallel or substantially to each other are provided along the scan lines 3621. The scan line driver circuit 3620 and the signal line driver circuit 3630 are collectively referred to as a driver circuit portion in some cases. The source driver circuit 100 described in Embodiment 1 can be used as the signal line driver circuit 3630. Thus, while the display device in FIG. 13A displays a still image, a buffer amplifier and a bias generator which are included in the signal line driver circuit 3630 can be in a standby state (temporarily stopped), reducing the power consumption of the display device.

Each scan line 3621 is electrically connected to n pixels 3611 in the corresponding row among the pixels 3611 arranged in m rows and n columns in the pixel portion 3610. Each signal line 3631 is electrically connected to m pixels 3611 in the corresponding column among the pixels 3611 arranged in m rows and n columns. Each capacitor wiring 3622 is electrically connected to the n pixels 3611 in the corresponding row among the pixels 3611 arranged in m rows and n columns.

Figure 16B:
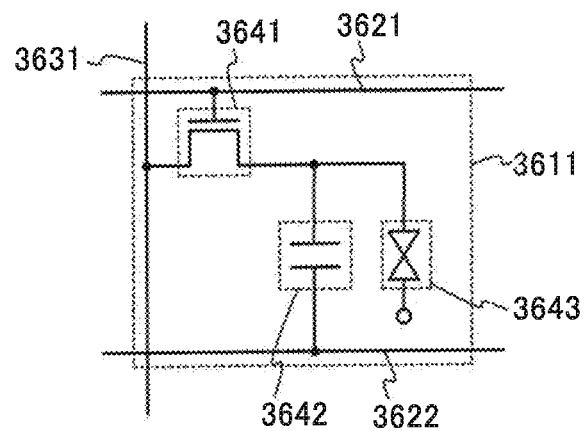

FIG. 16B illustrates an example of a circuit configuration that can be used for the pixel 3611 in the liquid crystal display device 3600 shown in FIG. 16A.

The pixel 3611 shown in FIG. 16B includes a liquid crystal element 3643, a transistor 3641, and a capacitor 3642.

One of a pair of electrodes of the liquid crystal element 3643 is connected to the transistor 3641, and the potential of the electrode is set as appropriate in accordance with the specifications of the pixel 3611. The other of the electrodes of the liquid crystal element 3643 is connected to a common line (not illustrated) and a common potential is applied thereto. The alignment state of liquid crystals in the liquid crystal element 3643 is controlled in accordance with data written to the transistor 3641.

Note that the liquid crystal element 3643 is an element that controls transmission or non-transmission of light by utilizing an optical modulation action of liquid crystal. The optical modulation action of liquid crystal is controlled by an electric field applied to the liquid crystal (including a lateral electric field, a vertical electric field, and a diagonal electric field). As the liquid crystals used for the liquid crystal element 3643, thermotropic liquid crystals, low-molecular liquid crystals, high-molecular liquid crystals, polymer dispersed liquid crystals, ferroelectric liquid crystals, or anti-ferroelectric liquid crystals can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As a driving method of the liquid crystal display device 3600 including the liquid crystal element 3643, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Examples of a method for driving the liquid crystal display device 3600 including the liquid crystal element 3643 include the vertical alignment modes such as a multi-domain vertical alignment (MVA) mode, a patterned vertical alignment (PVA) mode, and an advanced super view (ASV) mode.

In the pixel 3611 illustrated in FIG. 16B, one of a source electrode and a drain electrode of the transistor 3641 is electrically connected to the signal line 3631, and the other of the source electrode and the drain electrode of the transistor 3641 is electrically connected to the one of the pair of electrodes of the liquid crystal element 3643. A gate electrode of the transistor 3641 is electrically connected to the scan line 3621. The transistor 3641 has a function of controlling whether to write a data signal.

In the pixel 3611 in FIG. 16B, one of a pair of electrodes of the capacitor 3642 is connected to the other of the source electrode and the drain electrode of the transistor 3641. The other of the electrodes of the capacitor 3642 is electrically connected to the capacitor wiring 3622. The potential of the capacitor wiring 3622 is set as appropriate in accordance with the specifications of the pixel 3611. The capacitor 3642 functions as a storage capacitor for storing written data.

The structure described in this embodiment can be used in appropriate combination with the structure described in any of the other embodiments.

Embodiment 3

In this embodiment, a display device attached with a touch sensor in which the source driver circuit 100 described in Embodiment 1 and a driver circuit for the touch sensor are formed in one IC is described.

Figure 17:
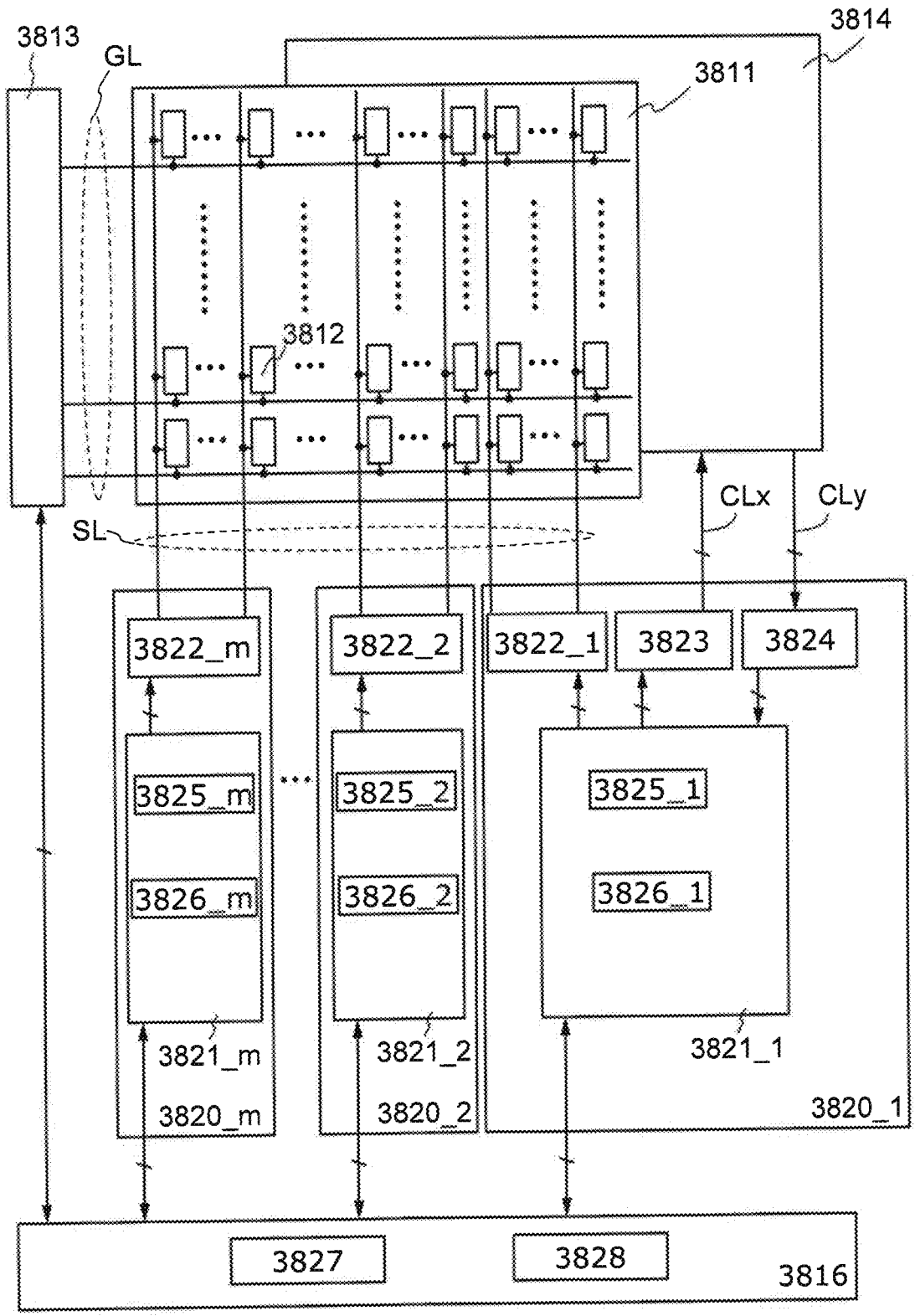
FIG. 17 is a block diagram showing an example of a semiconductor device.

FIG. 17 is a circuit block diagram showing a configuration example of a display device 3800 of one embodiment of the present invention. The display device 3800 includes a display portion 3811, a touch sensor 3814, a scan line driver circuit 3813, ICs 3820_1 to 3820_*m* (m is an integer of two or more), and a host 3816.
<Display Portion>

The display portion 3811 includes a plurality of pixels 3812 arranged in a matrix, a plurality of scan lines GL, and a plurality of signal lines SL, and has a function of displaying an image.

The display portion 3811 can display an image by control of emission/non-emission of the pixels 3812. It is possible to use liquid crystal elements in the pixels 3812, for example. The pixels 3812 each can include, in addition to them, at least one of an electroluminescence (EL) element (an EL element including an organic substance and an inorganic substance, an organic EL element, and an inorganic EL element), an LED chip (e.g., a white LED chip, a red LED chip, a green LED chip, or a blue LED chip), a transistor (a transistor that emits light depending on current), an electron emitter, a display element including a carbon nanotube, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display portion), quantum dots, and the like.

The number of pixels of the display portion 3811 is preferably extremely large, e.g., HD (number of pixels: 1280×720), FHD (number of pixels: 1920×1080), WQHD (number of pixels: 2560×1440), WQXGA (number of pixels: 2560×1600), 4K, or 8K. In particular, the number of pixels of 4K, 8K, or higher is preferable. The pixel density (definition) of the pixels in the display portion 3811 is higher than or equal to 300 ppi, preferably higher than or equal to 500 ppi, further preferably higher than or equal to 800 ppi, further preferably higher than or equal to 1000 ppi, further preferably higher than or equal to 1200 ppi. The display portion 3811 with such a large number of pixels and high definition enables an increase in a realistic sensation, sense of depth, and the like in personal use such as portable use and home use.
<Scan Line Driver Circuit>

The scan line driver circuit 3813 is electrically connected to the pixels 3812 via the scan lines GL. The scan line driver circuit 3813 has a function of outputting scan signals to the scan lines GL. The scan line driver circuit 3813 is referred to as a gate driver in some cases.
<IC>

The IC 3820 preferably consists of m IC chips (IC chips are also referred to as ICs), i.e., the ICs 3820_1 to 3820_*m*. Each IC is preferably mounted on the substrate by a chip-on-glass (COG) method.

A case where the IC 3820 consists of one IC is assumed, for example. As the resolution of the display portion 3811 becomes higher, e.g., 4K or 8K, an area occupied by the IC is increased. A large-area IC is difficult to manufacture and requires high price. When an IC is crimped to a substrate by a COG method, the pressure for each terminal of the IC needs to be optimal. In the case where the display portion 3811 has a large number of pixels like 4K or 8K, the number of terminals of the IC is also increased significantly, and accordingly, a load for the entire IC in the crimp is also increased. As a result, a crack or the like occurs in the IC, and thus, the IC is difficult to mount. In the case where the IC 3820 is formed using a plurality of ICs, a load for each IC is small, and thus, the IC is easily mounted.

The IC 3820_1 includes a circuit 3821_1, a signal line driver circuit 3822_1, a touch sensor driver circuit 3823, and a touch sensor detection circuit 3824. The IC 3820_*m* includes a circuit 3821_*m* and a signal line driver circuit 3822_*m*. In the following description, the ICs 3820_1 to 3820_*m* are collectively referred to as an IC 3820 and the signal line driver circuits 3822_1 to 3822_*m* are collectively referred to as a signal line driver circuit 3822 in some cases. In the IC 3820 in FIG. 17, only the ICs 3820_1, 3820_2, and 3820_*m* are illustrated and the other ICs 3820 are not illustrated. In the signal line driver circuit 3822 in FIG. 17, only the signal line driver circuits 3822_1, 3822_2, and 3822_*m* are illustrated and the other signal line driver circuits 3822 are not illustrated.

Note that the ICs 3820 may be mounted by a chip on film (COF) method, a tape automated bonding (TAB) method, or the like.

<<Signal Line Driver Circuit>>

The signal line driver circuit 3822 has a function of outputting image signals (also referred to as video signals) to the display portion 3811. The signal line driver circuit 3822 is electrically connected to the pixels 3812 through the signal lines SL. The signal line driver circuit 3822 has a function of outputting image signals which are analog signals to the pixels 3812 of the display portion 3811 via the signal lines SL. For example, the signal line driver circuit 3822 can include a shift register circuit and a buffer circuit in combination. The display device 3800 may include a demultiplexer circuit connected to the signal lines SL. The signal line driver circuit 3822 is referred to as a source driver in some cases. The source driver circuit 100 described in Embodiment 1 can be used as the signal line driver circuit 3822. Thus, while the display device 3800 displays a still image, a buffer amplifier and a bias generator which are included in the signal line driver circuit 3822 can be in a standby state (temporarily stopped), reducing the power consumption of the display device.

<<Touch Sensor Driver Circuit>>

The touch sensor driver circuit 3823 is electrically connected to the touch sensor 3814 via a wiring CLx. The touch sensor driver circuit 3823 has a function of outputting a signal for driving a sensor element in the touch sensor 3814. As the touch sensor driver circuit 3823, a shift register circuit and a buffer circuit can be used in combination, for example.

<<Touch Sensor Detection Circuit>>

The touch sensor detection circuit 3824 is electrically connected to the touch sensor 3814 via a wiring CLy. The touch sensor detection circuit 3824 has a function of outputting an output signal from a sensor element in the touch sensor 3814 to the circuit 3821_1. The touch sensor detection circuit 3824 can include an amplifier circuit and an analog-to-digital converter (ADC), for example. The touch sensor detection circuit 3824 converts an analog signal output from the touch sensor 3814 into a digital signal and outputs the digital signal to the circuit 3821_1.

In FIG. 17, the IC 3820_1 is connected to the pixel 3812 at an end of the display portion 3811; however, one embodiment of the present invention is not limited thereto. The IC 3820_1 may be connected to the pixel 3812 in the center portion or another portion of the display portion 3811.

<<Image Processing Circuit, RAM>>

The circuit 3821_1 includes an image processing circuit 3825_1 and a RAM 3826_1. Similarly, the circuit 3821_*m* includes an image processing circuit 3825_*m* and a RAM 3826_*m*. In the following description, the circuits 3821_1 to 3821_*m* are collectively referred to as a circuit 3821, the processing circuits 3825_1 to 3825_*m* are collectively referred to as an image processing circuit 3825, and the RAMs 3826_1 to 3826_*m* are collectively referred to as a RAM 3826 in some cases. In the circuit 3821 in FIG. 17, only the circuits 38211, 38212, and 3821_*m* are illustrated and the other circuits 3821 are not illustrated. In the image processing circuit 3825 in FIG. 17, only the image processing circuits 3825_1, 3825_2, and 3825_*m* are illustrated, the other image processing circuits 3825 are not illustrated. In the RAM 3826 in FIG. 17, only the RAMs 3826_1, 3826_2, and 3826_*m* are illustrated, the other RAMs 3826 are not illustrated.

The image processing circuit 3825 has a function of generating an image signal in response to an instruction from the host 3816. Furthermore, the image processing circuit 3825 has a function of performing signal processing on an image signal in accordance with the specifications of the display portion 3811, converting the signal into an analog image signal, and supplying the analog image signal to the signal line driver circuit 3822. The image processing circuit 3825_1 has a function of generating a driver signal to be output to the touch sensor driver circuit 3823, in response to an instruction from the host 3816. In addition, the image processing circuit 3825_1 has a function of analyzing a signal input from the touch sensor detection circuit 3824 and outputting the signal as positional data to the host 3816.

The RAM 3826 has a function of retaining data needed for processing in the image processing circuit 3825.

The image processing circuit 3825 can have a processor, for example. A microprocessor such as a digital signal processor (DSP) or a graphics processing unit (GPU) can be used, for example. Furthermore, such a microprocessor may be obtained with a programmable logic device (PLD) such as a field programmable gate array (FPGA) or a field programmable analog array (FPAA). The image processing circuit 3825 interprets and executes instructions from various programs with the processor to process various kinds of data and control programs.

<Host>

The host 3816 includes a CPU 3827 and a timing controller 3828. In this specification, the host 3816 is referred to as an external circuit in some cases.

<<Timing Controller>>

To the timing controller 3828, a variety of synchronization signals which determine timing of updating the display portion 3811 are input. Examples of the synchronization signals include a horizontal synchronization signal, a vertical synchronization signal, and a reference clock signal. The timing controller 3828 generates control signals for the scan line driver circuit 3813, the signal line driver circuit 3822, and the touch sensor driver circuit 3823 on the basis of these signals. Furthermore, the timing controller 3828 may have a function of generating a signal for determining timing when the touch sensor detection circuit 3824 outputs a signal. Here, the timing controller 3828 preferably outputs a signal synchronized with the signal output to the scan line driver circuit 3813 and a signal synchronized with the signal output to the touch sensor driver circuit 3823. In particular, it is preferable that a period in which data in the display portion 3811 is rewritten and a period in which sensing is performed with the touch sensor 3814 be separately provided. For example, the display device 3800 can be driven by dividing one frame period into a period in which data in the display portion 3811 is rewritten and a period in which sensing is performed. Furthermore, detection sensitivity and detection accuracy can be increased, for example, by providing two or more sensing periods in one frame period.

<<CPU>>

The CPU 3827 has a function of executing an instruction and controlling the display device 3800 as a whole. The CPU 3827 executes an instruction input from the outside and an instruction stored in an internal memory. The CPU 3827 generates signals for controlling the timing controller 3828 and the image processing circuit 3825.

When the timing controller 3828 is included in the host 3816, the IC 3820 does not necessarily include a timing controller. Accordingly, the area occupied by the IC can be reduced. In addition, the price of the IC can be reduced. Furthermore, one timing controller can control of the timing of a plurality of ICs. The above configuration is preferable for the display device 3800 including a plurality of ICs.

<Touch Sensor>

The touch sensor 3814 includes a plurality of sensor elements which sense the contact or approach of an object to the display device 3800. As the touch sensor 3814, a capacitive touch sensor can be used, for example. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive type is preferable because multiple points can be sensed simultaneously.

Note that one embodiment of the present invention is not limited thereto, and any of various sensors that can sense the approach or contact of an object such as a finger or a stylus can be used as the touch sensor 3814. For the touch sensor, in addition to a capacitive type, a variety of types such as a resistive type, a surface acoustic wave type, an infrared type, and an optical type can be used, for example.

<<Example of Touch Sensor>>

Figure 18A:
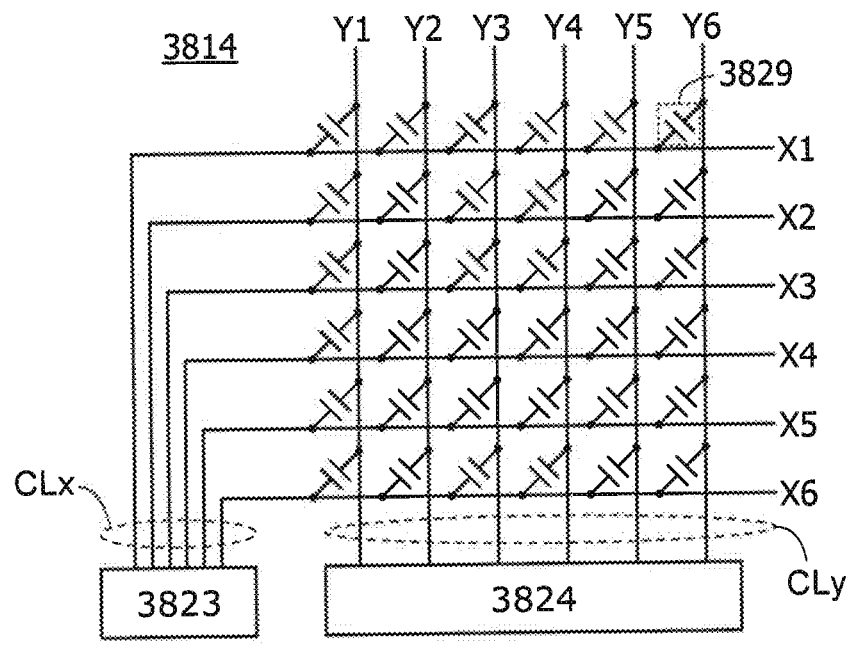
FIGS. 18A and 18B are a circuit diagram and a timing chart illustrating an example of a touch sensor.

FIG. 18A is a block diagram illustrating a structure example where the touch sensor 3814 is a mutual capacitive touch sensor. In FIG. 18A, as an example, six wirings X1 to X6 represent the wiring CLx to which a pulse voltage is applied, and six wirings Y1 to Y6 represent the wiring CLy which senses changes in current. The number of wirings is not limited to those illustrated in this example. FIG. 18A also illustrates capacitors 3829 each of which is formed with the wiring CLx and the wiring CLy overlapping with each other or being provided close to each other.

The touch sensor driver circuit 3823 is, for example, a circuit for sequentially applying a pulse voltage to the wirings X1 to X6. By applying a pulse voltage to the wirings X1 to X6, an electric field is generated between the wirings CLx and the wirings CLy of the capacitors 3829. With a pulse voltage, a current flows through the capacitors 3829. The electric field generated between the electrodes is changed by being blocked by the touch of a finger or a stylus. That is, for example, by touch with a finger or a stylus, the capacitance of the capacitor 3829 is changed. By utilizing the change in capacitance caused by touch with a finger or a stylus as described above, the approach or contact of an object can be sensed.

The touch sensor detection circuit 3824 is a circuit for sensing changes in current flowing through the wirings Y1 to Y6 that are caused by the changes in capacitance of the capacitors 3829. No change in the current values of the wirings Y1 to Y6 is sensed when there is no approach or contact of an object, whereas a decrease in the current value is sensed when capacitance is decreased owing to the approach or contact of an object. In order to sense a change in current, the total amount of current may be sensed. In that case, an integrator circuit or the like may be used to sense the total amount of current. Alternatively, the peak value of current may be detected. In that case, current may be converted into voltage, and the peak value of voltage may be sensed.

Figure 18B:
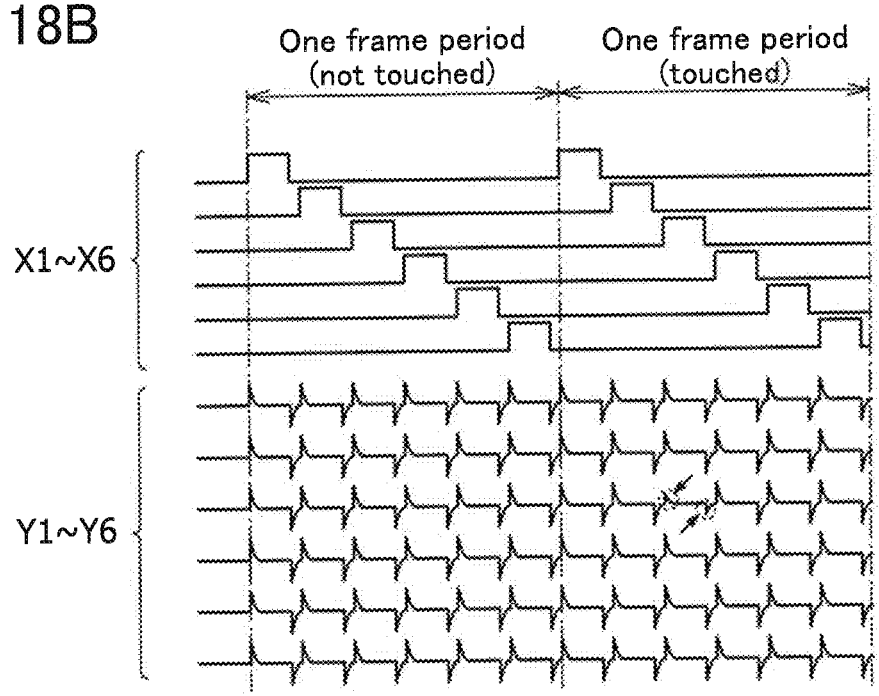

FIG. 18B is a timing chart showing input and output waveforms in the touch sensor 3814 illustrated in FIG. 18A. In FIG. 18B, detection of an object is performed in all the rows and columns in one frame period. FIG. 18B illustrates a period in which no object is detected (without touch) and a period in which an object is detected (with touch). Sensed current values of the wirings Y1 to Y6 are shown as the waveforms of voltage values. The timing of the display operation in the display portion 3811 is preferably in synchronization with the timing of the input and output waveforms of the touch sensor 3814. FIG. 18B shows an example in which these timings are not in synchronization to simplify the description.

A pulse voltage is sequentially applied to the wirings X1 to X6, and the waveforms of the wirings Y1 to Y6 change in accordance with the pulse voltage. When there is no proximity or contact of an object, the waveforms of the wirings Y1 to Y6 change uniformly in accordance with changes in the voltages of the wirings X1 to X6. The current value is decreased at the point of proximity or touch of a sensing target and accordingly the waveform of the voltage value also changes.

By detecting a change in capacitance in this manner, proximity or touch of a sensing target can be sensed. Even when an object such as a finger or a stylus does not touch but only approaches a touch sensor or a display device, a signal may be sensed in some cases.

Although FIG. 18A is a passive matrix touch sensor in which only the capacitor 3829 is provided at the intersection of wirings as a touch sensor, an active matrix touch sensor including a transistor and a capacitor may be used.

The structure described in this embodiment can be used in appropriate combination with the structure described in any of the other embodiments.

Embodiment 4

In this embodiment, an application example of the semiconductor device described in the foregoing embodiments to a display panel, an application example of the display panel to a display module, an application example of the display module, and an application example of the display module to an electronic device are described with reference to FIGS. 19A and 19B, FIGS. 20A and 20B, and FIG. 21.

<Examples of Mounting Semiconductor Device on Display Panel>

Examples in which a semiconductor device functioning as a source driver IC is used in a display panel are described with reference to FIGS. 19A and 19B.

Figure 19A:
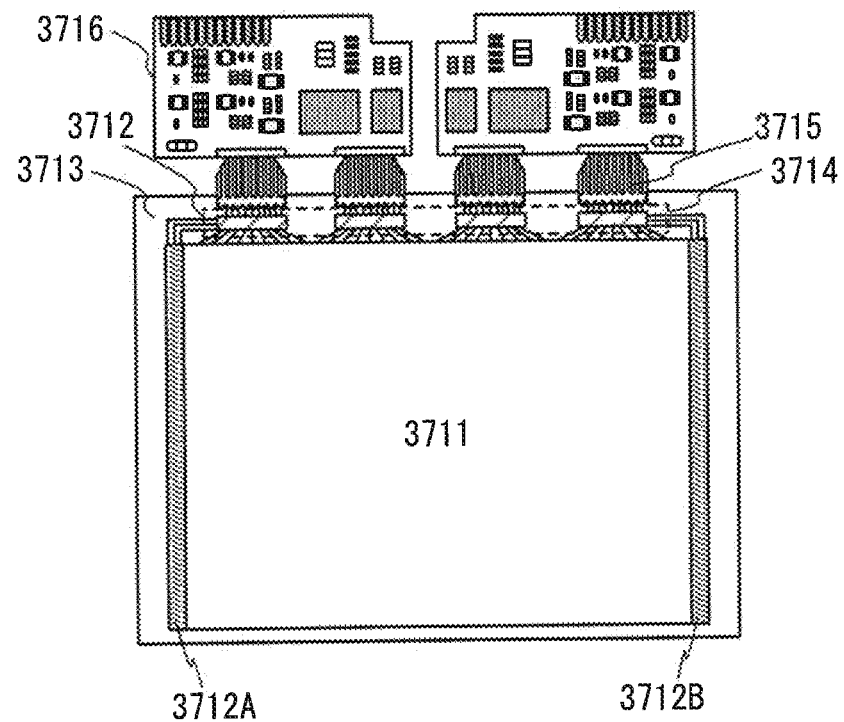
FIGS. 19A and 19B each illustrate an example of a display device.

FIG. 19A illustrates an example where a source driver 3712 and gate drivers 3712A and 3712B are provided around a display portion 3711 of the display panel and a source driver IC 3714 including the semiconductor device is mounted on a substrate 3713 as the source driver 3712.

The source driver IC 3714 is mounted on the substrate 3713 using an anisotropic conductive adhesive and an anisotropic conductive film.

The source driver IC 3714 is connected to an external circuit board 3716 via an FPC 3715.

Figure 19B:
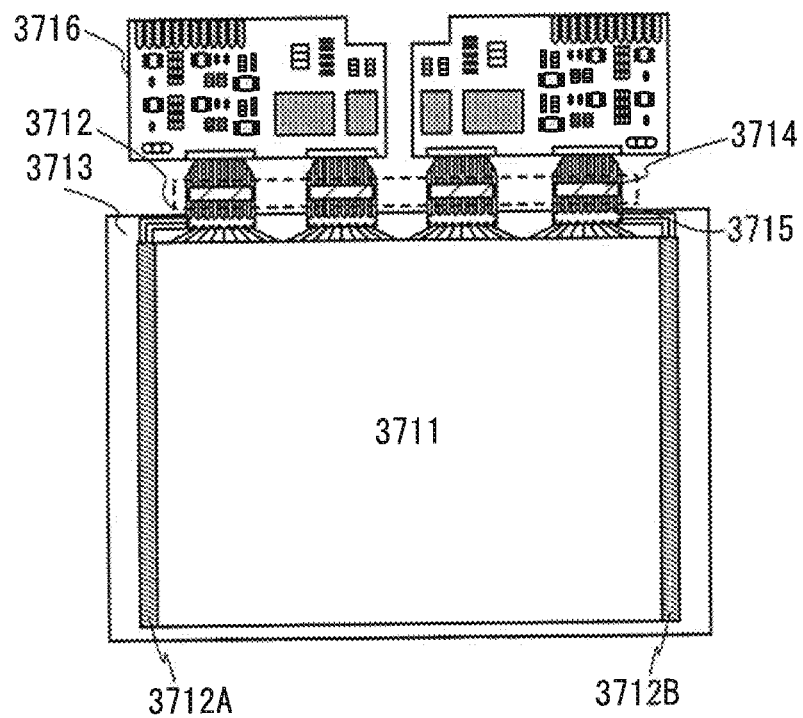

FIG. 19B illustrates an example where the source driver 3712 and the gate drivers 3712A and 3712B are provided around the display portion 3711, and the source driver IC 3714 is mounted on the FPC 3715 as the source driver 3712.

Mounting the source driver IC 3714 on the FPC 3715 allows a larger display portion 3711 to be provided over the substrate 3713, resulting in a narrower frame.

One embodiment of the present invention is not limited to FIGS. 19A and 19B. Touch sensors may be mounted on the display panels of FIGS. 19A and 19B. In other words, the structure of the display device 3800 described in Embodiment 3 may be employed.

Figure 20A:
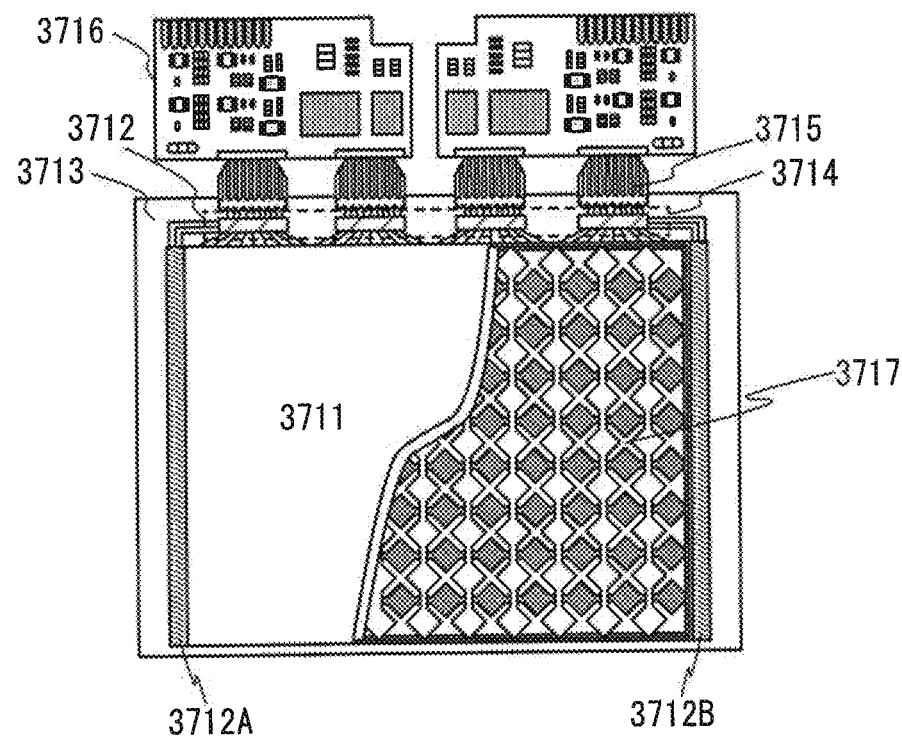
FIGS. 20A and 20B each illustrate an example of a display device.
Figure 20B:
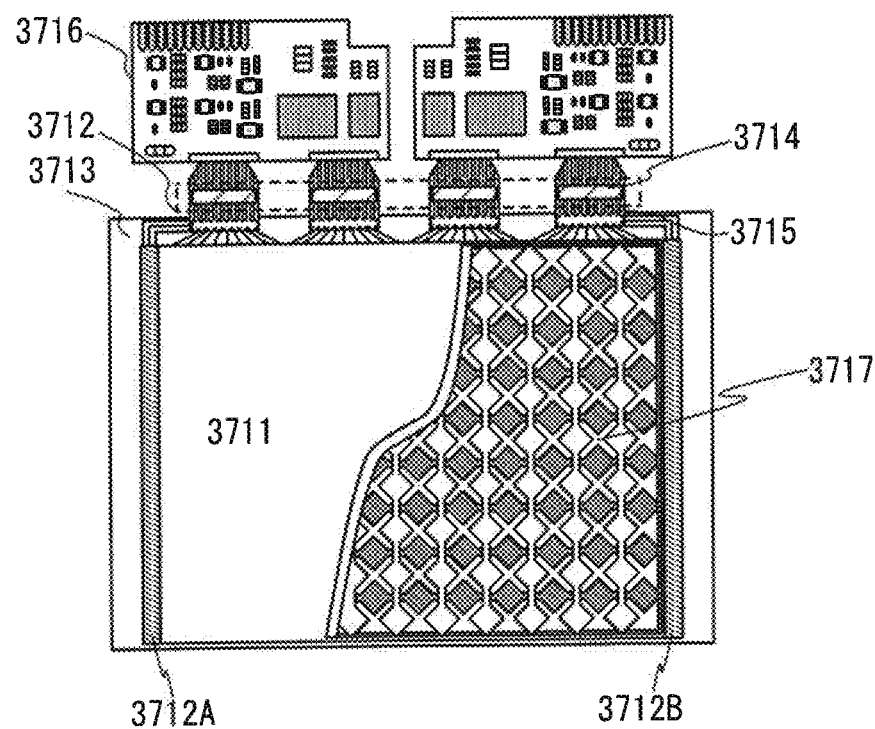

FIGS. 20A and 20B illustrate display panels obtained by mounting touch sensors on the display panels of FIGS. 19A and 19B. The display device of FIG. 20A has a structure which is obtained mounting a touch sensor on the display panel of FIG. 19A and in which an input portion 3717 of the touch sensor is attached on a display surface side of a display portion 3711. The display device of FIG. 20B has a structure obtained by mounting a touch sensor on the display panel of FIG. 19B and in which the input portion 3717 of the touch sensor is attached on a display surface side of the display portion 3711. Note that some of the input portion 3717 are not illustrated in FIGS. 20A and 20B. Thus, the input portion 3717 also exists even in a region in which the input portion 3717 on the display surface side of the display portion 3711 is not illustrated.

Note that the source driver IC 3714 included in each of the display panels of FIGS. 20A and 20B may be the ICs 3820_1 to 3830_$m$ described in Embodiment 3. Such a structure makes it possible to integrate the source driver and the driver circuit for the touch sensor into one IC; as a result, in the display panels of FIGS. 20A and 20B, the touch sensor can functions as an interface.

Application Example of Display Module

Next, an application example of a display module using the display panel illustrated in FIG. 19A or FIG. 19B is described with reference to FIG. 21.

Figure 21:
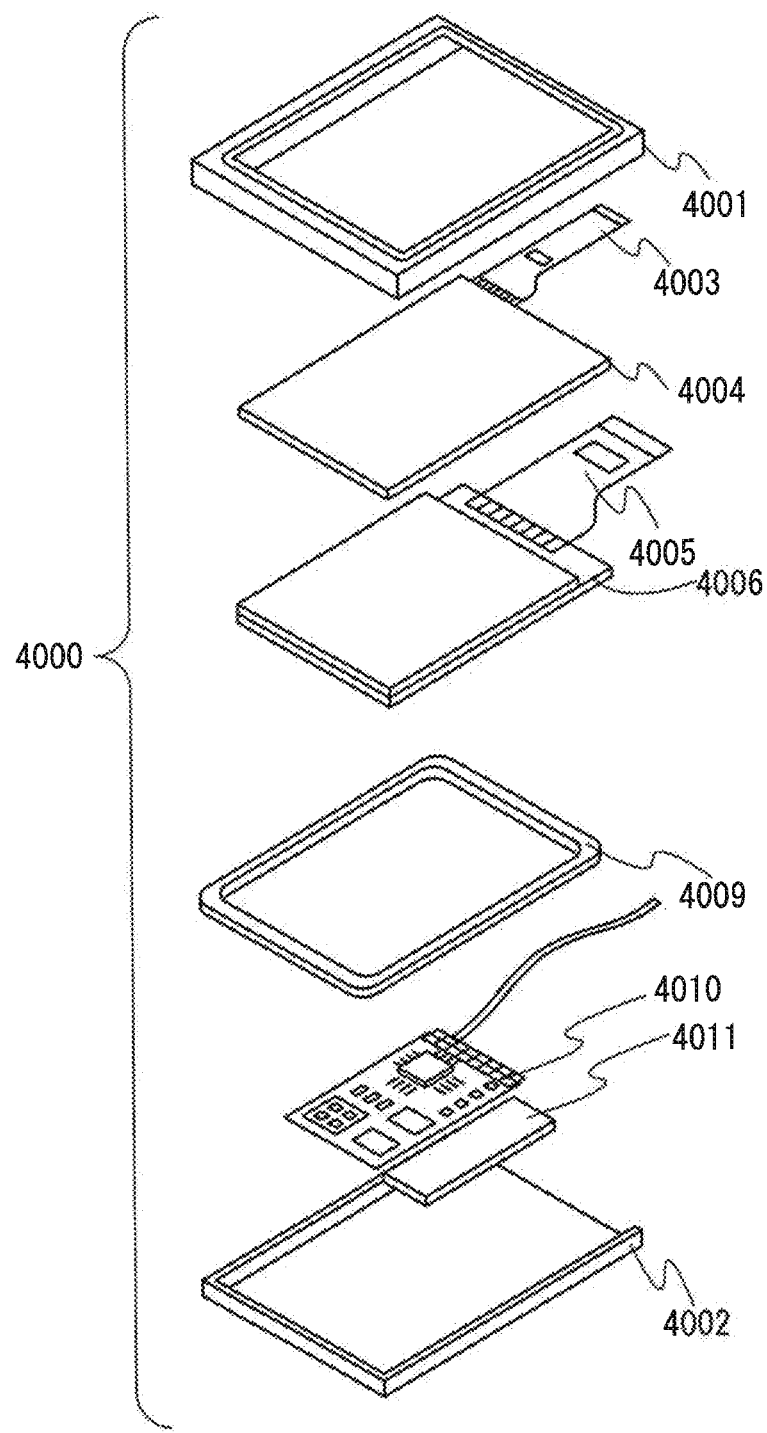
FIG. 21 is a perspective view illustrating an example of a display module.

In a display module 4000 illustrated in FIG. 21, a touch panel 4004 connected to an FPC 4003, a display panel 4006 connected to an FPC 4005, a frame 4009, a printed board 4010, and a battery 4011 are provided between an upper cover 4001 and a lower cover 4002. Note that the battery 4011, the touch panel 4004, and the like are not provided in some cases.

Any of the display panels illustrated in FIGS. 19A and 19B and FIGS. 20A and 20B can be used as the display panel 4006 in FIG. 21.

The shapes and/or sizes of the upper cover 4001 and the lower cover 4002 can be changed as appropriate in accordance with the sizes of the touch panel 4004 and the display panel 4006.

The touch panel 4004 can be a resistive touch panel or a capacitive touch panel and may be formed so as to overlap with the display panel 4006. A counter substrate (sealing substrate) of the display panel 4006 can have a touch panel function. Alternatively, a photosensor may be provided in each pixel of the display panel 4006 so that an optical touch panel is obtained. Further alternatively, an electrode for a touch sensor may be provided in each pixel of the display panel 4006 so that a capacitive touch panel is obtained. In such cases, the touch panel 4004 can be omitted.

The frame 4009 protects the display panel 4006 and also functions as an electromagnetic shield for blocking electromagnetic waves generated by the operation of the printed board 4010. The frame 4009 may function as a radiator plate.

The printed board 4010 is provided with a power supply circuit and a signal processing circuit for outputting a video signal and a clock signal. As a power source for supplying power to the power supply circuit, an external commercial power source or the battery 4011 provided separately may be used. The battery 4011 can be omitted in the case of using a commercial power source.

The display module 4000 can be additionally provided with a member such as a polarizing plate, a retardation plate, or a prism sheet.

Note that this embodiment can be combined with any of the other embodiments in this specification as appropriate.

Embodiment 5

Here, display devices (also referred to as electronic devices in some cases) including the semiconductor device of one embodiment of the present invention are described.

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Other examples of electronic devices that can include the semiconductor device of one embodiment of the present invention include mobile phones, game machines (including portable game machines), portable information terminals, e-book readers, cameras such as video cameras and digital still cameras, goggle-type displays (head mounted displays), navigation systems, copiers, facsimiles, multifunction printers, automated teller machines (ATM), vending machines, and medical devices. FIGS. 22A to 22F illustrate specific examples of these electronic devices.

Figure 22A:
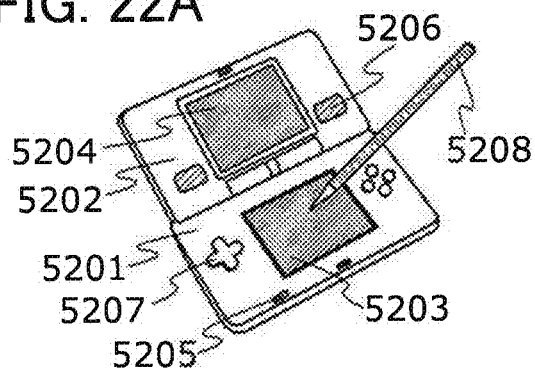
FIGS. 22A to 22H are perspective views each illustrating an example of an electronic device.

FIG. 22A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 22A has the two display portions 5203 and 5204, the number of display portions included in a portable game machine is not limited to this.

Figure 22B:
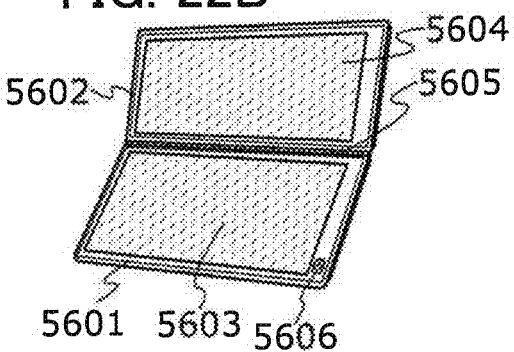

FIG. 22B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 22C:
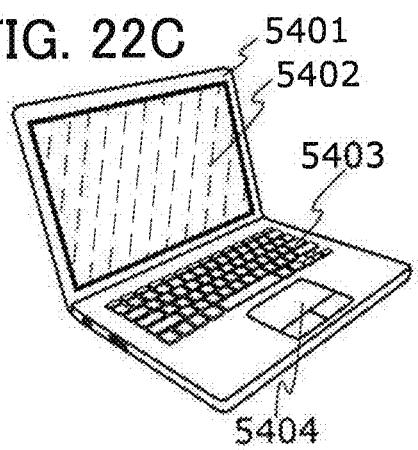

FIG. 22C illustrates a laptop including a housing 5401, a display portion 5402, a keyboard 5403, a pointing device 5404, and the like. The semiconductor device of one embodiment of the present invention can be used for a variety of integrated circuits included in laptops.

Figure 22D:
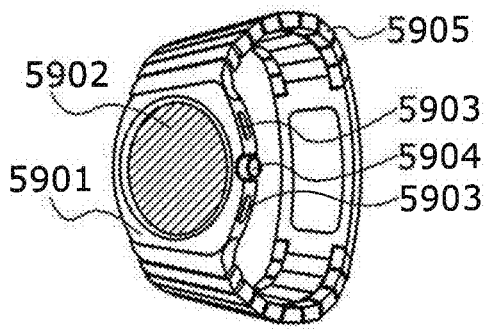

FIG. 22D is a smart watch which is one of wearable terminals. The smart watch includes a housing 5901, a display portion 5902, operation buttons 5903, an operator 5904, a band 5905, and the like. The semiconductor device of one embodiment of the present invention can be used for a variety of integrated circuits included in smart watches. A display device with a position input function may be used as a display portion 5902. Note that the position input function can be added by provision of a touch panel in a display device. Alternatively, the position input function can be added by providing a photoelectric conversion element called a photosensor in a pixel area of a display device. As the operation buttons 5903, any one of a power switch for starting the smart watch, a button for operating an application of the smart watch, a volume control button, a switch for turning on or off the display portion 5902, and the like can be used. Although the smart watch in FIG. 22D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 22D includes the operator 5904, one embodiment of the present invention is not limited thereto and the operator 5904 is not necessarily provided.

Figure 22E:
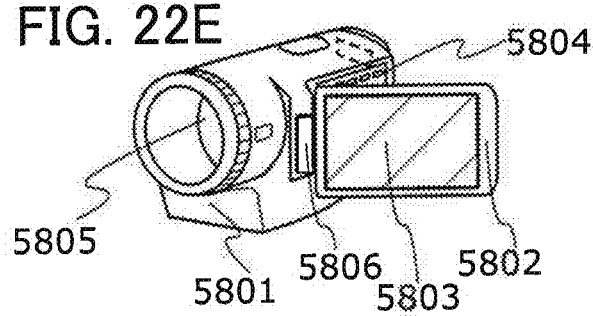

FIG. 22E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 22F:
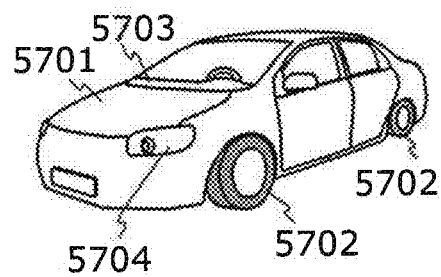

FIG. 22F illustrates a car which includes a car body 5701, wheels 5702, a dashboard 5703, lights 5704, and the like. The display device of one embodiment of the present invention can be used in a navigation system of the car.

Figure 22G:
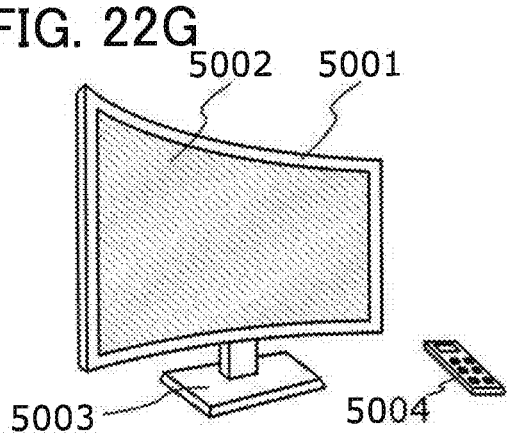

FIG. 22G illustrates an example of a television set. In the television device, a display portion 5002 is incorporated in a housing 5001. Here, the housing 5001 is supported by a stand 5003. The television set can operate by an operation switch of the housing 5001 or a separate remote controller 5004. The display portion 5002 may include a touch sensor. The television set can be operated by touching the display portion 5002 with a finger or the like. The remote controller 5004 may be provided with a display portion for displaying data output from the remote controller 5004. With operation keys or a touch panel of the remote controller 5004, channels or volume can be controlled and images displayed on the display portion 5002 can be controlled. Note that the television set may be provided with a receiver, a modem, and the like. The receiver allows the television set to receive a general television broadcast. Moreover, when the television set is connected to a communication network with or without wires via the modem, one-way (from a sender to a receiver) or two-way (between a sender and a receiver or between receivers) information communication can be performed.

Figure 22H:
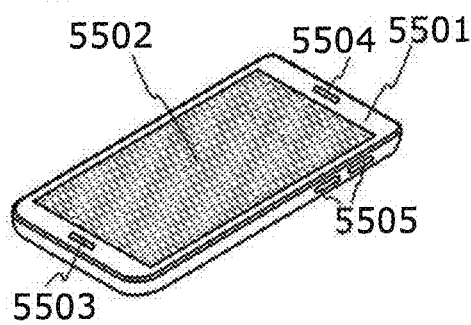

FIG. 22H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As the operation buttons 5505, any one of a power switch for starting the mobile phone, a button for operating an application of the mobile phone, a volume control button, a switch for turning on or off the display portion 5502, and the like can be used. Although the mobile phone in FIG. 22H includes two operation buttons 5505, the number of the operation buttons included in the mobile phone is not limited to two. Although not illustrated, the mobile phone illustrated in FIG. 22H may be provided with a camera. Although not illustrated, the mobile phone illustrated in FIG. 22H may include a flashlight or a light-emitting device used for a lighting purpose. Although not illustrated, the mobile phone in FIG. 22H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 22H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, an application example of a display device that can include the semiconductor device of one embodiment of the present invention or a memory device is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light in accordance with a current), a plasma display panel (PDP), an electron emitter, a display element including a carbon nanotube, a liquid crystal element, electronic ink, an electrowetting element, an electrophoretic element, a display element including micro electro mechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, the display element, the display device, the light-emitting element, or the light-emitting device may include a display medium whose contrast, luminance, reflectivity, transmittance, or the like is changed by an electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In the base of a display element including microelectromechanical systems (MEMS), a dry agent may be provided in a space where the display element is sealed (e.g., between an element substrate over which the display element is placed and a counter substrate opposed to the element substrate).

Providing a dry agent can prevent MEMS and the like from becoming difficult to move or deteriorating easily because of moisture or the like.

Note that this embodiment can be combined with any of the other embodiments in this specification as appropriate.

Embodiment 6

Here, display devices each including the semiconductor device of one embodiment of the present invention which are different from the display device in Embodiment 5 is described.

Figure 23A:
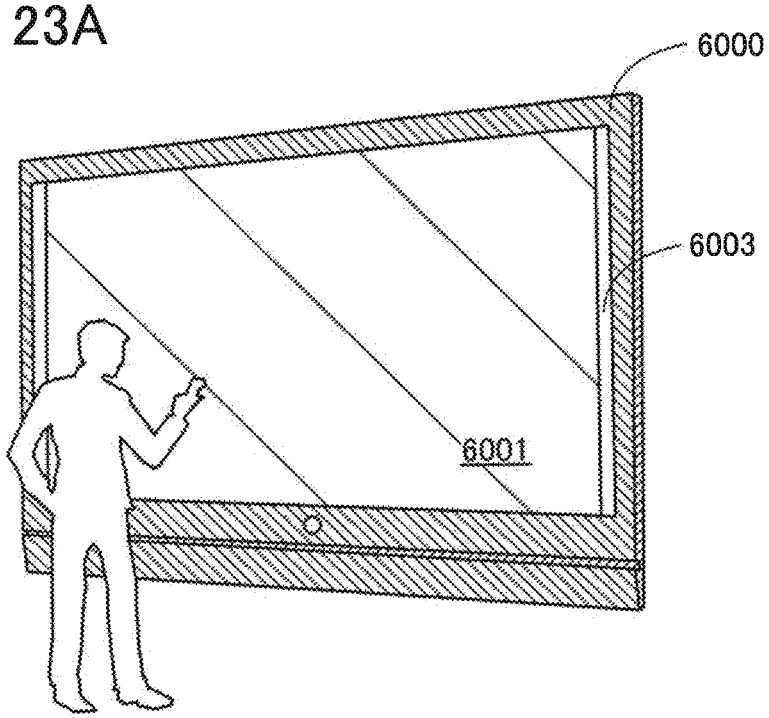
FIGS. 23A and 23B are perspective views each illustrating an example of an electronic device.

FIG. 23A illustrates a digital signage which can include a housing 6000, a display portion 6001, a speaker 6003, and the like.

Figure 23B:
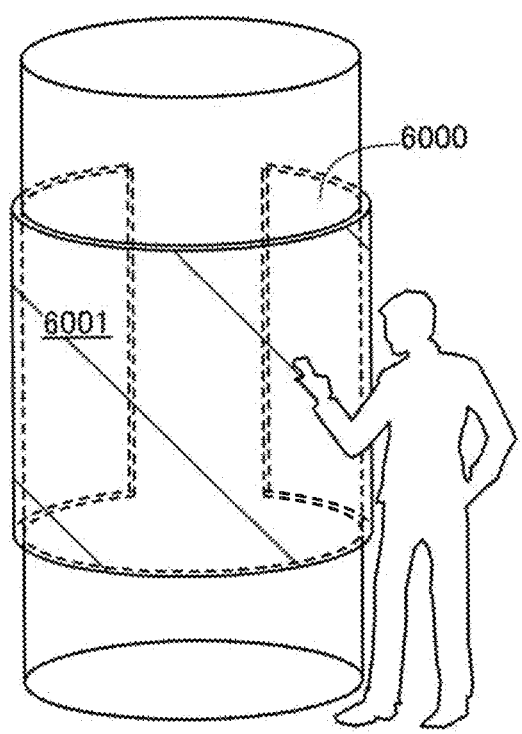

FIG. 23B illustrates a digital signage which is attached to a round column and can include the housing 6000, the display portion 6001, and the like. The digital signage can be attached to a column regardless of the shape of the column, in particular, when a flexible base material is used in the display portion 6001.

The electronic devices illustrated in FIGS. 23A and 23B can have a variety of functions. The electronic devices illustrated in FIGS. 23A and 23B can have a variety of functions, for example, a function of displaying a variety of information (e.g., a still image, a moving image, and a text image) on a display portion, a display device function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Further, in the case where the electronic devices include a plurality of display portions, the electronic devices can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices shown in FIGS. 23A and 23B are not limited to them, and the electronic devices can have a variety of functions.

Embodiment 7

Described in this embodiment are transistors of one embodiment of the disclosed invention.

Transistors in one embodiment of the present invention each preferably include an nc-OS or a CAAC-OS, which is described in Embodiment 8.

Structure Example 1 of Transistor

Figure 24A:
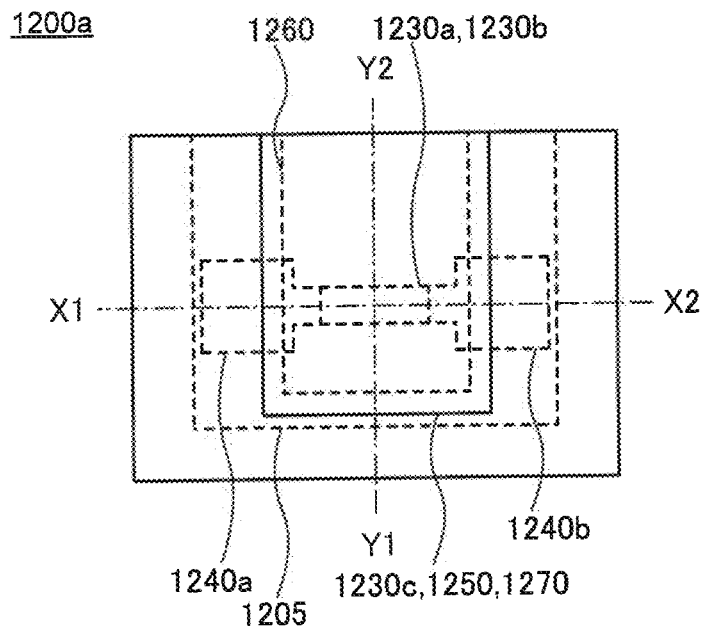
FIGS. 24A to 24C are a top view and cross-sectional views illustrating a structure example of a transistor.
Figure 24B:
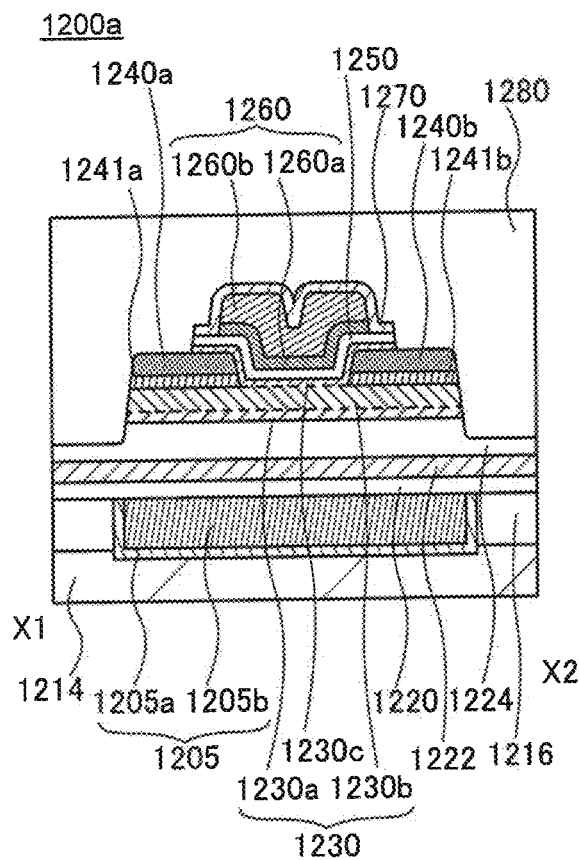
Figure 24C:
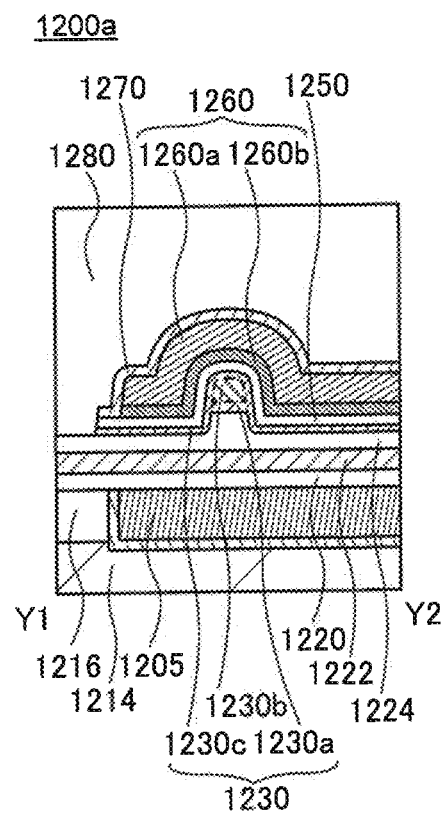

An example of a transistor of one embodiment of the present invention is described below. FIGS. 24A to 24C are a top view and cross-sectional views of the transistor of one embodiment of the present invention. FIG. 24A is a top view, FIG. 24B is a cross-sectional view taken along dashed-dotted line X1-X2 in FIG. 24A, and FIG. 24C is a cross-sectional view taken along dashed-dotted line Y1-Y2 in FIG. 24A. Note that for simplification of the drawing, some components in the top view in FIG. 24A are not illustrated.

A transistor 1200a includes conductors 1205 and 1260 functioning as gate electrodes, insulators 1220, 1222, 1224, and 1250 functioning as gate insulators, a metal oxide 1230 including a region where a channel is formed, conductors 1240a and 1241a functioning as one of a source and a drain, conductors 1240b and 1241b functioning as the other of the source and the drain, an insulator 1214, an insulator 1216, an insulator 1270, and an insulator 1280 which contains excess oxygen.

The metal oxide 1230 includes a metal oxide 1230a, a metal oxide 1230b over the metal oxide 1230a, and a metal oxide 1230*c* over the metal oxide 1230*b*. When the transistor 1200*a* is turned on, a current flows (a channel is formed) mainly in the metal oxide 1230*b*. Meanwhile, although a current sometimes flows in the vicinities of the interfaces of the metal oxides 1230*a* and 1230*c* with the metal oxide 1230*b* (which become mixed regions in some cases), the other region functions as an insulator in some cases.

<<Interlayer Insulating Film and Protective Insulating Film>>

The insulator 1214 is preferably formed using a material having a barrier property against oxygen and hydrogen. As an example of the film having a barrier property against hydrogen, silicon nitride formed by a CVD method can be used as the insulator 1214. As the insulator 1214, metal oxide such as aluminum oxide, hafnium oxide, or tantalum oxide is preferably used, for example. In particular, aluminum oxide has an excellent blocking effect that prevents permeation of oxygen and impurities such as hydrogen and moisture which cause a change in electrical characteristics of the transistor. Accordingly, aluminum oxide can prevent entry of impurities such as hydrogen and moisture into the transistor 1200*a* in and after a manufacturing process of the transistor. In addition, aluminum oxide can suppress release of oxygen from the metal oxide included in the transistor 1200*a*. Therefore, aluminum oxide is suitably used as a protective film for the transistor 1200*a*.

The insulator 1216 is provided over the insulator 1214. A material such as silicon oxide, silicon oxynitride, silicon nitride oxide, silicon nitride, aluminum oxide, aluminum oxynitride, aluminum nitride oxide, or aluminum nitride can be used for the insulator 1216.

Each of the insulators 1220 and 1224 is preferably an insulator containing oxygen, such as a silicon oxide film or a silicon oxynitride film. In particular, as the insulator 1224, an insulator containing excess oxygen (containing oxygen in excess of stoichiometric composition) is preferably used. In the case where such an insulator containing excess oxygen is provided in contact with the metal oxide in the transistor 1200*a*, oxygen vacancies in the metal oxide can be compensated. Note that the insulators 1222 and 1224 are not necessarily formed of the same material.

The insulator 1222 is preferably formed to have a single-layer structure or a stacked-layer structure using, for example, an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or ($Ba,Sr$)$TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Note that the insulator 1222 may have a stacked-layer structure of two or more layers. In this case, the stacked layers are not necessarily formed of the same material but may be formed of different materials.

When the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the metal oxide in the transistor 1200*a* to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. Note that by controlling the voltage of the conductor 1205, the amount of electrons to be trapped can be controlled, and thus the threshold voltage can be controlled. The transistor 1200*a* having the structure is a normally-off transistor that is in a non-conduction state (also referred to as an off state) even when the gate voltage is 0 V.

Furthermore, the treatment for trapping the electrons may be performed in the manufacturing process of the transistor. For example, the treatment is preferably performed at any step before factory shipment, such as after the formation of a conductor connected to the source conductor or the drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulator 1220 and insulator 1224 are formed using silicon oxide and the insulator 1222 is formed using hafnium oxide, the insulator 1220 and insulator 1224 may be formed by a chemical vapor deposition method (including a CVD method and an atomic layer deposition (ALD) method) and the insulator 1222 may be formed by a sputtering method. Note that using a sputtering method for the formation of the insulator 1222 might easily crystallize the insulator 1222 at low temperature to generate a large amount of fixed charges.

The threshold voltages can be controlled by appropriate adjustment of the thicknesses of the insulator 1220, the insulator 1222, and the insulator 1224. As for the materials and thicknesses, the insulators 1220, 1222, and 1224 are preferably a 10-nm-thick silicon oxynitride, a 20-nm-thick aluminum oxide, and a 30-nm-thick silicon oxynitride, respectively. It is further preferable that a 5-nm-thick silicon oxynitride, a 5-nm-thick aluminum oxide, and a 5-nm-thick silicon oxynitride be used as the insulators 1220, 1222, and 1224, respectively.

The insulator 1222 is preferably formed using a material having a barrier property against oxygen and hydrogen. When such a material is used, release of oxygen from the metal oxide included in the transistor 1200*a* or entry of impurities such as hydrogen from the outside can be prevented.

The insulator 1250 can have a single-layer structure or a stacked-layer structure using, for example, an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or ($Ba,Sr$)$TiO_3$ (BST). Alternatively, aluminum oxide, bismuth oxide, germanium oxide, niobium oxide, silicon oxide, titanium oxide, tungsten oxide, yttrium oxide, zirconium oxide, or gallium oxide may be added to the insulator, for example. Alternatively, the insulator may be subjected to nitriding treatment. Silicon oxide, silicon oxynitride, or silicon nitride may be stacked over the above insulator.

As the insulator 1250, like the insulator 1224, an oxide insulator that contains oxygen in excess of the stoichiometric composition is preferably used. When such an insulator containing excess oxygen is provided in contact with the metal oxide 1230, oxygen vacancies in the metal oxide 1230 can be reduced.

Alternatively, as the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen and hydrogen, can be used. The insulator 1250 formed of such a material functions as a layer that prevents release of oxygen from the metal oxide 1230 or entry of impurities such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200a can be shifted in the positive direction. The transistor 1200a having the structure is a normally-off transistor that is in a non-conduction state (also referred to as an off state) even when the gate voltage is 0 V.

In addition to the insulator 1250, a barrier film may be provided between the metal oxide 1230 and the conductor 1260 in the transistor illustrated in FIGS. 24A to 24C. Alternatively, the metal oxide 1230c may be formed using a material having a barrier property.

For example, an insulating film containing excess oxygen is provided in contact with the metal oxide 1230 and covered by a barrier film, whereby the composition of the metal oxide can be almost the same as the stoichiometric composition or can be in a supersaturated state containing more oxygen than that in the stoichiometric composition. It is also possible to prevent entry of impurities such as hydrogen into the metal oxide 1230.

The insulator 1270 may cover the conductor 1260. In the case where the insulator 1280 is formed using an oxide material from which oxygen is released, the insulator 1270 is formed using a material having a barrier property against oxygen to prevent the conductor 1260 from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

Thus, the oxidation of the conductor 1260 can be prevented, and oxygen released from the insulator 1280 can be supplied to the metal oxide 1230 efficiently.

<<Metal Oxide>>

The metal oxide 1230a, the metal oxide 1230b, and the metal oxide 1230c are each formed using metal oxide such as In-M-Zn oxide (M is Al, Ga, Y, or Sn). In—Ga oxide or In—Zn oxide may be used as the metal oxide 1230.

The metal oxide 1230 of one embodiment of the present invention is described below.

A metal oxide used as the metal oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the metal oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

First, preferred ranges of the atomic ratio of indium, the element M, and zinc contained in a metal oxide according to the present invention are described with reference to FIGS. 27A to 27C. Note that the proportion of oxygen atoms is not illustrated in FIGS. 27A to 27C. The terms of the atomic ratio of indium, the element M, and zinc contained in the metal oxide are denoted by [In], [M], and [Zn], respectively.

Figure 27A:
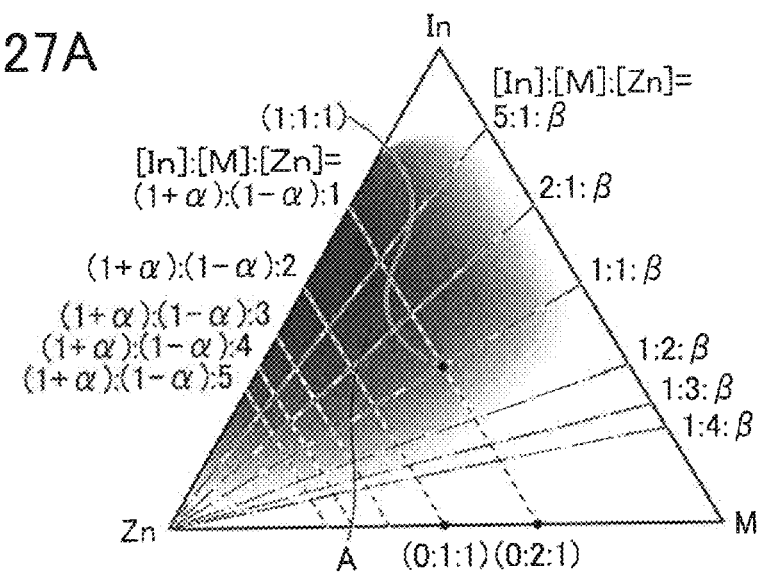
FIGS. 27A to 27C each illustrate an atomic ratio range of an oxide.
Figure 27B:
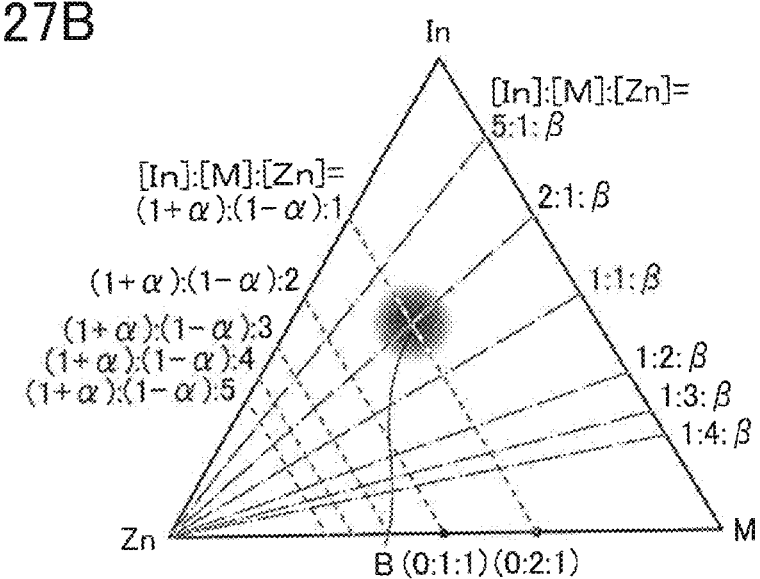
Figure 27C:
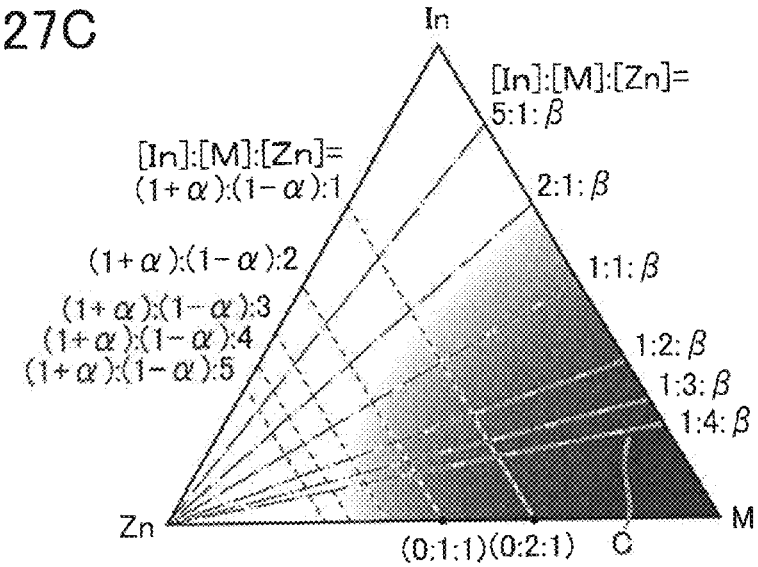

In FIGS. 27A to 27C, broken lines indicate a line where the atomic ratio [In]:[M]:[Zn] is $(1+\alpha):(1-\alpha):1$ (a☐☐☐☐☐☐☐☐☐☐☐☐☐☐☐☐☐☐☐☐☐☐☐☐☐☐-1☐☐1), aline where the atomic ratio [In]:[M]:[Zn] is $(1+\alpha):(1-\alpha):2$, a line where the atomic ratio [In]:[M]:[Zn] is $(1+\alpha):(1-\alpha):3$, aline where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ ($\beta$ is a real number of 0 or more), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

A metal oxide with an atomic ratio [In]:[M]:[Zn] that is equal to or close to 0:2:1 in FIGS. 27A to 27C is likely to have a spinel crystal structure.

FIGS. 27A and 27B illustrate examples of the preferred ranges of the atomic ratio of indium, the element M, and zinc contained in a metal oxide in one embodiment of the present invention.

Figure 28:
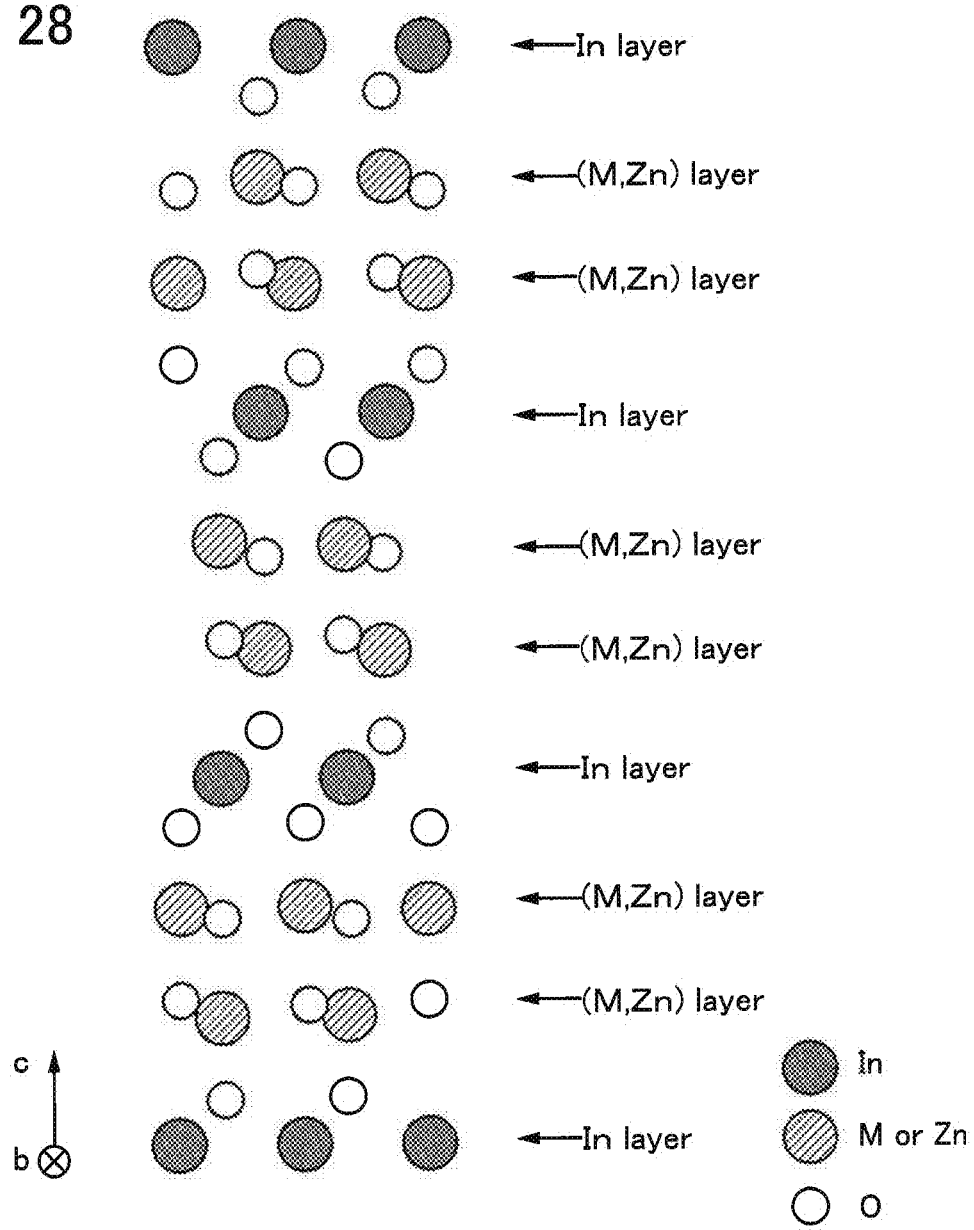
FIG. 28 shows a crystal of $InMZnO_4$.

FIG. 28 illustrates an example of the crystal structure of $InMZnO_4$ whose atomic ratio [In]:[M]:[Zn] is 1:1:1. The crystal structure illustrated in FIG. 28 is $InMZnO_4$ observed from a direction parallel to a b-axis. Note that a metal element in a layer that contains M, Zn, and oxygen (hereinafter, this layer is referred to as an "(M,Zn) layer") in FIG. 28 represents the element M or zinc. In that case, the proportion of the element M is the same as the proportion of zinc. The element M and zinc can be replaced with each other, and their arrangement is random.

Note that $InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 28.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

A metal oxide with an atomic ratio of [In]:[M]:[Zn]=1:1:2 has a layered structure that includes one In layer for every three (M,Zn) layers. In other words, if [Zn] is larger than [In] and [M], the proportion of (M,Zn) layers to In layers becomes higher when the metal oxide is crystallized.

Note that in the case where the number of (M,Zn) layers with respect to one In layer is not an integer in the metal oxide, the metal oxide might have a plurality of kinds of layered structures where the number of (M,Zn) layers with respect to one In layer is an integer. For example, in the case of [In]:[M]:[Zn]=1:1:1.5, the metal oxide may have a mix of a layered structure including one In layer for every two (M,Zn) layers and a layered structure including one In layer for every three (M,Zn) layers.

For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

In addition, the metal oxide containing indium in a higher proportion can have a higher carrier mobility (electron mobility). This is because in a metal oxide containing indium, the element M, and zinc, the s orbital of heavy metal mainly contributes to carrier transfer, and when the indium content in the metal oxide is increased, overlaps of the s orbitals of indium atoms are increased; therefore, a metal oxide having a high content of indium has a higher carrier mobility than a metal oxide having a low content of indium.

In contrast, carrier mobility decreases as the indium content and the zinc content in a metal oxide become lower. Thus, with an atomic ratio of [In]:[M]:[Zn]=0:1:0 and the vicinity thereof (e.g., a region C in FIG. 27C), insulation performance becomes better.

Accordingly, a metal oxide in one embodiment of the present invention preferably has an atomic ratio represented by a region A in FIG. 27A. With the atomic ratio, a layered structure with high carrier mobility and a few grain boundaries is easily obtained.

A region B in FIG. 27B represents an atomic ratio of [In]:[M]:[Zn]=4:2:3 to 4:2:4.1 and the vicinity thereof. The vicinity includes an atomic ratio of [In]:[M]:[Zn]=5:3:4. A metal oxide with an atomic ratio represented by the region B is an excellent metal oxide that has particularly high crystallinity and high carrier mobility.

Note that conditions where a layered structure of a metal oxide is formed are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which a metal oxide has a layered structure, and boundaries of the regions A to C are not clear.

Next, the case where the metal oxide is used for a transistor is described.

Note that when the metal oxide is used for a transistor, carrier scattering or the like at a grain boundary can be reduced; thus, the transistor can have high field-effect mobility. In addition, the transistor can have high reliability.

A metal oxide with low carrier density is preferably used for the transistor. For example, a metal oxide semiconductor whose carrier density is lower than $8 \times 10^{11}$ cm$^{-3}$, preferably lower than $1 \times 10^{11}$ cm$^{-3}$, further preferably lower than $1 \times 10^{10}$ cm$^{-3}$, and greater than or equal to $1 \times 10^{-9}$ cm$^{-3}$ is used.

Note that a highly purified intrinsic or substantially highly purified intrinsic metal oxide has few carrier generation sources, and thus has a low carrier density. A highly purified intrinsic or substantially highly purified intrinsic metal oxide film has a low density of defect states and accordingly has low density of trap states in some cases.

Charge trapped by the trap states in the metal oxide takes a long time to be released and may behave like fixed charge. Thus, the transistor whose channel region is formed in the metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the metal oxide is described.

When silicon or carbon that is one of Group 14 elements is contained in the metal oxide, defect states are formed in the metal oxide. Thus, the concentration of silicon or carbon in the metal oxide and around an interface with the metal oxide (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the metal oxide contains alkali metal or alkaline earth metal, defect states are formed and carriers are generated, in some cases. Thus, a transistor including a metal oxide that contains alkali metal or alkaline earth metal is likely to be normally-on. Therefore, it is preferable to reduce the concentration of alkali metal or alkaline earth metal in the metal oxide. Specifically, the concentration of alkali metal or alkaline earth metal of the metal oxide, which is measured by SIMS, is set to lower than or equal to $1 \times 10^{18}$ atoms/cm$^3$, preferably lower than or equal to $2 \times 10^{16}$ atoms/cm$^3$.

When containing nitrogen, the metal oxide easily becomes n-type by generation of electrons serving as carriers and an increase of carrier density. Thus, a transistor in which a metal oxide containing nitrogen is used as a semiconductor is likely to be normally-on. For this reason, nitrogen in the metal oxide is preferably reduced as much as possible; for example, the concentration of nitrogen in the metal oxide measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in a metal oxide reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, when a metal oxide contains hydrogen, a transistor including the metal oxide is likely to be normally on. Accordingly, hydrogen in the metal oxide is preferably reduced as much as possible. Specifically, the concentration of hydrogen in the metal oxide measured by SIMS is set to lower than $1 \times 10^{20}$ atoms/cm$^3$, preferably lower than $1 \times 10^{19}$ atoms/cm$^3$, further preferably lower than 5×10¹⁸ atoms/cm³, and still further preferably lower than 1×10¹⁸ atoms/cm³.

When a metal oxide with sufficiently reduced impurity concentration is used for a channel region of a transistor, the transistor can have stable electrical characteristics.

Next, the case where the metal oxide has a two-layer structure or a three-layer structure is described. A band diagram of insulators that are in contact with a stacked-layer structure of a metal oxide S1, a metal oxide S2, and a metal oxide S3, a band diagram of insulators that are in contact with a stacked-layer structure of the metal oxide S1 and the metal oxide S2, and a band diagram of insulators that are in contact with a stacked-layer structure of the metal oxide S2 and the metal oxide S3 are described with reference to FIGS. 29A to 29C.

Figure 29A:
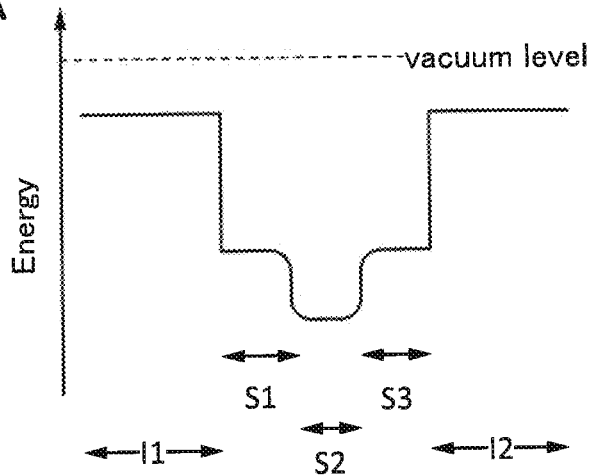
FIGS. 29A to 29C are each a band diagram of a layered structure of oxides.
Figure 29B:
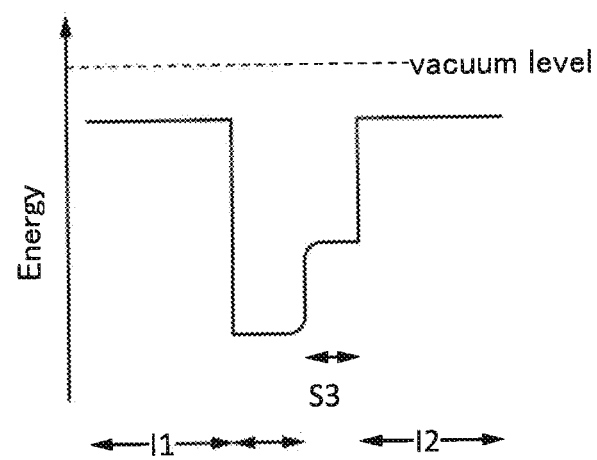
Figure 29C:
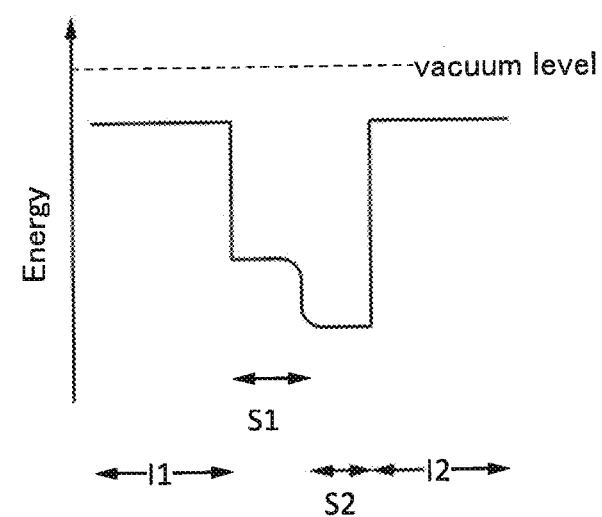

FIG. 29A is an example of a band diagram of a stacked-layer structure including an insulator I1, the metal oxide S1, the metal oxide S2, the metal oxide S3, and an insulator I2 in the thickness direction. FIG. 29B is an example of a band diagram of a stacked-layer structure including the insulator I1, the metal oxide S2, the metal oxide S3, and the insulator I2 in the thickness direction. FIG. 29C is an example of a band diagram of a stacked-layer structure including the insulator I1, the metal oxide S1, the metal oxide S2, and the insulator I2 in the thickness direction. Note that for easy understanding, the band diagrams show the conduction band minimum (Ec) of each of the insulator I1, the metal oxide S1, the metal oxide S2, the metal oxide S3, and the insulator I2.

The conduction band minimum of each of the metal oxides S1 and S3 is closer to the vacuum level than that of the metal oxide S2. Typically, a difference between the conduction band minimum of the metal oxide S2 and the conduction band minimum of each of the metal oxides S1 and S3 is preferably greater than or equal to 0.15 eV or greater than or equal to 0.5 eV, and less than or equal to 2 eV or less than or equal to 1 eV. That is, a difference in the electron affinity between each of the metal oxides S1 and S3 and the meal oxide S2 is preferably greater than or equal to 0.15 eV or greater than or equal to 0.5 eV, and less than or equal to 2 eV or less than or equal to 1 eV.

As illustrated in FIGS. 29A to 29C, the conduction band minimum of each of the metal oxides S1 to S3 is gradually varied. In other words, the conduction band minimum is continuously changed or continuously connected. In order to obtain such a band diagram, the density of defect states in a mixed layer formed at an interface between the metal oxides S1 and S2 or an interface between the metal oxides S2 and S3 is preferably made low.

Specifically, when the metal oxides S1 and S2 or the metal oxides S2 and S3 contain the same element (as a main component) in addition to oxygen, a mixed layer with a low density of defect states can be formed. For example, in the case where the metal oxide S2 is an In—Ga—Zn oxide, it is preferable to use an In—Ga—Zn oxide, a Ga—Zn oxide, gallium oxide, or the like as each of the metal oxides S1 and S3.

At this time, the metal oxide S2 serves as a main carrier path. Since the density of defect states at the interface between the metal oxides S1 and S2 and the interface between the metal oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The metal oxides S1 and S3 can make the trap state apart from the oxide metal S2. This structure can prevent the positive shift of the threshold voltage of the transistor.

A material whose conductivity is sufficiently lower than that of the metal oxide S2 is used for the metal oxides S1 and S3. In that case, the metal oxide S2, the interface between the metal oxides S1 and S2, and the interface between the metal oxides S2 and S3 mainly function as a channel region. For example, a metal oxide with high insulation performance and the atomic ratio represented by the region C in FIG. 27C can be used as the metal oxides S1 and S3. Note that the region C in FIG. 27C represents the atomic ratio of [In]:[M]:[Zn]=0:1:0 or the vicinity thereof.

In the case where a metal oxide with the atomic ratio represented by the region A is used as the metal oxide S2, it is particularly preferable to use a metal oxide with [M]/[In] of greater than or equal to 1, preferably greater than or equal to 2, as each of the metal oxides S1 and S3. In addition, it is suitable to use a metal oxide with sufficiently high insulation performance and [M]/([Zn]+[In]) of greater than or equal to 1 as the metal oxide S3.

<<Source Electrode and Drain Electrode>>

One of a pair of the conductors 1240a and 1241a and a pair of the conductors 1240b and 1241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a, 1241a, 1240b, and 1241b. Although a two-layer structure is shown in the figures, a single-layer structure or a stacked-layer structure of three or more layers may be used.

For example, an aluminum film may be used as each of the conductors 1241a and 1241b, and a titanium film may be used as each of the conductors 1240a and 1240b to be stacked thereover. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

<<Gate Electrode>>

Conductors 1205a and 1205b functioning as a gate electrode is described. Although the two-layer structure formed of the conductors 1205a and 1205b is shown in FIGS. 24A to 24C, one embodiment of the present invention is not limited to this structure, and a single-layer structure or a structure of three or more stacked layers may be employed. For example, tantalum or the like as a conductor having a barrier property against hydrogen may be used for the conductor 1205a, and tungsten having high conductivity may be stacked as the conductor 1205b. Such a combination can prevent diffusion of hydrogen into the metal oxide 1230 while the conductivity of the wiring can be maintained.

Conductors 1260a and 1260b functioning as a gate electrode can be formed using, for example, a metal selected from aluminum, chromium, copper, tantalum, titanium, molybdenum, and tungsten; an alloy containing any of these metals as a component; an alloy containing any of these metals in combination; or the like. Alternatively, one or both of manganese and zirconium may be used. Alternatively, a semiconductor typified by polycrystalline silicon doped with an impurity element such as phosphorus, or a silicide such as nickel silicide may be used.

For example, a two-layer structure where aluminum is used as the conductor 1260a and a titanium film is used as the conductor 1260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

For another example, a three-layer structure where a titanium film, an aluminum film, and a titanium film are stacked in that order may be used. Alternatively, an alloy film, or a nitride film containing aluminum and one or more metals selected from titanium, tantalum, tungsten, molybdenum, chromium, neodymium, and scandium may be used.

The conductor 1260 can also be formed using a light-transmitting conductive material such as indium tin oxide, indium metal oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked-layer structure of the above light-transmitting conductive material and the above-described metal.

<s-Channel Structure>

As illustrated in FIG. 24C, the side surface of the metal oxide 1230b is surrounded by the conductor 1260 in the transistor 1200a. In this specification, such a structure in which the region where the channel is formed is electrically surrounded by an electric field of the gate electrode is called a surrounded channel (s-channel) structure. With such a structure, the metal oxide 1230 can be surrounded by the electric field of the conductor 1260, and the channel can be formed in the whole (bulk) metal oxide 1230b. Therefore, a large amount of current can flow between the source and the drain of the transistor with the s-channel structure, so that high on-state current can be achieved. Furthermore, a voltage is applied from all directions to a region where a channel is formed, and thus, a transistor in which leakage current is suppressed can be provided.

The s-channel structure, because of its high on-state current, is suitable for a semiconductor device such as large-scale integration (LSI) which requires a miniaturized transistor. A semiconductor device including the miniaturized transistor can have a high integration degree and high density.

Structure Example 2 of Transistor

Figure 25A:
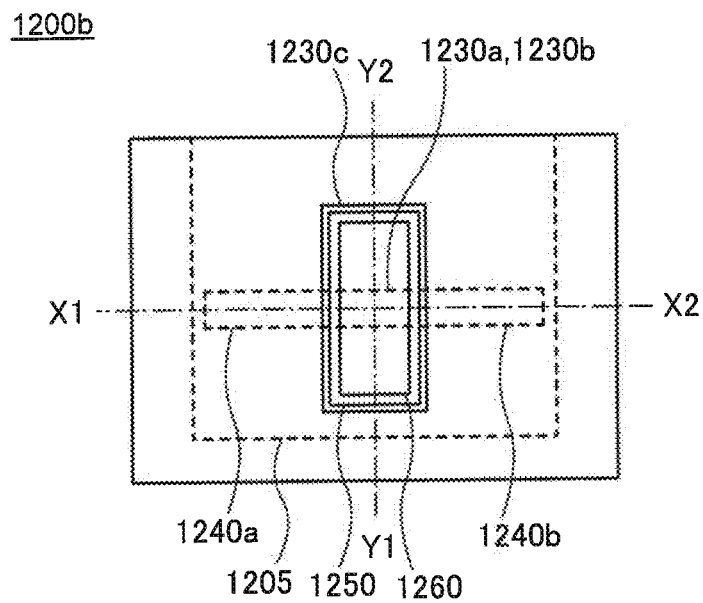
FIGS. 25A to 25C are a top view and cross-sectional views illustrating a structure example of a transistor.
Figure 25B:
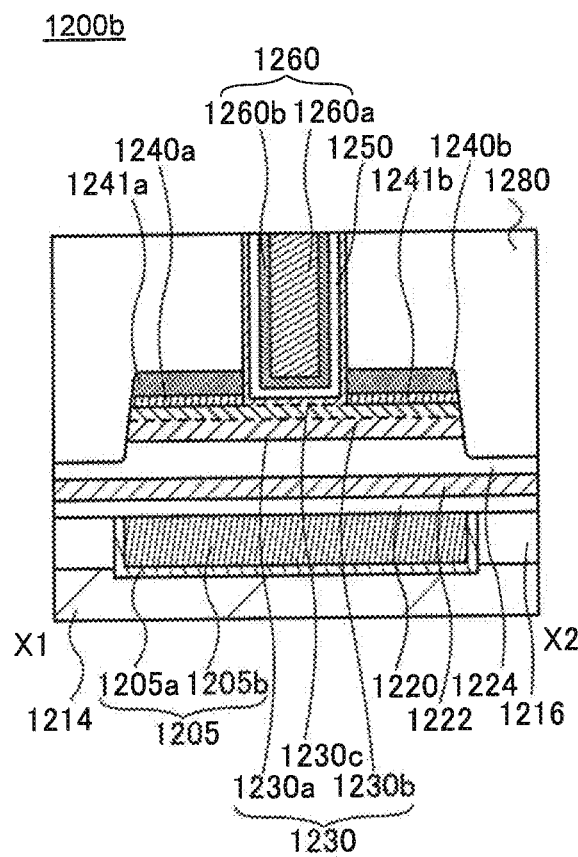
Figure 25C:
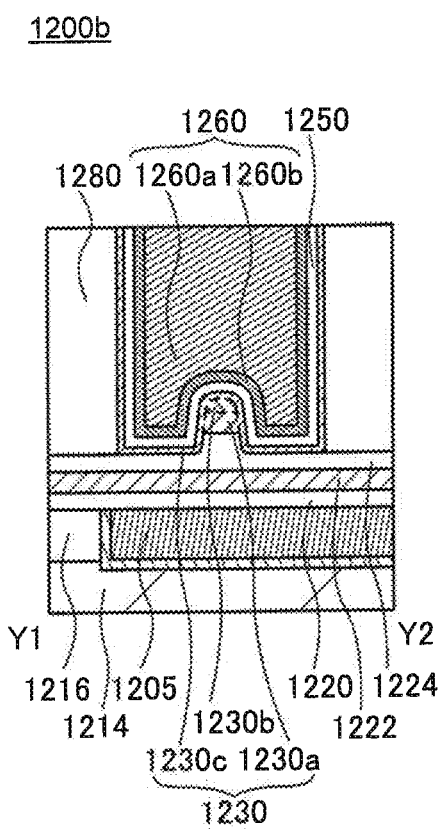

FIGS. 25A to 25C illustrate a structure example of a transistor different from the transistor 1200a. FIG. 25A illustrates a top surface of a transistor 1200b. FIG. 25B is a cross-sectional view taken along dashed-dotted line X1-X2 in FIG. 25A, and FIG. 25C is a cross-sectional view taken along dashed-dotted line Y1-Y2 in FIG. 25A.

Note that in the transistor 1200b in FIGS. 25A to 25C, components having the same function as the components in the transistor 1200a in FIGS. 24A to 24C are denoted by the same reference numerals.

In the structure illustrated in FIGS. 25A to 25C, the metal oxide 1230c, the insulator 1250, and the conductor 1260 are formed in an opening formed in the insulator 1280.

Furthermore, one end portion of each of the conductors 1240a, 1240b, 1241a, and 1241b is aligned with an end portion of the opening portion formed in the insulator 1280. An end portion of each of the conductors 1240a, 1240b, 1241a, and 1241b is aligned with part of an end portion of the metal oxide 1230. Therefore, the conductors 1240a, 1240b, 1241a, and 1241b can be formed concurrently with the metal oxide 1230 or the opening portion in the insulator 1280. This leads to a reduction in the number of masks and steps and improvement in yield and productivity.

Since the transistor 1200b illustrated in FIGS. 25A to 25C has a structure where the conductors 1240a, 1240b, 1241a, and 1241b hardly overlap with the conductor 1260, the parasitic capacitance added to the conductor 1260 can be reduced. Thus, the transistor 1200b with a high operation frequency can be provided.

Structure Example 3 of Transistor

Figure 26A:
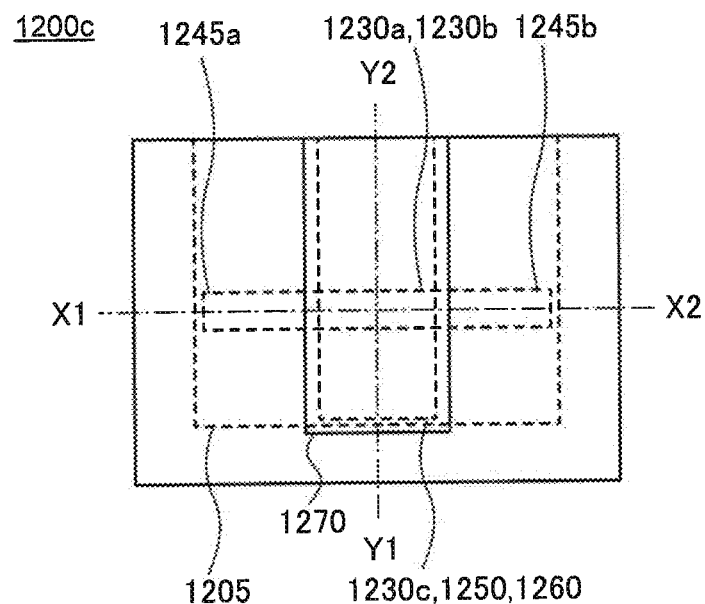
FIGS. 26A to 26C are a top view and cross-sectional views illustrating a structure example of a transistor.
Figure 26B:
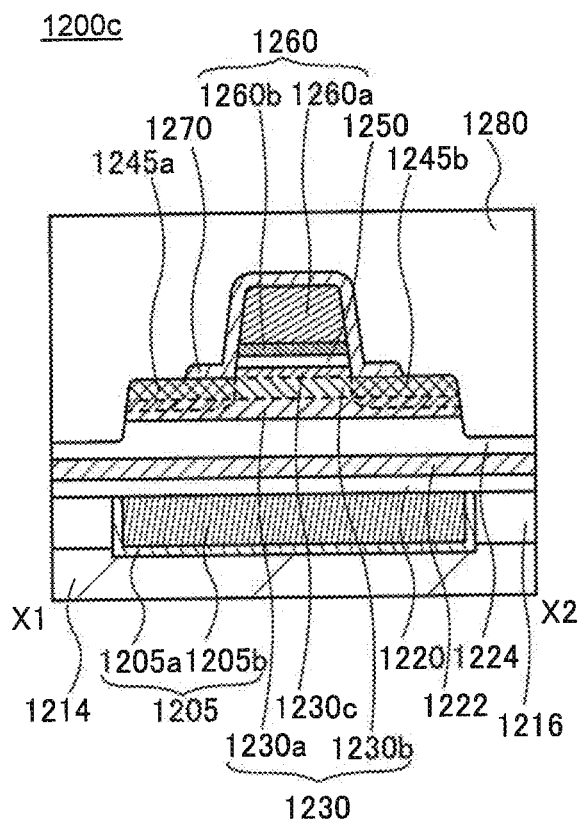
Figure 26C:
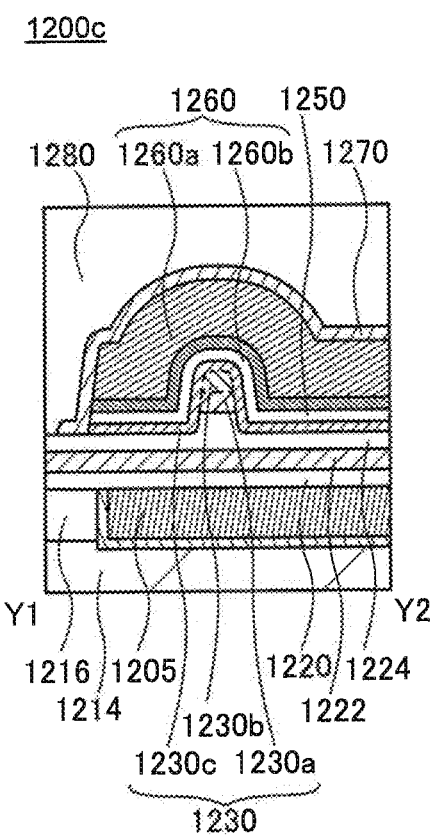

FIGS. 26A to 26C illustrate a structure example of a transistor different from the transistors 1200a and 1200b. FIG. 26A illustrates a top surface of a transistor 1200c. For simplification of the figure, some films are not illustrated in FIG. 26A. FIG. 26B is a cross-sectional view taken along dashed-dotted line X1-X2 in FIG. 26A, and FIG. 26C is a cross-sectional view taken along dashed-dotted line Y1-Y2 in FIG. 26A.

Note that in the transistor 1200c in FIGS. 26A to 26C, components having the same function as the components in the transistor 1200a in FIGS. 24A to 24C are denoted by the same reference numerals.

In the structure illustrated in FIGS. 26A to 26C, a region 1245a which functions as one of the source region and the drain region and a region 1245b which functions as the other of the source region and the drain region are provided in the metal oxide 1230. The regions can be formed in such a manner that an impurity such as boron, phosphorus, or argon is added to the metal oxide 1230 using the conductor 1260 as a mask. Alternatively, the regions can be formed in such a manner that the insulator 1280 is formed of an insulator containing hydrogen, such as a silicon nitride film, and hydrogen is diffused to part of the metal oxide 1230. Accordingly, the number of masks or steps can be reduced, and yield and productivity can be improved.

Structure Example 4 of Transistor

Figure 30A:
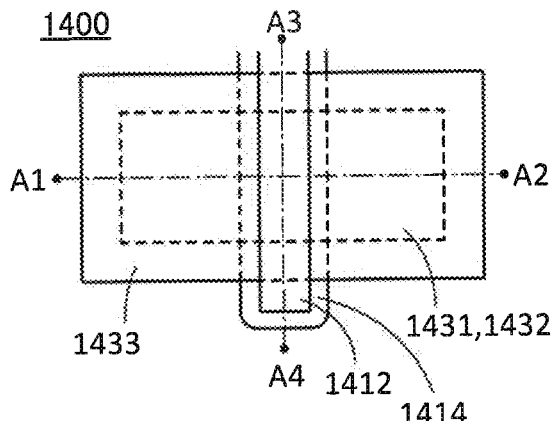
FIGS. 30A to 30D are a top view and cross-sectional views illustrating a structure example of a transistor.
Figure 30B:
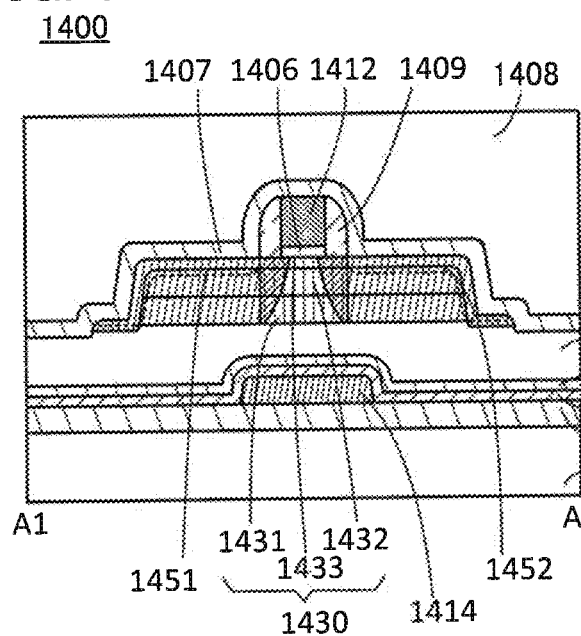
Figure 30C:
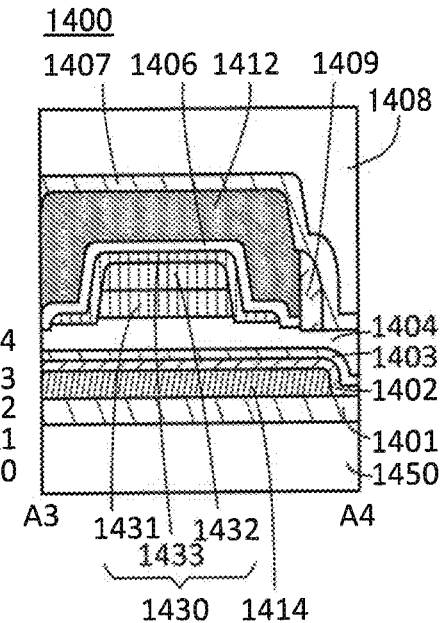

FIGS. 30A to 30D are a top view and cross-sectional views of a transistor 1400. FIG. 30A is a top view of the transistor 1400, FIG. 30B is a cross-sectional view taken along dashed-dotted line A1-A2 in FIG. 30A, and FIG. 30C is a cross-sectional view taken along dashed-dotted line A3-A4 in FIG. 30A. Note that the dashed-dotted line A1-A2 and the dashed-dotted line A3-A4 are sometimes referred to as a channel length direction and a channel width direction, respectively. Note that the transistor 1400 has an s-channel structure like the transistor 1200a and the like.

The transistor 1400 includes a substrate 1450; an insulator 1401 over the substrate 1450; a conductor 1414 over the insulator 1401; an insulator 1402 covering the conductor

1414; an insulator 1403 over the insulator 1402; an insulator 1404 over the insulator 1403; a stack in which a metal oxides 1431, a metal oxide 1432, and a metal oxide 1433 are stacked in this order over the insulator 1404 (these metal oxides are collectively referred to as a metal oxide 1430 in some cases); an insulator 1406 over the metal oxide 1433; a conductor 1412 over the insulator 1406, an insulator 1409 on a side surface of the conductor 1412; an insulator 1407 covering the insulator 1404, the metal oxide 1433, the insulator 1409, and the conductor 1412; and an insulator 1408 over the insulator 1407.

The insulator 1406 and the conductor 1412 overlap with the conductor 1414 and the metal oxide 1432 at least partly. The side edge of the conductor 1412 in the channel length direction is preferably approximately aligned with the side edge of the insulator 1406 in the channel length direction. Here, the insulator 1406 serves as a gate insulator of the transistor 1400, the conductor 1412 functions as a gate electrode of the transistor 1400, and the insulator 1409 functions as a sidewall insulator of the transistor 1400.

The metal oxide 1432 has a region that overlaps with the conductor 1412 with the metal oxide 1433 and the insulator 1406 positioned therebetween. It is preferable that the outer edge of the metal oxide 1431 be approximately aligned with the outer edge of the metal oxide 1432 and that the outer edge of the metal oxide 1433 be positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

<<Substrate>>

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulator>>

The insulator 1401 has a function of electrically isolating the substrate 1450 from the conductor 1414.

The insulator 1401 or 1402 is formed using an insulator having a single-layer structure or a layered structure. Examples of the material of the insulator include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 1402 may be formed using silicon oxide with high step coverage which is formed by reacting tetraethyl orthosilicate (TEOS), silane, or the like with oxygen, nitrous oxide, or the like.

After the insulator 1402 is formed, the insulator 1402 may be subjected to planarization treatment using a CMP method or the like to improve the planarity of the top surface thereof.

The insulator 1404 preferably contains an oxide. In particular, the insulator 1404 preferably contains an oxide material from which part of oxygen is released by heating. The insulator 1404 preferably contains an oxide containing oxygen more than that in the stoichiometric composition. Part of oxygen is released by heating from an oxide film containing oxygen more than that in the stoichiometric composition. Oxygen released from the insulator 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen in excess of that in the stoichiometric composition is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis, for example. Note that the temperature of the film surface in the TDS analysis is preferably higher than or equal to 100° C. and lower than or equal to 700° C., or higher than or equal to 100° C. and lower than or equal to 500° C.

The insulator 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 1404.

To make the insulator 1404 contain excess oxygen, the insulator 1404 is formed in an oxygen atmosphere, for example. Alternatively, a region containing excess oxygen may be formed by introducing oxygen into the insulator 1404 that has been formed. Both the methods may be combined.

For example, oxygen (at least including any of oxygen radicals, oxygen atoms, and oxygen ions) may be introduced into the insulator 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Moreover, hydrogen or the like may be included. For example, a mixed gas of carbon dioxide, hydrogen, and argon may be used.

After the insulator 1404 is formed, the insulator 1404 may be subjected to planarization treatment using a CMP method or the like to improve the planarity of the top surface thereof.

The insulator 1403 has a passivation function of preventing oxygen contained in the insulator 1404 from decreasing by bonding to metal contained in the conductor 1414.

The insulator 1403 has a function of blocking oxygen, hydrogen, water, alkali metal, alkaline earth metal, and the like. Providing the insulator 1403 can prevent outward diffusion of oxygen from the metal oxide 1430 and entry of hydrogen, water, or the like into the metal oxide 1430 from the outside.

The insulator 1403 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 1400 can be controlled by injecting electrons into a charge trap layer. The charge trap layer is preferably provided in the insulator 1402 or the insulator 1403. For example, when the insulator 1403 is formed using hafnium oxide, aluminum oxide, tantalum oxide, aluminum silicate, or the like, the insulator 1403 can function as a charge trap layer.

<<Gate Electrode>>

The conductor 1412 functions as a first gate electrode. The conductor 1412 may have a stacked-layer structure of a plurality of conductors. The conductor 1414 of the gate electrode functions as a second gate electrode.

The conductor 1412 and the conductor 1414 each preferably have a single-layer structure or a layered structure using a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductors are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

Any one of the metal oxides 1431 to 1433 may be used as the conductor 1412 or the conductor 1414. In that case, in order that the metal oxides 1431 to 1433 function as a conductor, an additional process needs to be performed. Specifically, any one of the metal oxides 1431 to 1433 is formed as the conductor 1412 or the conductor 1414, and a silicon nitride film is formed as the insulator 1407 by a method using plasma containing hydrogen, such as a CVD method, thereby reducing the resistances of the metal oxides 1431 to 1433. As a result, any one of the metal oxides 1431 to 1433 function as a conductor can be used for the conductor 1412 or the conductor 1414.

<<Metal Oxide>>

The description of the metal oxide 1230*a* in FIGS. 24A to 24C can be referred to for the details of the metal oxide 1431. The description of the metal oxide 1230*b* in FIGS. 24A to 24C can be referred to for the details of the metal oxide 1432. The description of the metal oxide 1230*c* in FIGS. 24A to 24C can be referred to for the details of the metal oxide 1433.

<<Low-Resistance Regions>>

Figure 30D:
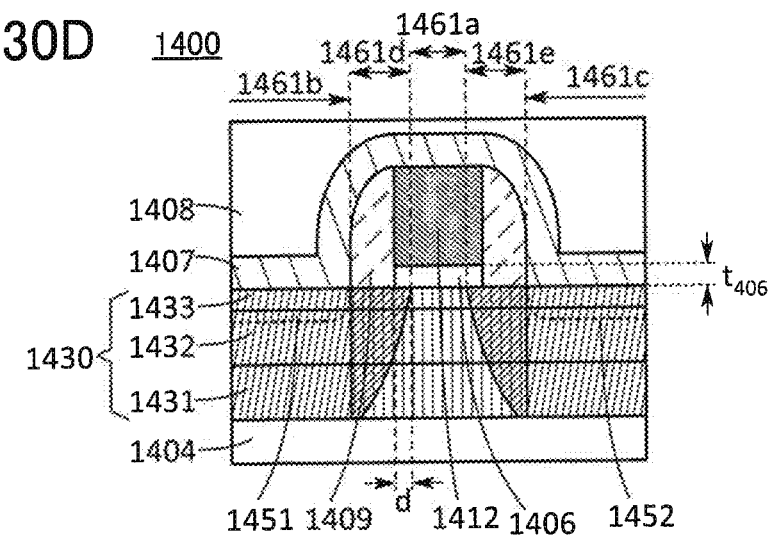

FIG. 30D is an enlarged view of part of FIG. 30B. As shown in FIG. 30D, regions 1461*a* to 1461*e* are formed in the metal oxide 1430. The regions 1461*b* to 1461*e* have a higher concentration of dopant and therefore have a lower resistance than the region 1461*a*. Furthermore, the regions 1461*b* and 1461*c* have a higher concentration of hydrogen and therefore have a much lower resistance than the regions 1461*d* and 1461*e*. The concentration of a dopant in the region 1461*a* is, for example, less than or equal to 5%, less than or equal to 2%, or less than or equal to 1% of the maximum concentration of a dopant in the region 1461*b* or 1461*c*. Note that the dopant may be rephrased as a donor, an acceptor, an impurity, or an element.

As illustrated in FIG. 30D, in the metal oxide 1430, the region 1461*a* substantially overlaps with the conductor 1412, and the regions 1461*b* to 1461*e* are the regions other than the region 1461*a*. In the regions 1461*b* and 1461*c*, the top surface of the metal oxide 1433 is in contact with the insulator 1407. In the regions 1461*d* and 1461*e*, the top surface of the metal oxide 1433 is in contact with the insulator 1409 or 1406. That is, as illustrated in FIG. 30D, the boundary between the regions 1461*b* and 1461*d* overlaps with the border between the side edges of the insulators 1407 and 1409. The same applies to the boundary between the regions 1461c and 1461e. Here, part of the regions 1461d and 1461e preferably overlaps with part of a region (a channel formation region) where the metal oxide 1432 and the conductor 1412 overlap with each other. For example, preferably, the side edges of the regions 1461d and 1461e in the channel length direction are inside of the conductor 1412 and the distance between the side edge of the conductor 1412 and each of the side edges of the regions 1461d and 1461e is d. In that case, the thickness $t_{406}$ of the insulator 1406 and the distance d preferably satisfy $0.25t_{406} < d < t_{406}$.

In the above manner, the regions 1461d and 1461e are formed in part of the region where the metal oxide 1430 and the conductor 1412 overlap with each other. Accordingly, the channel formation region of the transistor 1400 is in contact with the low-resistance regions 1461d and 1461e and a high-resistance offset region is not formed between the region 1461a and each of the regions 1461d and 1461e, so that the on-state current of the transistor 1400 can be increased. Furthermore, since the side edges of the regions 1461d and 1461e in the channel length direction are formed so as to satisfy the above range, the regions 1461d and 1461e can be prevented from spreading inward too much in the channel formation region and thus the transistor 1400 can be prevented from being constantly in an on state.

The regions 1461b to 1461e are formed by ion doping treatment such as an ion implantation method. Therefore, as illustrated in FIG. 30D, the positions of the side edges of the regions 1461d and 1461e in the channel length direction are sometimes shifted to the side edge of the metal oxide 1430 in the channel length direction in a deeper area from the top surface of the metal oxide 1433. The distance d in that case is the distance between the side edge of the conductor 1412 in the channel length direction and each of the side edges of the regions 1461d and 1461e that are closest to the inner part of the conductor 1412.

In some cases, for example, the regions 1461d and 1461e in the metal oxide 1431 do not overlap with the conductor 1412. In that case, at least part of the regions 1461d and 1461e in the metal oxide 1431 or 1432 is preferably formed in a region overlapping with the conductor 1412.

In addition, low-resistance regions 1451 and 1452 are preferably formed in the metal oxide 1431, the metal oxide 1432, and the metal oxide 1433 in the vicinity of the interface with the insulator 1407. The low-resistance regions 1451 and 1452 contain at least one of elements included in the insulator 1407. Preferably, part of the low-resistance regions 1451 and 1452 is substantially in contact with or overlaps partly with the region (the channel formation region) where the metal oxide 1432 and the conductor 1412 overlap with each other.

Since a large part of the metal oxide 1433 is in contact with the insulator 1407, the low-resistance regions 1451 and 1452 are likely to be formed in the metal oxide 1433. The low-resistance regions 1451 and 1452 in the metal oxide 1433 contain a higher concentration of elements included in the insulator 1407 than the other regions of the metal oxide 1433 (e.g., the region of the metal oxide 1433 that overlaps with the conductor 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b and 1461c to 1461e other than the low-resistance regions 1451 and 1452, and the lowest in the region 1461a. The added elements refer to a dopant for forming the regions 1461b and 1461c and an element added from the insulator 1407 to the low-resistance regions 1451 and 1452.

Although the low-resistance regions 1451 and 1452 are formed in the transistor 1400, the semiconductor device shown in this embodiment is not limited to this structure. For example, the low-resistance regions 1451 and 1452 need not be formed in the case where the regions 1461b and 1461c have a sufficiently low resistance.

<<Gate Insulating Film>>

The insulator 1406 preferably contains an insulator with a high relative dielectric constant. For example, the insulator 1406 preferably contains gallium oxide, hafnium oxide, oxide containing aluminum and hafnium, oxynitride containing aluminum and hafnium, oxide containing silicon and hafnium, or oxynitride containing silicon and hafnium.

The insulator 1406 preferably has a stacked-layer structure including silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulator 1407 has a function of blocking oxygen, hydrogen, water, alkali metal, alkaline earth metal, and the like. The insulator 1407 can prevent outward diffusion of oxygen from the metal oxide 1430 and entry of hydrogen, water, or the like into the metal oxide 1430 from the outside.

The insulator 1407 can be, for example, a nitride insulator. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used as the insulator 1407 because it is highly effective in preventing transmission of both oxygen and impurities such as hydrogen and moisture.

The insulator 1408 can be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. Alternatively, for the insulator 1408, a resin such as a polyimide resin, a polyamide resin, an acrylic resin, a siloxane resin, an epoxy resin, or a phenol resin can be used. The insulator 1408 may be a stack including any of the above materials.

Structure Example 5 of Transistor

Figure 31A:
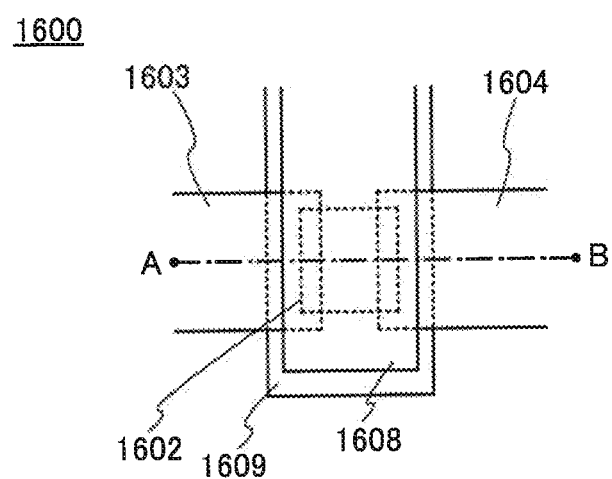
FIGS. 31A and 31B are a top view and a cross-sectional view illustrating a structure example of a transistor.
Figure 31B:
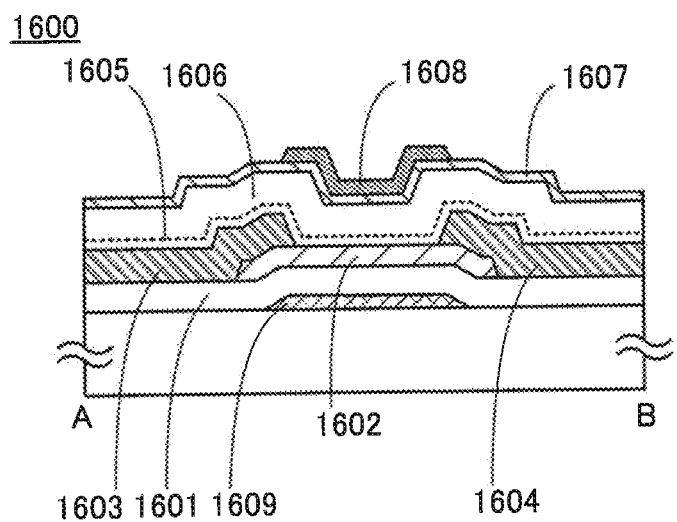

FIGS. 31A and 31B are a top view and a cross-sectional view of a transistor 1600. FIG. 31A is a top view, and FIG.

31B is a cross-sectional view taken along dashed-dotted line A-B in FIG. 31A. Note that for simplification of the drawing, some components are increased or reduced in size, or not illustrated in FIGS. 31A and 31B. The direction of the dashed-dotted line A-B may be referred to as a channel length direction.

The transistor 1600 illustrated in FIG. 31B includes a conductor 1609 functioning as a first gate, a conductor 1608 functioning as a second gate, a semiconductor 1602, a conductor 1603 and a conductor 1604 functioning as a source and a drain, an insulator 1601, an insulator 1605, an insulator 1606, and an insulator 1607.

The conductor 1609 is provided on an insulating surface. The conductor 1609 and the semiconductor 1602 overlap with each other with the insulator 1601 provided therebetween. The conductor 1608 and the semiconductor 1602 overlap with each other with the insulators 1605, 1606, and 1607 provided therebetween. The conductors 1603 and 1604 are connected to the semiconductor 1602.

The description of the conductor 1412 or 1414 in FIGS. 30A to 30C can be referred to for the details of the conductors 1609 and 1608.

The conductors 1609 and 1608 may be supplied with different potentials, or may be supplied with the same potential at the same time. The provision of the conductor 1608 functioning as the second gate electrode in the transistor 1600 makes it possible to stabilize the threshold voltage. Note that the conductor 1608 is not necessarily provided.

The description of the metal oxide 1230*b* in FIGS. 24A to 24C can be referred to for the details of the semiconductor 1602. The semiconductor 1602 may be a single layer or a stack including a plurality of semiconductor layers.

The conductors 1603 and 1604 each preferably have a single-layer structure or a stacked-layer structure using a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductors are preferably formed using a low-resistance conductive material such as aluminum or copper. The conductors are preferably formed using a Cu—Mn alloy, since in that case, manganese oxide formed at the interface with an insulator containing oxygen has a function of preventing Cu diffusion.

The conductors 1603 and 1604 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

The description of the insulator 1406 in FIGS. 30A to 30C can be referred to for the details of the insulator 1601.

The insulators 1605 to 1607 are sequentially stacked over the semiconductor 1602 and the conductors 1603 and 1604 in FIG. 31B; however, an insulator provided over the semiconductor 1602 and the conductors 1603 and 1604 may be a single layer or a stack including a plurality of insulators.

In the case of using an oxide semiconductor as the semiconductor 1602, the insulator 1606 preferably contains oxygen at a proportion higher than or equal to that in the stoichiometric composition and has a function of supplying part of oxygen to the semiconductor 1602 by heating. Note that in the case where providing the insulator 1606 directly on the semiconductor 1602 causes damage to the semiconductor 1602 at the time of formation of the insulator 1606, the insulator 1605 is preferably provided between the semiconductor 1602 and the insulator 1606, as illustrated in FIG. 31B. The insulator 1605 preferably allows oxygen to pass therethrough, and causes little damage to the semiconductor 1602 when the insulator 1605 is formed compared with the case of the insulator 1606. If damage to the semiconductor 1602 can be reduced and the insulator 1606 can be formed directly on the semiconductor 1602, the insulator 1605 is not necessarily provided.

For the insulators 1605 and 1606, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 1607 preferably has an effect of blocking diffusion of oxygen, hydrogen, and water. Alternatively, the insulator 1607 preferably has an effect of blocking diffusion of hydrogen and water.

An insulator has a better blocking effect as it has a higher density and becomes denser or has a fewer dangling bonds and becomes more chemically stable. An insulator that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

In the case where the insulator 1607 has an effect of blocking diffusion of water, hydrogen, and the like, impurities such as water and hydrogen that exist in a resin in a panel or exist outside the panel can be prevented from entering the semiconductor 1602. In the case where an oxide semiconductor is used as the semiconductor 1602, part of water or hydrogen that enters the oxide semiconductor serves as an electron donor (donor). Thus, the use of the insulator 1607 having the blocking effect can prevent a shift in the threshold voltage of the transistor 1600 due to generation of donors.

In addition, in the case where an oxide semiconductor is used as the semiconductor 1602, the insulator 1607 has a blocking effect of preventing diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1600 due to generation of donors can be prevented.

Note that this embodiment can be combined with any of the other embodiments in this specification as appropriate.

Embodiment 8

Described in this embodiment are structures of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 32A:
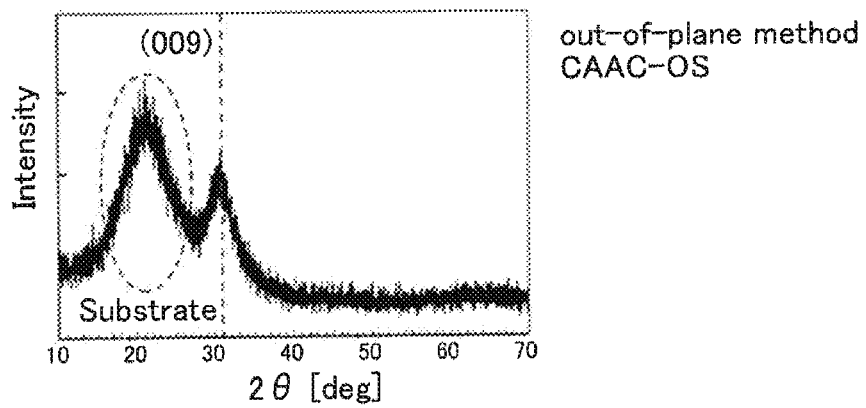
FIGS. 32A to 32E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 32A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

Figure 32B:
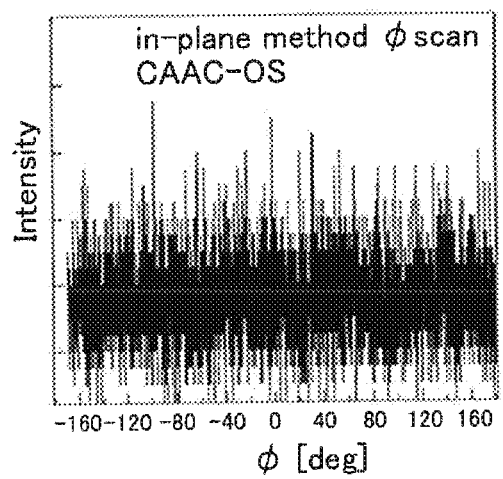
Figure 32C:
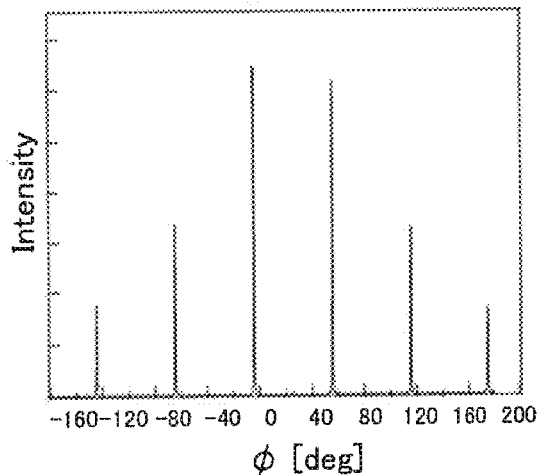

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 32B, a peak is not clearly observed. In contrast, in the case where single crystal $InGaZnO_4$ is subjected to $\phi$ scan with $2\theta$ fixed at around 56°, as shown in FIG. 32C, six peaks which are derived from crystal planes equivalent to the (110) plane are observed. Accordingly, the structural analysis using XRD shows that the directions of a-axes and b-axes are irregularly oriented in the CAAC-OS.

Figure 32D:
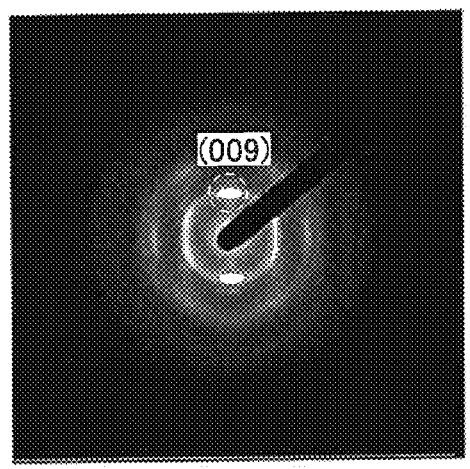
Figure 32E:
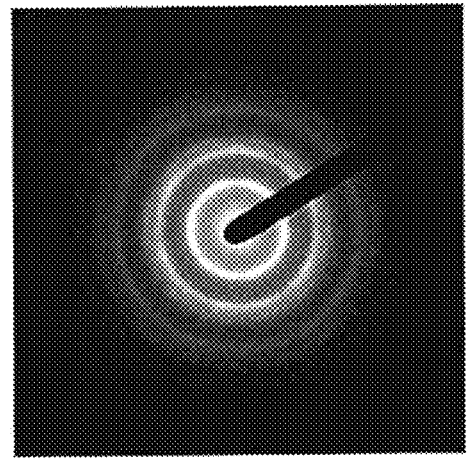

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 32D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32E shows a diffraction pattern obtained in such a manner that an electron beam with a probe diameter of 300 nm is incident on the same sample in a direction perpendicular to the sample surface. As shown in FIG. 32E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 32E is considered to be derived from the (010) plane, the (100) plane, and the like of the $InGaZnO_4$ crystal. The second ring in FIG. 32E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 33A:
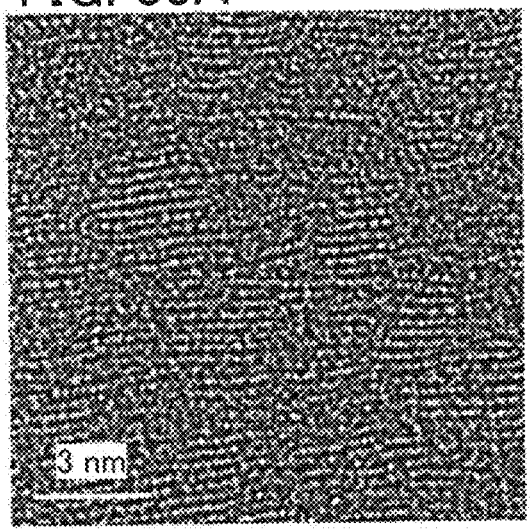
FIGS. 33A to 33E show a cross-sectional TEM image and plan-view TEM images of a CAAC-OS and images obtained through analysis thereof.

FIG. 33A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 33A shows pellets in which metal atoms are arranged in a layered manner. FIG. 33A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 33B:
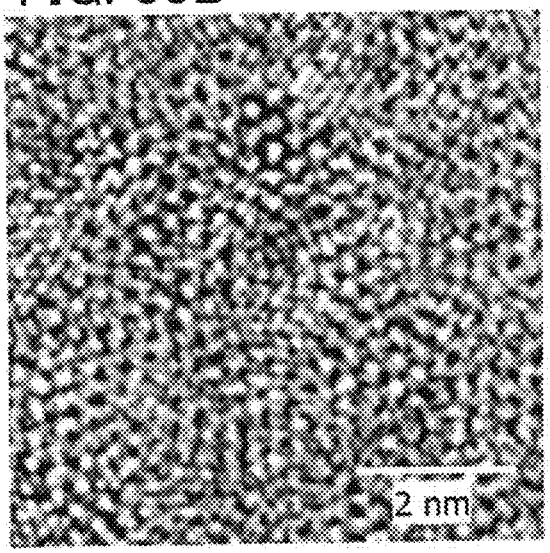
Figure 33C:
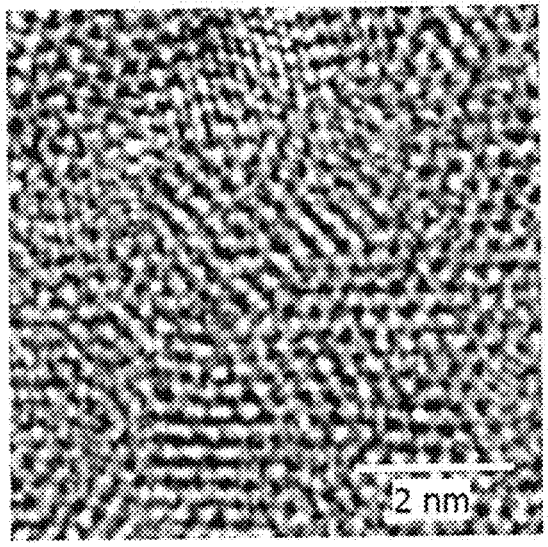
Figure 33D:
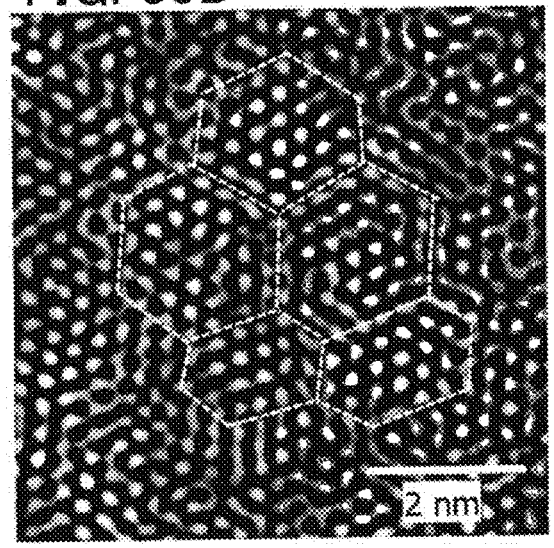
Figure 33E:
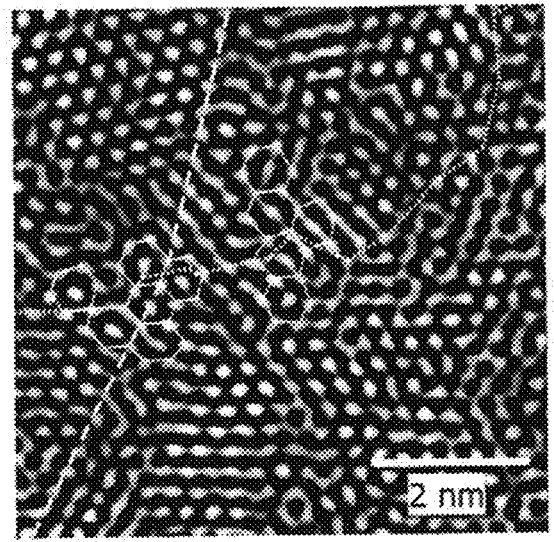

FIGS. 33B and 33C show Cs-corrected high-resolution TEM images of a plane of the CAAC-OS observed from a direction substantially perpendicular to the sample surface. FIGS. 33D and 33E are images obtained through image processing of FIGS. 33B and 33C. The method of image processing is as follows. The image in FIG. 33B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 33D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 33E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atomic arrangement in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$ and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 34A:
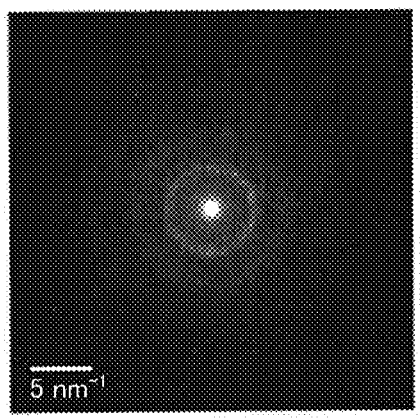
FIGS. 34A to 34D show electron diffraction patterns and a cross-sectional TEM image of an nc-OS.
Figure 34B:
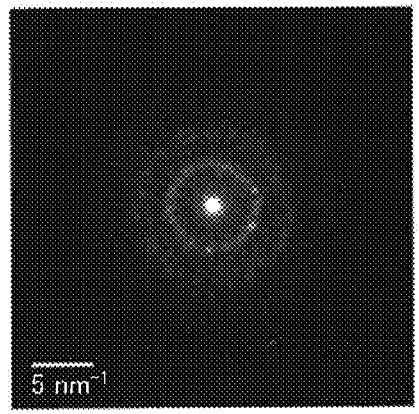

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 34A is observed. FIG. 34B shows a diffraction pattern obtained when an electron beam with a probe diameter of 1 nm is incident on the same sample. As shown in FIG. 34B, a plurality of spots are observed in a ring-like region. In other words, ordering in an nc-OS is not observed with an electron beam with a probe diameter of 50 nm but is observed with an electron beam with a probe diameter of 1 nm.

Figure 34C:
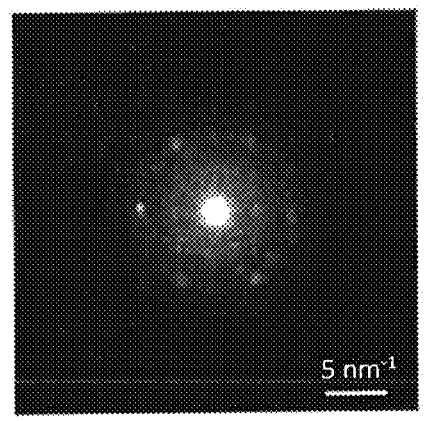

Furthermore, an electron diffraction pattern in which spots are arranged in an approximately regular hexagonal shape is observed in some cases as shown in FIG. 34C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 34D:
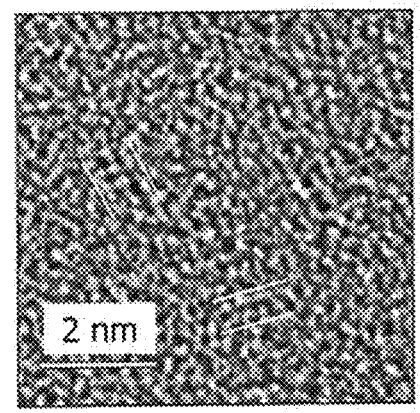

FIG. 34D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 34D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 35A:
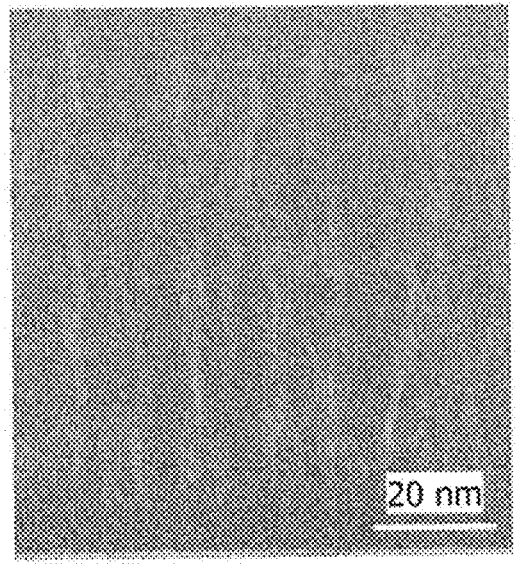
FIGS. 35A and 35B show cross-sectional TEM images of an a-like OS.
Figure 35B:
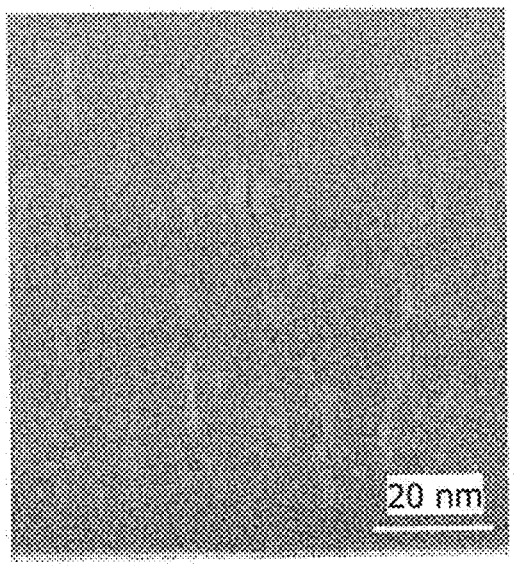

FIGS. 35A and 35B are high-resolution cross-sectional TEM images of an a-like OS. FIG. 35A is the high-resolution cross-sectional TEM image of the a-like OS at the start of the electron irradiation. FIG. 35B is the high-resolution cross-sectional TEM image of a-like OS after the electron (e) irradiation at $4.3\times10^8$ e$^-$/nm$^2$. FIGS. 35A and 35B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 36:
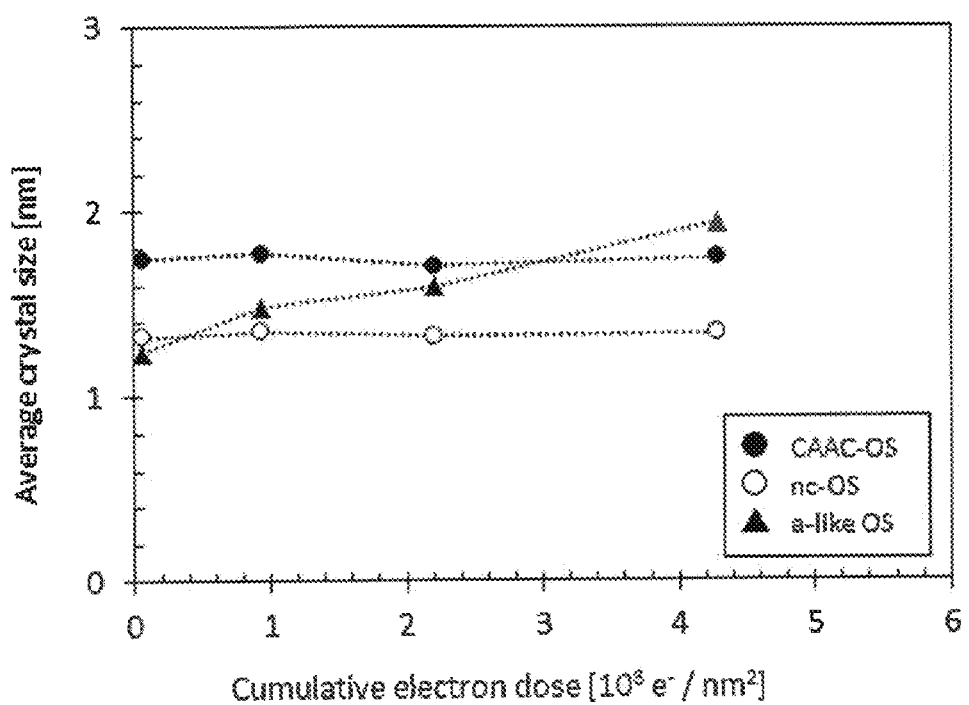
FIG. 36 shows a change in crystal part of an In—Ga—Zn oxide induced by electron irradiation.

FIG. 36 shows change in the average size of crystal parts (at 22 points to 30 points) in each sample. Note that the crystal part size corresponds to the length of a lattice fringe. FIG. 36 indicates that the crystal part size in the a-like OS increases with an increase in the cumulative electron dose in obtaining TEM images, for example. As shown in FIG. 36, a crystal part of approximately 1.2 nm (also referred to as an initial nucleus) at the start of TEM observation grows to a size of approximately 1.9 nm at a cumulative electron (e) dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. As shown in FIG. 36, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$.$); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Note that this embodiment can be combined with any of the other embodiments in this specification as appropriate.

(Notes on the Description in this Specification and the Like)

The following are notes on the description of the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be omitted in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention in Embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Therefore, the terms for explaining arrangement are not limited to those used in this specification and may be changed to other terms as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is exaggerated for description convenience in some cases; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions That Can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

In this specification and the like, in the case where a transistor has two or more gates (such a structure is referred to as a dual-gate structure in some cases), these gates are referred to as a first gate and a second gate or a front gate and a back gate in some cases. In particular, the term "front gate" can be replaced with a simple term "gate." Note that a "bottom gate" is a terminal which is formed before a channel formation region in manufacture of a transistor, and a "top gate" is a terminal which is formed after a channel formation region in manufacture of a transistor.

A transistor has three terminals: a gate, a source, and a drain. The gate is a terminal which functions as a control terminal for controlling the on/off state of the transistor. Functions of input/output terminals of the transistor depend on the type and the levels of potentials applied to the terminals, and one of the two terminals serves as a source and the other serves as a drain. Therefore, in this specification and the like, the terms "source" and "drain" can be used to denote the drain and the source, respectively. In this specification and the like, the two terminals other than the gate may also be referred to as a first terminal and a second terminal, a third terminal and a fourth terminal, or the like.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", and "power source line" can be interchanged with each other depending on the case or circumstances. For example, the term "wiring" can be changed into the term such as "signal line" or "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not.

Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a microelectromechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, estimation of the effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the field-effect mobility, a current value per channel width, and the like of a transistor are obtained by calculation, a surrounded channel width may be used for the calculation. In that case, a value different from the one obtained by calculation using an effective channel width is obtained in some cases.

<<High-Level Potential and Low-Level Potential>>

In this specification, when there is a description saying that a high-level potential is applied to a wiring, the high-level potential sometimes means at least one of the following potentials: a potential high enough to turn on an n-channel transistor with a gate connected to the wiring; and a potential high enough to turn off a p-channel transistor with a gate connected to the wiring. Thus, when high-level potentials are applied to different two or more wirings, the high-level potentials applied to the wirings may be at different levels.

In this specification, when there is a description saying that a low-level potential is applied to a wiring, the low-level potential sometimes means at least one of the following potentials: a potential low enough to turn off an n-channel transistor with a gate connected to the wiring; and a potential low enough to turn on a p-channel transistor with a gate connected to the wiring. Thus, when low-level potentials are applied to different two or more wirings, the low-level potentials applied to the wirings may be at different levels.

<<Connection>>

In this specification and the like, when it is described that X and Y are connected, the case where X and Y are electrically connected, the case where X and Y are functionally connected, and the case where X and Y are directly connected are included therein. Accordingly, without being limited to a predetermined connection relation, for example, a connection relation other than that shown in a drawing or text is possible.

Here, X, Y, and the like each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

EXPLANATION OF REFERENCE

DA,DB0: analog voltage signal; DA,DB1: analog voltage signal; DA,DB2: analog voltage signal; DA,DB3: analog voltage signal; DA,DB4: analog voltage signal; DA,DB5: analog voltage signal; DA,DB6: analog voltage signal; DA,DB7: analog voltage signal; CLOCK: clock signal; CLOCKB: clock signal; CMCLK: clock signal; STBY: standby signal; CMSTBY: standby signal; CMSET: set signal; GL_1: scan line; GL_2: scan line; GL_m: scan line; GL_X: scan line; DL_1: data line; DL_2: data line; DL_n: data line; DL_Y: data line; VL_a: potential supply line; VL_b: potential supply line; VDDL: wiring; GNDL: wiring; VRL: wiring; VRL1: wiring; VRL2: wiring; VRL3: wiring; VRL[1]: wiring; VRL[i]: wiring; VRL[k]: wiring; VRLa: wiring; VRLa1: wiring; VRLa2: wiring; VRLb: wiring; VRLb1: wiring; VRLb2: wiring; VBL: wiring; L0: wiring; L1: wiring; L2: wiring; L3: wiring; L4: wiring; L5: wiring; L6: wiring; L[1]: wiring; L[i1]: wiring; L[k]: wiring; L[k+1]: wiring; L[i2]: wiring; L[2k]: wiring; STBYL: wiring; STBYL-B: wiring; BGLS1: wiring; BGLS2: wiring; RT1: transistor; RT2: transistor; RT3: transistor; RT[1]: transistor; RT[i]: transistor; RT[k]: transistor; ST11: transistor; ST12: transistor; ST1[1]: transistor; ST1[i]: transistor; ST1[k]: transistor; ST21: transistor; ST22: transistor; ST2[1]: transistor; ST2[i]: transistor; ST2[k]: transistor; ST31: transistor; ST32: transistor; ST3[1]: transistor; ST3[i]: transistor; ST3[k]: transistor; STB1[1]: transistor; STB1[i]: transistor; STB1[k]: transistor; STB3[1]: transistor; STB3[i]: transistor; STB3[k]: transistor; Tr[1,1]: transistor; Tr[2,1]: transistor; Tr[3,1]: transistor; Tr[4,1]: transistor; Tr[1,2]: transistor; Tr[2,3]: transistor; Tr[3,3]: transistor; Tr[4,3]: transistor; Tr[1,4]: transistor; Tr[2,4]: transistor; Tr[3,4]: transistor; Tr[4,4]: transistor; Tr[6,6]: transistor; Tr[2k,2k]: transistor; N1: node; N2: node; N3: node; N4: node; LA1: wiring; LA2: wiring; IN: input terminal; OUT: output terminal; AT1: transistor; AT2: transistor; AT3: transistor; AT4: transistor; AT5: transistor; AT6: transistor; AT7: transistor; AT8: transistor; AT9: transistor; AT10: transistor; AT11: transistor; AT12: transistor; AT13: transistor; AT14: transistor; AT15: transistor; AT16: transistor; AT17: transistor; AT18: transistor; AT19: transistor; AT20: transistor; AST1: transistor; AST2: transistor; S1: metal oxide; S2: metal oxide; S3: metal oxide; I1: insulator; I2: insulator; CLx: wiring; CLy: wiring; 100: source driver circuit; 110: LVDS receiver; 120: serial-parallel converter circuit; 130: shift register circuit; 140: latch circuit; 150: level shifter circuit; 160: pass transistor logic circuit; 170: resistor string circuit; 180: external correction circuit; 190: BGR circuit; 200: bias generator; 200A: bias generator; 200A1: bias generator; 200A2: bias generator; 200A3: bias generator; 200B: bias generator; 200B1: bias generator; 200B2: bias generator; 200B3: bias generator; 200B4: bias generator; 200B5: bias generator; 201: circuit; 202: circuit; 203: circuit; 204: circuit; 205: circuit; 300: buffer amplifier; 1200a: transistor; 1200b: transistor; 1200c: transistor; 1205: conductor; 1205a: conductor; 1205b: conductor; 1214: insulator; 1216: insulator; 1220: insulator; 1222: insulator; 1224: insulator; 1230: metal oxide; 1230a: metal oxide; 1230b: metal oxide; 1230c: metal oxide; 1240a: conductor; 1240b: conductor; 1241a: conductor; 1241b: conductor; 1245a: region; 1245b: region; 1250: insulator; 1260: conductor; 1260a: conductor; 1260b: conductor; 1270: insulator; 1280: insulator; 1400: transistor; 1401: insulator; 1402: insulator; 1403: insulator; 1404: insulator; 1406: insulator; 1407: insulator; 1408: insulator; 1409: insulator; 1412: conductor; 1414: conductor; 1430: metal oxide; 1431: metal oxide; 1432: metal oxide; 1433: metal oxide; 1450: substrate; 1451: low-resistance region; 1452: low-resistance region; 1461a: region; 1461b: region; 1461c: region; 1461d: region; 1461e: region; 1600: transistor; 1601: insulator; 1602: semiconductor; 1603: conductor; 1604: conductor; 1605: insulator; 1606: insulator; 1607: insulator; 1608: conductor; 1609: conductor; 3301: pixel circuit; 3302: pixel portion; 3304: driver circuit portion; 3304a: gate driver circuit; 3304b: source driver circuit; 3306: protection circuit; 3307: terminal portion; 3352: transistor; 3354: transistor; 3362: capacitor; 3372: light-emitting element; 3411: wiring; 3412: wiring; 3413: wiring; 3414: wiring; 3415: wiring; 3416: wiring; 3417: wiring; 3421: wiring; 3422: wiring; 3431: transistor; 3432: transistor; 3433: transistor; 3434: transistor; 3435: transistor; 3436: transistor; 3437: transistor; 3440: capacitor; 3441: capacitor; 3442: capacitor; 3450: light-emitting element; 3461: wiring; 3462: wiring; 3463: wiring; 3471: wiring; 3472: wiring; 3473: wiring; 3481: transistor; 3482: transistor; 3483: transistor; 3484: transistor; 3485: transistor; 3486: transistor; 3491: transistor; 3492: transistor; 3511:

wiring; 3512: wiring; 3513: wiring; 3521: wiring; 3522: wiring; 3600: liquid crystal display device; 3610: pixel portion; 3611: pixel; 3620: scan line driver circuit; 3621: scan line; 3622: capacitor wiring; 3630: signal line driver circuit; 3631: signal line; 3641: transistor; 3642: capacitor; 3643: liquid crystal element; 3711: display portion; 3712: source driver; 3712A: gate driver; 3712B: gate driver; 3713: substrate; 3714: source driver IC; 3715: FPC; 3716: external circuit board; 3800: display device; 3811: display portion; 3812: pixel; 3813: scan line driver circuit; 3814: touch sensor; 3816: host; 3820_1: IC; 38202: IC; 3820_m: IC; 3821_1: circuit; 38212: circuit; 3821_m: circuit; 3822_1: signal line driver circuit; 3822_2: signal line driver circuit; 3822_m: signal line driver circuit; 3824: touch sensor detection circuit; 3823: touch sensor driver circuit; 3825_1: image processing circuit; 3825_2: image processing circuit; 3825_m: image processing circuit; 3826_1: RAM; 3826_2: RAM; 3826_m: RAM; 3827: CPU; 3828: timing controller; 3829: capacitor; 4000: display module; 4001: upper cover; 4002: lower cover; 4003: FPC; 4004: touch panel; 4005: FPC; 4006: display panel; 4009: frame; 4010: printed board; 4011: battery; 5001: housing; 5002: display portion; 5003: stand; 5004: remote controller; 5201: housing; 5202: housing; 5203: display portion; 5204: display portion; 5205: microphone; 5206: speaker; 5207: operation key; 5208: stylus; 5401: housing; 5402: display portion; 5403: keyboard; 5404: pointing device; 5501: housing; 5502: display portion; 5503: microphone; 5504: speaker; 5505: operation button; 5601: first housing; 5602: second housing; 5603: first display portion; 5604: second display portion; 5605: joint; 5606: operation key; 5701: car body; 5702: wheel; 5703: dashboard; 5704: light; 5801: first housing; 5802: second housing; 5803: display portion; 5804: operation key; 5805: lens; 5806: joint; 5901: housing; 5902: display portion; 5903: operation button; 5904: operator; 5905: band; 6000: housing; 6001: display portion; 6003: speaker.

This application is based on Japanese Patent Application serial no. 2015-247133 filed with Japan Patent Office on Dec. 18, 2015, the entire contents of which are hereby incorporated by reference.

The invention claimed is:

1. A semiconductor device comprising:
a first circuit comprising a first transistor;
a second circuit comprising a second transistor and a third transistor;
a third circuit comprising a fourth transistor;
a fourth circuit comprising a fifth transistor; and
a fifth circuit comprising a sixth transistor,
wherein one of a source and a drain of the first transistor is electrically connected to a gate of the third transistor and one of a source and a drain of the fourth transistor,
wherein the one of the source and the drain of the first transistor is directly connected to a gate of the first transistor,
wherein one of a source and a drain of the second transistor is electrically connected to one of a source and a drain of the third transistor,
wherein a gate of the second transistor is electrically connected to a first output terminal,
wherein the gate of the second transistor is directly connected to one of a source and a drain of the fifth transistor,
wherein a gate of the fourth transistor is electrically connected to a gate of the sixth transistor,
wherein one of a source and a drain of the sixth transistor is electrically connected to a second output terminal,
wherein the second transistor is a p-channel transistor, and
wherein the third transistor is an n-channel transistor.

2. The semiconductor device according to claim 1, wherein the other of the source and the drain of each of the first transistor, the third transistor, the fourth transistor, and the sixth transistor is electrically connected to a wiring for supplying a low-level potential.

3. The semiconductor device according to claim 1, wherein the other of the source and the drain of the second transistor and the other of the source and the drain of the fifth transistor are electrically connected to a wiring for supplying a high-level potential.

4. The semiconductor device according to claim 1,
wherein the gate of the fourth transistor and the gate of the sixth transistor are electrically connected to a wiring for supplying a standby signal, and
wherein a gate of the fifth transistor is electrically connected to a wiring for supplying for an inversion signal of the standby signal.

5. The semiconductor device according to claim 1, wherein each of a channel formation region of the first transistor, the third transistor, the fourth transistor, and the sixth transistor comprises an oxide semiconductor.

6. The semiconductor device according to claim 1, wherein each of the fourth transistor and the sixth transistor comprises a back gate.

7. A semiconductor device comprising:
a first circuit comprising a first transistor;
a second circuit comprising a second transistor and a third transistor;
a third circuit comprising a fourth transistor;
a fourth circuit comprising a fifth transistor;
and a fifth circuit comprising a sixth transistor,
wherein one of a source and a drain of the first transistor is electrically connected to a gate of the third transistor and one of a source and a drain of the fourth transistor,
wherein the one of the source and the drain of the first transistor is directly connected to a gate of the first transistor,
wherein one of a source and a drain of the second transistor is electrically connected to one of a source and a drain of the third transistor,
wherein a gate of the second transistor is electrically connected to a first output terminal, wherein the gate of the second transistor is directly connected to one of a source and a drain of the fifth transistor,
wherein a gate of the fourth transistor is electrically connected to a gate of the sixth transistor,
wherein one of a source and a drain of the sixth transistor is electrically connected to a second output terminal,
wherein when the semiconductor device is in a driving state, the second circuit is configured to output a first bias voltage from the first output terminal and a second bias voltage from the second output terminal, and
wherein when the semiconductor device is in a standby state, the third circuit is configured to apply a first low-level potential to the first circuit and the second circuit, the fourth circuit is configured to output a high-level potential to the first output terminal, and the fifth circuit is configured to output a second low-level potential to the second output terminal.

8. The semiconductor device according to claim 7,
wherein the second transistor is a p-channel transistor, and
wherein the third transistor is an n-channel transistor.

9. The semiconductor device according to claim 7, wherein the other of the source and the drain of each of the first transistor, the third transistor, the fourth transistor, and the sixth transistor is electrically connected to a wiring for supplying a low-level potential.

10. The semiconductor device according to claim 7, wherein the other of the source and the drain of the second transistor and the other of the source and the drain of the fifth transistor are electrically connected to a wiring for supplying a high-level potential.

11. The semiconductor device according to claim 7,
wherein the gate of the fourth transistor and the gate of the sixth transistor are electrically connected to a wiring for supplying a standby signal, and
wherein a gate of the fifth transistor is electrically connected to a wiring for supplying for an inversion signal of the standby signal.

12. The semiconductor device according to claim 7, wherein each of a channel formation region of the first transistor, the third transistor, the fourth transistor, and the sixth transistor comprises an oxide semiconductor.

13. The semiconductor device according to claim 7, wherein each of the fourth transistor and the sixth transistor comprises a back gate.

\* \* \* \* \*